US012813075B2

(12) United States Patent
Kobayashi et al.

(10) Patent No.: US 12,813,075 B2
(45) Date of Patent: Nov. 24, 2026

(54) SEMICONDUCTOR DEVICE INCLUDING DISPLAY PORTION INCLUDING TRANSISTORS AND CAPACITORS IN SUBPIXEL

(71) Applicant: SEMICONDUCTOR ENERGY LABORATORY CO., LTD., Atsugi (JP)

(72) Inventors: Hidetomo Kobayashi, Isehara (JP); Yuki Okamoto, Ebina (JP); Toshihiko Saito, Atsugi (JP); Tatsuya Onuki, Atsugi (JP); Hidekazu Miyairi, Hadano (JP); Ryo Tagashira, Isehara (JP); Kazuko Yamawaki, Atsugi (JP); Masami Endo, Isehara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 355 days.

(21) Appl. No.: 18/574,564

(22) PCT Filed: Jul. 8, 2022

(86) PCT No.: PCT/IB2022/056313
§ 371 (c)(1),
(2) Date: Dec. 27, 2023

(87) PCT Pub. No.: WO2023/002291
PCT Pub. Date: Jan. 26, 2023

(65) Prior Publication Data

US 2025/0133906 A1 Apr. 24, 2025

(30) Foreign Application Priority Data

Jul. 20, 2021 (JP) ................................ 2021-119967
Nov. 30, 2021 (JP) ................................ 2021-193967
Apr. 26, 2022 (JP) ................................ 2022-072400

(51) Int. Cl.
*H10K 59/121* (2023.01)
*G09F 9/30* (2006.01)
(Continued)

(52) U.S. Cl.
CPC ....... *H10K 59/1216* (2023.02); *G09G 3/3233* (2013.01); *H10K 59/1213* (2023.02);
(Continued)

(58) Field of Classification Search
CPC ...... H05B 45/30; H05B 45/34; H05B 45/345; H05B 45/60; H05B 33/02; H05B 33/14;
(Continued)

(56) References Cited

U.S. PATENT DOCUMENTS 7,399,991 B2 7/2008 Seo et al.
7,663,149 B2 2/2010 Seo et al.
(Continued)

FOREIGN PATENT DOCUMENTS

CN 102576174 A 7/2012
JP 2002-324673 A 11/2002
(Continued)

OTHER PUBLICATIONS

International Search Report (Application No. PCT/IB2022/056313) Dated Sep. 20, 2022.
(Continued)

*Primary Examiner* — Sonya McCall-Shepard
(74) *Attorney, Agent, or Firm* — NIXON PEABODY LLP; Jeffrey L. Costellia

(57) ABSTRACT

A semiconductor device with high manufacturing yield is provided. The semiconductor device includes a plurality of subpixels. Each of the subpixels includes a first transistor, a second transistor, a first capacitor to a third capacitor, a first
(Continued)

insulating layer, and a wiring. Each of the first capacitor to the third capacitor includes a first conductive layer, a second conductive layer, and a second insulating layer sandwiched between the first conductive layer and the second conductive layer. The first insulating layer is provided over the first transistor and the second transistor. The first conductive layers of the first capacitor to the third capacitor and the wiring are each provided over the first insulating layer. In a top view, the proportion of the total area of the first conductive layers of the first capacitor to the third capacitor and the wiring to the area of the subpixel is greater than or equal to 15 percent. The area of the first conductive layer of the second capacitor and the area of the first conductive layer of the third capacitor are each greater than or equal to twice the area of the first conductive layer of the first capacitor.

9 Claims, 45 Drawing Sheets

(51) Int. Cl.

| | |
|---|---|
| ***G09F 9/33*** | (2006.01) |
| ***G09G 3/3233*** | (2016.01) |
| ***H05B 33/02*** | (2006.01) |
| ***H05B 33/14*** | (2006.01) |
| ***H10D 30/01*** | (2025.01) |
| ***H10D 30/67*** | (2025.01) |
| ***H10D 84/01*** | (2026.01) |
| ***H10D 84/03*** | (2025.01) |
| ***H10D 84/83*** | (2025.01) |
| ***H10K 50/00*** | (2023.01) |
| ***H10K 59/124*** | (2023.01) |
| ***H10K 59/131*** | (2023.01) |
| ***H10P 14/40*** | (2026.01) |
| ***H10W 20/00*** | (2026.01) |

(52) U.S. Cl.
CPC ... *H10K 59/131* (2023.02); *G09G 2300/0426* (2013.01); *G09G 2300/0465* (2013.01); *G09G 2300/0852* (2013.01); *G09G 2320/0233* (2013.01); *G09G 2320/0242* (2013.01); *G09G 2330/021* (2013.01)

(58) Field of Classification Search
CPC ........... H10K 59/1216; H10K 59/1213; H10K 59/131; H10K 50/00; H10K 59/124; G09G 3/3233; G09G 2300/0426; G09G 2300/0465; G09G 2320/0233; G09F 9/33; H10D 84/01; H10D 84/0126; H10D 30/6755; H10D 30/021; H10D 30/67; H10D 84/00; H10D 84/038; H10D 84/83; H10W 20/01
See application file for complete search history.

(56) References Cited

U.S. PATENT DOCUMENTS

| | | | | |
|---|---|---|---|---|
| 8,482,690 | B2 | 7/2013 | Arasawa et al. | |
| 9,835,900 | B2 | 12/2017 | Mochizuki et al. | |
| 9,853,068 | B2 | 12/2017 | Miyake | |
| 10,453,873 | B2 | 10/2019 | Miyake | |
| 11,664,391 | B2 | 5/2023 | Miyake | |
| 2011/0085104 | A1 | 4/2011 | Arasawa et al. | |
| 2017/0068129 | A1 | 3/2017 | Mochizuki et al. | |
| 2017/0263870 | A1* | 9/2017 | Kamatani | H10K 85/626 |
| 2018/0337288 | A1* | 11/2018 | Shin | G09G 3/3233 |
| 2022/0020328 | A1* | 1/2022 | Lim | G09G 3/3233 |
| 2023/0261010 | A1 | 8/2023 | Miyake | |

FOREIGN PATENT DOCUMENTS

| | | | |
|---|---|---|---|
| JP | 2012-252349 | A | 12/2012 |
| JP | 2015-132816 | A | 7/2015 |
| JP | 2016-042202 | A | 3/2016 |
| JP | 2017-053899 | A | 3/2017 |
| JP | 2017-142312 | A | 8/2017 |
| KR | 2012-0083341 | A | 7/2012 |
| KR | 2020-0043958 | A | 4/2020 |
| TW | 201207531 | | 2/2012 |
| WO | WO-2011/043217 | | 4/2011 |

OTHER PUBLICATIONS

Written Opinion (Application No. PCT/IB2022/056313) Dated Sep. 20, 2022.

* cited by examiner

FIG. 35A
Intermediate state
New crystalline phase
| Amorphous | Crystalline | Crystal |
|---|---|---|
| ・completely amorphous | ・CAAC<br>・nc<br>・CAC<br>excluding single crystal and polycrystal | ・single crystal<br>・polycrystal |
FIG. 35B
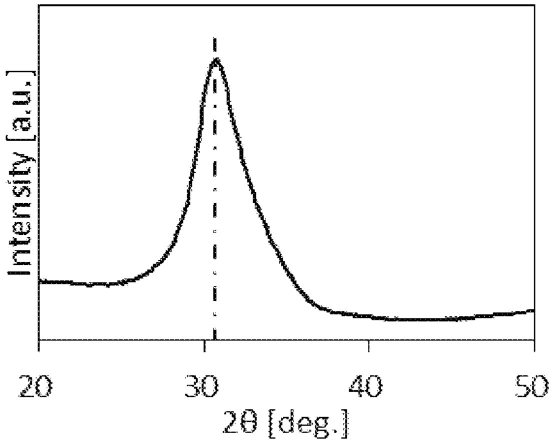
FIG. 35C
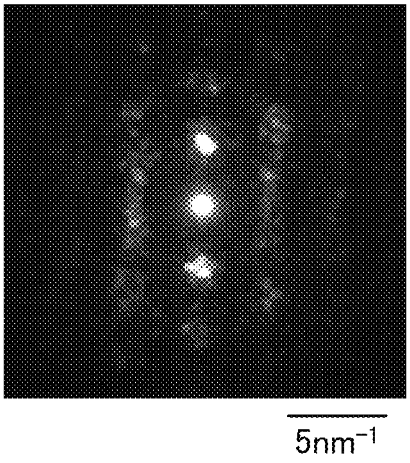

SEMICONDUCTOR DEVICE INCLUDING DISPLAY PORTION INCLUDING TRANSISTORS AND CAPACITORS IN SUBPIXEL

TECHNICAL FIELD

One embodiment of the present invention relates to a semiconductor device.

Note that one embodiment of the present invention is not limited to the above technical field. Examples of the technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display apparatus, a light-emitting apparatus, a lighting device, an electronic device, and the like themselves may be semiconductor devices and may each include a semiconductor device.

BACKGROUND ART

In recent years, display apparatuses applicable to virtual reality (VR), augmented reality (AR), substitutional reality (SR), or mixed reality (MR) have been desired.

VR, AR, SR, and MR are collectively referred to as extended reality (xR). Display apparatuses for xR have been expected to have higher resolution and higher color reproducibility so that realistic feeling and the sense of immersion can be enhanced. Examples of devices applicable to such display apparatuses include a liquid crystal display apparatus and a light-emitting apparatus including a light-emitting device such as organic EL (Electro Luminescence) element or a light-emitting diode (LED).

For example, the basic structure of an organic EL element is a structure where a layer containing a light-emitting organic compound is provided between a pair of electrodes. By voltage application to this element, light emission can be obtained from the light-emitting organic compound. A display apparatus using such an organic EL element does not need a backlight that is necessary for a liquid crystal display apparatus or the like; thus, a thin, lightweight, high-contrast, and low-power-consumption display apparatus can be achieved. Since the response speed of the organic EL element is high, a display apparatus suitable for displaying a fast-moving image can be achieved. Patent Document 1, for example, discloses an example of a display apparatus using an organic EL element.

Patent Document 2 discloses a circuit structure of a pixel circuit for controlling the emission luminance of an organic EL element, in which a threshold voltage variation between transistors is corrected in each pixel to increase the display quality of a display apparatus.

REFERENCES

Patent Documents

[Patent Document 1] Japanese Published Patent Application No. 2002-324673

[Patent Document 2] Japanese Published Patent Application No. 2015-132816

SUMMARY OF THE INVENTION

Problems to be Solved by the Invention

An object of one embodiment of the present invention is to provide a semiconductor device or display apparatus with high manufacturing yield. Another object is to provide a small semiconductor device or display apparatus. Another object of one embodiment of the present invention is to provide a semiconductor device or display apparatus with high display quality. Another object is to provide a semiconductor device or display apparatus with high color reproducibility. Another object is to provide a high-resolution semiconductor device or display apparatus. Another object is to provide a highly reliable semiconductor device or display apparatus. Another object of one embodiment of the present invention is to provide a semiconductor device or display apparatus with reduced power consumption. Another object is to provide a novel semiconductor device or display apparatus.

Note that the description of these objects does not preclude the existence of other objects. One embodiment of the present invention does not have to achieve all of these objects. Note that objects other than these can be derived from the description of the specification, the drawings, the claims, and the like.

Means for Solving the Problems

One embodiment of the present invention is a semiconductor device including a display portion. The display portion includes a plurality of subpixels. Each of the plurality of subpixels includes a first transistor, a second transistor, a first capacitor, a second capacitor, a third capacitor, a first insulating layer, and a wiring. The first transistor is electrically connected to the second transistor, the first capacitor, the second capacitor, and the third capacitor. Each of the first capacitor to the third capacitor includes a first conductive layer, a second conductive layer, and a second insulating layer sandwiched between the first conductive layer and the second conductive layer. The first insulating layer is provided over the first transistor and the second transistor. The first conductive layers of the first capacitor to the third capacitor and the wiring are each provided over the first insulating layer. In a top view, a proportion of a total area of the first conductive layers of the first capacitor to the third capacitor and the wiring to an area of the subpixel is greater than or equal to 15%. An area of the first conductive layer of the second capacitor is greater than or equal to twice an area of the first conductive layer of the first capacitor. An area of the first conductive layer of the third capacitor is greater than or equal to twice the area of the first conductive layer of the first capacitor.

The above-described semiconductor device preferably includes a substrate and a third transistor. Each of the first transistor to the third transistor is provided over the substrate. The third transistor is electrically floating. Each of the first transistor to the third transistor includes a semiconductor layer. In the top view, a proportion of a total area of the semiconductor layers of the first transistor to the third transistor to the area of the subpixel is greater than or equal to 15%.

In the above-described semiconductor device, the semiconductor layer of the third transistor preferably includes a region shared with the semiconductor layer of the first transistor.

In the above-described semiconductor device, the number of third transistors is preferably two or more.

In the above-described semiconductor device, one of a source and a drain of the first transistor is preferably electrically connected to one terminal of the first capacitor. A gate of the first transistor is preferably electrically connected to the other terminal of the first capacitor. The other of the source and the drain of the first transistor is preferably electrically connected to one of a source and a drain of the second transistor, one terminal of the second capacitor, and one terminal of the third capacitor. Agate of the second transistor is preferably electrically connected to the other terminal of the second capacitor. A back gate of the second transistor is preferably electrically connected to the other terminal of the third capacitor.

In the above-described semiconductor device, the second transistor is preferably a multi-channel transistor.

The above-described semiconductor device preferably includes a light-emitting device. One terminal of the light-emitting device is preferably electrically connected to one of a source and a drain of the first transistor.

In the above-described semiconductor device, one or more of the first transistor and the second transistor preferably include a metal oxide in the semiconductor layer(s).

In the above-described semiconductor device, the metal oxide preferably includes one or more of indium and zinc.

In the above-described semiconductor device, the second transistor preferably includes: the semiconductor device; a first conductor and a second conductor placed apart from each other over the semiconductor layer; a first insulator placed over the first conductor and the second conductor and having an opening formed between the first conductor and the second conductor; a third conductor placed in the opening of the first conductor; and a second insulator placed between the third conductor and the semiconductor layer, the first conductor, the second conductor, and the first insulator.

Effect of the Invention

With one embodiment of the present invention, a semiconductor device or display apparatus with high manufacturing yield can be provided. A small semiconductor device or display apparatus can be provided. With one embodiment of the present invention, a semiconductor device or display apparatus with high display quality can be provided. A semiconductor device or display apparatus with high color reproducibility can be provided. A high-resolution semiconductor device or display apparatus can be provided. A highly reliable semiconductor device or display apparatus can be provided. With one embodiment of the present invention, a semiconductor device or display apparatus with reduced power consumption can be provided. A novel semiconductor device or display apparatus can be provided.

Note that the description of these effects does not preclude the existence of other effects. One embodiment of the present invention does not need to have all of these effects. Note that effects other than these can be derived from the description of the specification, the drawings, the claims, and the like.

BRIEF DESCRIPTION OF THE DRAWINGS

FIG. 35A is a diagram showing classification of crystal structures. FIG. 35B is a graph showing an XRD spectrum of a CAAC-IGZO film. FIG. 35C is an image showing a nanobeam electron diffraction pattern of a CAAC-IGZO film.

MODE FOR CARRYING OUT THE INVENTION

Figure 1A:
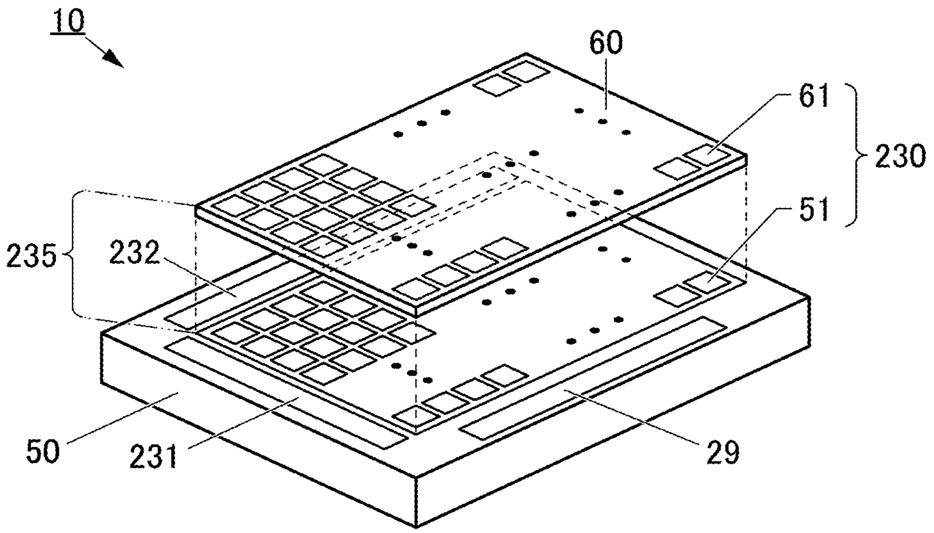
FIG. 1A and FIG. 1B are perspective views of a display apparatus.

Embodiments are described below with reference to the drawings. Note that the embodiments can be implemented in many different modes, and it is readily understood by those skilled in the art that modes and details thereof can be changed in various ways without departing from the spirit and scope thereof. Thus, the present invention should not be interpreted as being limited to the following description of the embodiments.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, e.g., a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, or a load) can be connected between X and Y.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit; or the like) can be connected between X and Y. For instance, even if another circuit is interposed between X and Y, X and Y are regarded as being functionally connected when a signal output from X is transmitted to Y.

Note that an explicit description that X and Y are electrically connected includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: the wiring and the electrode. Thus, electrical connection in this specification and the like includes, in its category, such a case where one conductive film has functions of a plurality of components.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; conversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like.

In this specification and the like, a transistor includes three terminals called a gate, a source, and a drain. The gate is a control terminal for controlling the amount of current flowing between the source and the drain. Two terminals functioning as the source and the drain are input/output terminals of the transistor. One of the two input/output terminals serves as the source and the other serves as the drain depending on the conductivity type (n-channel type or p-channel type) of the transistor and the levels of potentials supplied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relationship of a transistor. Depending on the transistor structure, the transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a "node" can be referred to as a terminal, a wiring, an electrode, a conductive layer, a conductor, an impurity region, or the like depending on the circuit structure, the device structure, or the like, for example. Furthermore, a "terminal", a "wiring", or the like can be referred to as a "node", for example.

Ordinal numbers such as "first", "second", and "third" in this specification and the like are used to avoid confusion among components. Thus, the ordinal numbers do not limit the number of components. In addition, the ordinal numbers do not limit the order of components. For example, a "first" component in one embodiment in this specification and the like can be referred to as a "second" component in other embodiments, the scope of claims, or the like. Furthermore, for example, a "first" component in one embodiment in this specification and the like can be omitted in other embodiments, the scope of claims, or the like.

In this specification and the like, terms for describing arrangement, such as "over", "under", "above", and "below" are sometimes used for convenience to describe the positional relationship between components with reference to drawings. The positional relationship between components is changed as appropriate in accordance with a direction in which each component is described. Thus, the terms are not limited to the terms described in the specification and the like and can be replaced with another term as appropriate depending on the situation. For example, the expression "an insulator positioned over (on) a top surface of a conductor" can be replaced with the expression "an insulator positioned under (on) a bottom surface of a conductor" when the direction of a drawing illustrating these components is rotated by 180°.

The term "over" or "under" does not necessarily mean that a component is placed directly over or directly under and directly in contact with another component. For example, the expression "electrode B over insulating layer A" does not necessarily mean that the electrode B is formed over and in direct contact with the insulating layer A, and does not exclude the case where another component is provided between the insulating layer A and the electrode B.

The term "overlap", for example, in this specification and the like does not limit a state such as the stacking order of components. For example, the expression "electrode B overlapping with insulating layer A" does not necessarily mean the state where the electrode B is formed over the insulating layer A, and does not exclude the state where the electrode B is formed under the insulating layer A and the state where the electrode B is formed on the right side (or the left side) of the insulating layer A.

Each of the terms "adjacent" and "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. Also, for example, the term "insulating film" can be changed into the term "insulating layer" in some cases. Alternatively, the term can be changed into another term that does not include "film", "layer", or the like depending on the case or the situation. For example, the term "conductive layer" or "conductive film" can be changed into the term "conductor" in some cases. The term "conductor" can be changed into the term "conductive layer" or "conductive film" in some cases. Furthermore, for example, the term "insulating layer" or "insulating film" can be changed into the term "insulator" in some cases. Also, the term "insulator" can be changed into the term "insulating layer" or "insulating film" in some cases.

In this specification and the like, the term such as "electrode", "wiring", or "terminal" does not limit the function of a component. For example, an "electrode" is used as part of a wiring in some cases, and vice versa. Furthermore, the term "electrode" or "wiring" also includes the case where a plurality of "electrodes" or "wirings" are formed in an integrated manner. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", in some cases.

In this specification and the like, the terms such as "wiring", "signal line", and "power supply line" can be interchanged with each other depending on the case or situation. For example, the term "wiring" can be changed into the term "signal line" in some cases. For another example, the term "wiring" can be changed into the term "power supply line" or the like in some cases. Conversely, the term "signal line", "power supply line", or the like can be changed into the term "wiring" in some cases. Furthermore, the term "power supply line" or the like can be changed into the term "signal line" or the like in some cases. Conversely, the term "signal line" or the like can be changed into the term "power supply line" or the like in some cases. Moreover, the term "potential" that is applied to a wiring can be changed into the term "signal" or the like depending on the case or situation in some cases. Conversely, the term "signal" or the like can be changed into the term "potential" in some cases.

In this specification and the like, a "switch" includes a plurality of terminals and has a function of switching (selecting) electrical continuity/discontinuity between the terminals. For example, in the case where a switch includes two terminals and electrical continuity is established between the two terminals, the switch is in a "conduction state" or an "on state". In the case where electrical continuity is not established between the two terminals, the switch is in a "non-conduction state" or an "off state". Note that switching to one of a conduction state and a non-conduction state or maintaining one of a conduction state and a non-conduction state is sometimes referred to as "controlling a conduction state".

That is, a switch has a function of controlling whether to make a current flow therethrough or not. Alternatively, a switch has a function of selecting and changing a current path. For example, an electrical switch or a mechanical switch can be used. That is, a switch can be any element capable of controlling a current, and is not limited to a particular element.

Examples of a switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a "conduction state" or "on state" of the transistor refers to a state where a source electrode and a drain electrode of the transistor can be regarded as being electrically short-circuited. Furthermore, a "non-conduction state" or "off state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch using a MEMS (micro electro mechanical systems) technology. Such a switch includes an electrode that can be moved mechanically, and selects a conduction or non-conduction with the movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 850 and less than or equal to 950 is also included. Furthermore, "approximately perpendicular" or "substantially perpendicular" indicates a state where two straight lines are placed at an angle greater than or equal to 60° and less than or equal to 120°.

Note that in this specification and the like, the terms "identical", "the same", "equal", "uniform", and the like (including synonyms thereof) used in describing calculation values and measurement values contain an error of ±20% unless otherwise specified.

Embodiments described in this specification are described with reference to the drawings. Note that the embodiments can be implemented in many different modes, and it is readily understood by those skilled in the art that modes and details thereof can be changed in various ways without departing from the spirit and scope thereof. Thus, the present invention should not be interpreted as being limited to the description of the embodiments. Note that in the structures of the invention in the embodiments, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases. Moreover, some components are omitted in a perspective view, a top view (also referred to as a plan view), and the like for easy understanding of the drawings in some cases.

In the drawings and the like in this specification, the size, the layer thickness, or the region is exaggerated for clarity in some cases. Therefore, embodiments of the present invention are not limited to the size, aspect ratio, and the like shown in the drawings. Note that the drawings schematically illustrate ideal examples, and embodiments of the present invention are not limited to shapes, values, and the like illustrated in the drawings. For example, variation in signal, voltage, or current due to noise or variation in signal, voltage, or current due to difference in timing can be included.

In the drawings and the like in this specification, arrows indicating the X direction, the Y direction, and the Z direction are illustrated in some cases. In this specification and the like, the "X direction" is a direction along the X-axis, and the forward direction and the reverse direction are not distinguished in some cases, unless otherwise specified. The same applies to the "Y direction" and the "Z direction". The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases.

In this specification and the like, when a plurality of components are denoted by the same reference numerals, and in particular need to be distinguished from each other, an identification sign such as "A", "b", "_1", "[n]", or "[m, n]" is sometimes added to the reference numerals, in some cases.

Embodiment 1

A semiconductor device of one embodiment of the present invention will be described. The semiconductor device of one embodiment of the present invention can be favorably used in a pixel of a display apparatus, for example.

The semiconductor device of one embodiment of the present invention includes a display portion. The display portion includes a plurality of subpixels. Each of the plurality of subpixels includes a first transistor, a second transistor, a first capacitor, a second capacitor, a third capacitor, a first insulating layer, and a wiring. The first transistor is electrically connected to the second transistor, the first capacitor, the second capacitor, and the third capacitor.

Each of the first capacitor to the third capacitor includes a first conductive layer functioning as a lower electrode, a second conductive layer functioning as an upper electrode, and a second insulating layer sandwiched between the first conductive layer and the second conductive layer. The first insulating layer is provided over the first transistor and the second transistor. The first conductive layers of the first capacitor to the third capacitor and the wiring are each provided over the first insulating layer.

In a top view, the proportion of the total area of the first conductive layers of the first capacitor to the third capacitor and the wiring to the area of the subpixel is preferably greater than or equal to 15%. The area of the first conductive layer of the second capacitor is preferably greater than or equal to twice the area of the first conductive layer of the first capacitor. The area of the first conductive layer of the third capacitor is preferably greater than or equal to twice the area of the first conductive layer of the first capacitor.

The area of the first capacitor to the third capacitor included in the semiconductor device of one embodiment of the present invention is preferably large. A display apparatus including the semiconductor device can have small size and achieve high color reproducibility, for example. When the area of the first capacitor to the third capacitor is large, the proportion of the area of resist masks is high in a manufacturing process, whereby generation of foreign matter due to the resist masks can be inhibited. Accordingly, defective patterns can be reduced and the manufacturing yield of the semiconductor device can be increased. Furthermore, provision of a dummy transistor can similarly inhibit generation of foreign matter in a transistor manufacturing process, which can increase the manufacturing yield.

Structure Example 1

A perspective view of a display apparatus including the semiconductor device of one embodiment of the present invention is illustrated in FIG. 1A. A display apparatus 10 illustrated in FIG. 1A includes a display region 235, a first driver circuit portion 231, and a second driver circuit portion 232.

The display region 235 includes a plurality of pixels 230 arranged in a matrix. Each of the plurality of pixels 230 includes a light-emitting device. As the light-emitting device, an OLED (Organic Light Emitting Diode) or a QLED (Quantum-dot Light Emitting Diode) is preferably used, for example. Examples of a light-emitting substance contained in the light-emitting device include a substance that emits fluorescent light (a fluorescent material), a substance that emits phosphorescent light (a phosphorescent material), an inorganic compound (a quantum dot material or the like), and a substance that exhibits thermally activated delayed fluorescence (a thermally activated delayed fluorescent (TADF) material). In addition, an LED (Light Emitting Diode) can also be used as the light-emitting device, for example.

The first driver circuit portion 231 functions as, for example, a scan line driver circuit. The second driver circuit portion 232 functions as, for example, a signal line driver circuit. Another circuit may be provided in a position that faces the first driver circuit portion 231 with the display region 235 positioned therebetween. Another circuit may be provided in a position that faces the second driver circuit portion 232 with the display region 235 positioned therebetween. Note that the first driver circuit portion 231 and the second driver circuit portion 232 are collectively referred to as a "peripheral driver circuit" in some cases.

Any of various circuits such as a shift register, a level shifter, an inverter, a latch, an analog switch, and a logic circuit can be used as the peripheral driver circuit. In the peripheral driver circuit, transistors and capacitors can be used. The transistors and the capacitors included in the peripheral driver circuit and the transistors and capacitors included in the pixels 230 can be formed in the same steps.

The display apparatus 10 may include an input/output terminal portion 29. Electric power and signals necessary to operate the display apparatus 10 can be supplied through the input/output terminal portion 29 to the display apparatus 10.

The display apparatus 10 can have a stacked-layer structure of a layer 50 and a layer 60 over the layer 50. The layer 50 includes a plurality of pixel circuits 51 arranged in a matrix, the first driver circuit portion 231, the second driver circuit portion 232, and the input/output terminal portion 29. The layer 60 includes a plurality of light-emitting devices 61 arranged in a matrix. One pixel circuit 51 and one light-emitting device 61 are electrically connected to each other and can function as one pixel 230. Full-color display can be achieved when the plurality of pixels 230 exhibiting different colors collectively function as one pixel. In this case, each of the pixels 230 functions as a subpixel.

Figure 1B:
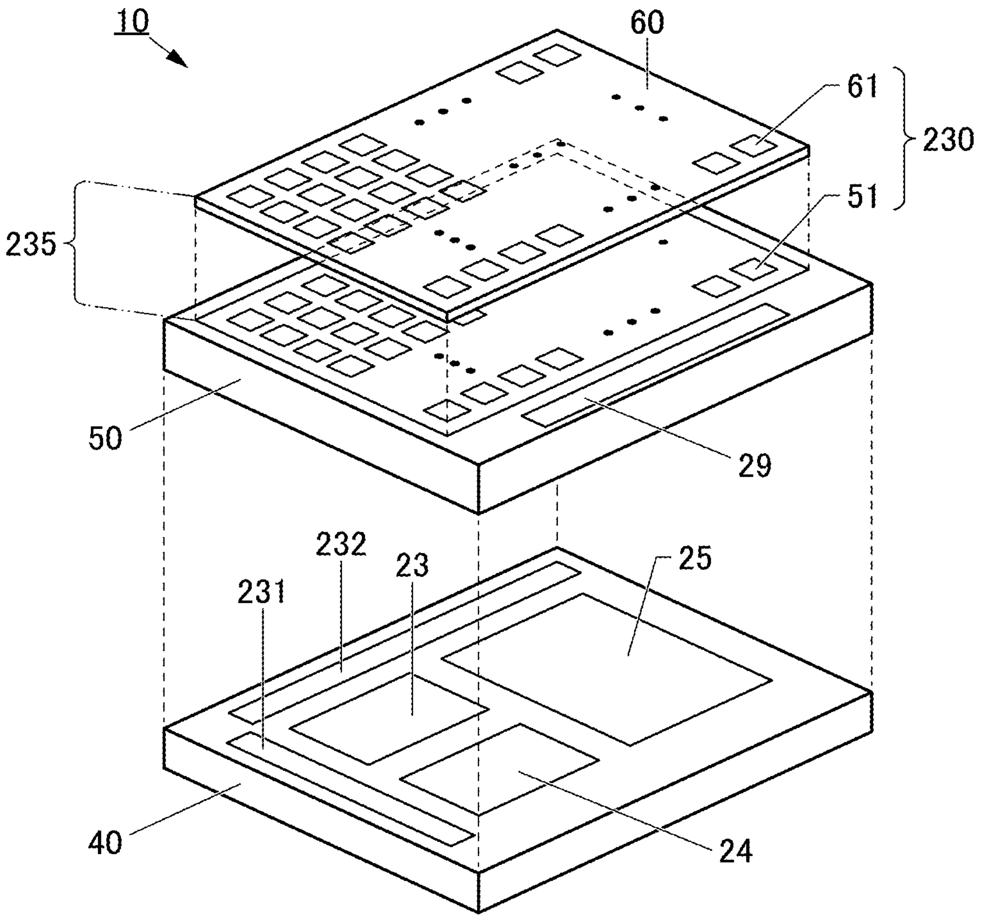

As illustrated in FIG. 1B, the display apparatus 10 may have a stacked-layer structure of a layer 40, the layer 50 over the layer 40, and the layer 60 over the layer 50. FIG. 1B illustrates a structure in which the plurality of pixel circuits 51 arranged in a matrix are provided in the layer 50, and the first driver circuit portion 231 and the second driver circuit portion 232 are provided in the layer 40. Providing the first driver circuit portion 231 and the second driver circuit portion 232 in the layer different from the layer where the pixel circuits 51 are provided can reduce the width of the bezel around the display region 235, which can increase the area occupied by the display region 235.

By increasing the area occupied by the display region 235, the definition of the display region 235 can be increased. Under a fixed definition of the display region 235, the area occupied by one pixel can be increased. Thus, the emission luminance of the display region 235 can be increased. In addition, the proportion of the area occupied by a light-emitting region to the area occupied by one pixel (also referred to as an "aperture ratio") can be increased. For example, the pixel aperture ratio can be greater than or equal to 40% and less than 100%, preferably greater than or equal to 50% and less than or equal to 95%, further preferably greater than or equal to 60% and less than or equal to 95%. By increasing the area occupied by one pixel, the density of current supplied to the light-emitting device 61 can be reduced. Thus, the load on the light-emitting device 61 is reduced, whereby the reliability of the light-emitting device 61 can be increased and the reliability of the display apparatus 10 can be increased.

Stacking the display region 235 and the peripheral driver circuit can shorten a wiring electrically connecting them. Thus, the wiring resistance and the parasitic capacitance can be lowered, and the operation speed of the display apparatus 10 can be increased. Furthermore, power consumption of the display apparatus 10 is reduced.

The layer 40 may include one or more of a CPU 23 (Central Processing Unit), a GPU 24 (Graphics Processing Unit), and a memory circuit portion 25, in addition to the peripheral driver circuit. In this embodiment and the like, the peripheral driver circuit, the CPU 23, the GPU 24, and the memory circuit portion 25 are collectively referred to as a "functional circuit" in some cases.

For example, the CPU 23 has a function of controlling the operations of the GPU 24 and the circuits provided in the layer 40 in accordance with a program stored in the memory circuit portion 25. The GPU 24 has a function of performing arithmetic processing for producing image data. Furthermore, the GPU 24 can perform a large number of matrix operations (product-sum operations) in parallel and thus can perform arithmetic processing using a neural network at high speed, for example. The GPU 24 has a function of correcting image data using correction data stored in the memory circuit portion 25, for example. The GPU 24 has a function of generating image data in which brightness, hue, contrast, and/or the like are/is corrected, for example.

Upconversion or downconversion of image data may be performed using the GPU 24. A super-definition circuit may be provided in the layer 40. The super-definition circuit has a function of determining a potential of any pixel included in the display region 235 by product-sum operation of weights and potentials of pixels in the periphery of the pixel. The super-definition circuit has a function of upconverting image data with a definition lower than that of the display region 235. The super-definition circuit has a function of downconverting image data with a definition higher than that of the display region 235.

Providing the super-definition circuit can reduce the load on the GPU 24. For example, the GPU 24 performs processing up to 2K definition (or 4K definition) and the super-definition circuit performs upconversion to 4K definition (or 8K definition), whereby the load on the GPU 24 can be reduced. Downconversion may be performed in a similar manner.

Note that the functional circuit included in the layer 40 does not necessarily include all of these components, and may include another component. For example, a potential generation circuit that generates a plurality of different potentials, and/or a power management circuit that controls supply and stop of electric power for each circuit included in the display apparatus 10 on a per-circuit basis may be provided.

The supply and stop of electrical power may be performed per circuit included in the CPU 23. For example, power consumption can be reduced by stopping supply of electric power to a circuit which has been determined to be not used for a while among the circuits included in the CPU 23 and restarting the supply of electric power to the circuit as needed. Data necessary for restarting supply of electric power may be stored in a memory circuit in the CPU 23, the memory circuit portion 25, or the like before the circuit is stopped. By storing data necessary for recovery of the circuit, high-speed recovery of the circuit stopped can be performed. Note that supply of a clock signal may be stopped to stop the circuit operation.

As the functional circuit, a DSP circuit, a sensor circuit, a communication circuit, an FPGA (Field Programmable Gate Array), and/or the like may be included.

Figure 2:
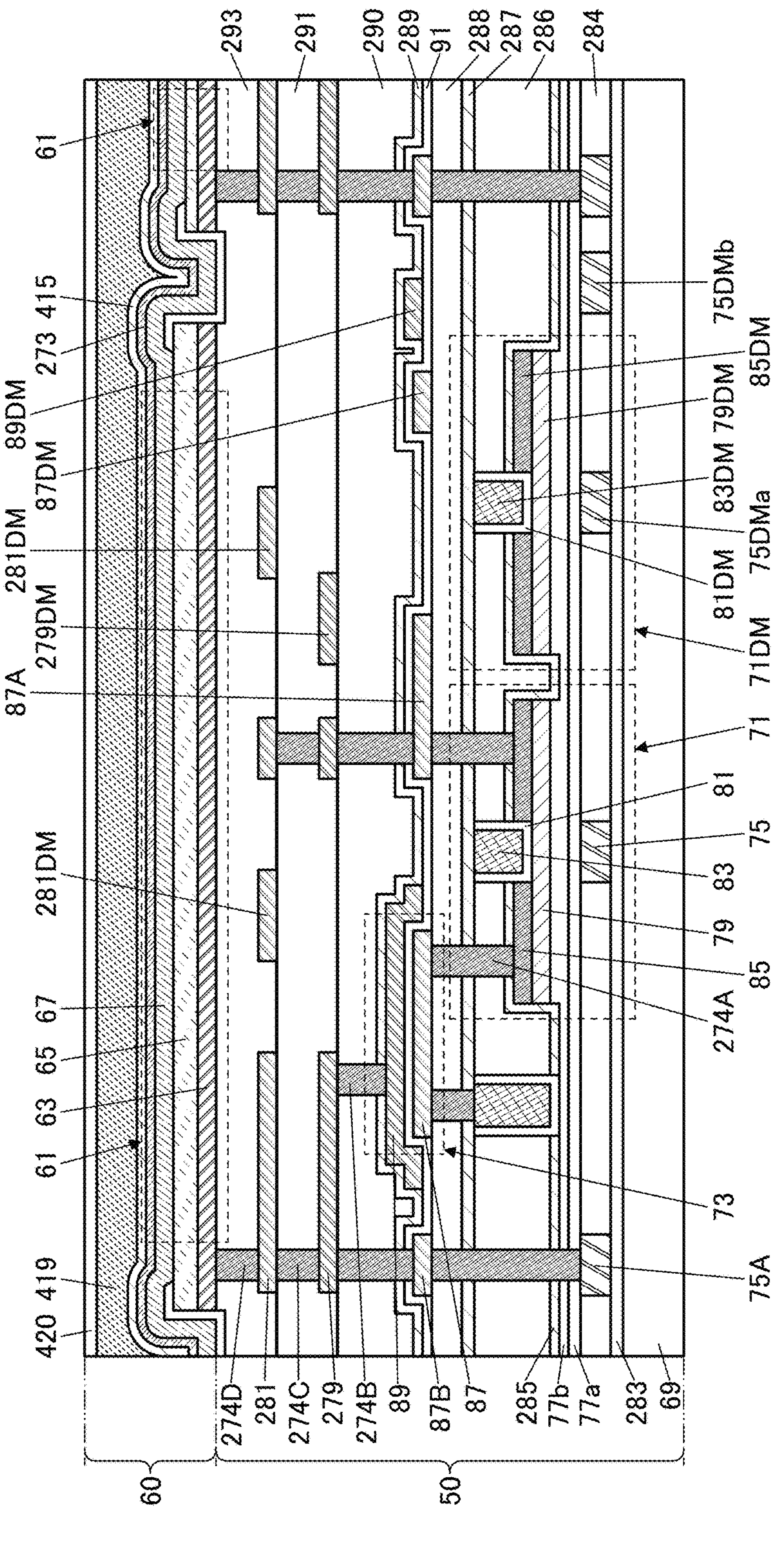
FIG. 2 is a cross-sectional view illustrating a structure example of the display apparatus.

FIG. 2 illustrates a cross-sectional structure example of the display apparatus 10. FIG. 2 illustrates part of the pixel 230. The display apparatus 10 includes the layer 50 including a substrate 69, a transistor 71, and a capacitor 73 and the layer 60 including the light-emitting device 61. Furthermore, the layer 50 includes a plurality of wirings.

The transistor 71 is provided over the substrate 69. An insulating layer 288 is provided over the transistor 71. The capacitor 73 is provided over the insulating layer 288. As illustrated in FIG. 2, the capacitor 73 preferably includes a region overlapping with the transistor 71. When the capacitor 73 includes a region overlapping with the transistor 71, the area of the pixel 230 can be reduced and a high-resolution display apparatus can be provided. An insulating layer 290 is provided over the capacitor 73. The light-emitting device 61 is provided over the insulating layer 290. The light-emitting device 61 preferably includes a region overlapping with the transistor 71 and a region overlapping with the capacitor 73. When the light-emitting device 61 includes a region overlapping with the transistor 71 and the capacitor 73, the aperture ratio can be increased. Note that an insulating layer 291 and an insulating layer 293 may be further provided between the insulating layer 290 and the light-emitting device 61.

As the substrate 69, an insulating substrate or a semiconductor substrate can be used.

An insulating layer 283 is provided over the substrate 69. The insulating layer 283 functions as a barrier layer that prevents diffusion of impurities such as water or hydrogen from the substrate 69 into the transistor 71. For example, one or more of an aluminum oxide film, a hafnium oxide film, and a silicon nitride film can be used for the insulating layer 283.

The transistor 71 is provided over the insulating layer 283. The transistor 71 includes a conductive layer 75 functioning as a back gate, an insulating layer **77*a* and an insulating layer 77*b* functioning as a first gate insulating layer, a semiconductor layer 79, an insulating layer 81 functioning as a second gate insulating layer, a conductive layer 83 functioning as a gate, and a pair of conductive layers 85. The pair of conductive layers 85 is provided over and in contact with the semiconductor layer 79 and functions as a source electrode and a drain electrode. A wiring 75A is provided over the insulating layer 283. The wiring 75A can be formed in the same step as the conductive layer 75**.

Although FIG. 2 illustrates the stacked-layer structure of the insulating layer **77*a* and the insulating layer 77*b* over the insulating layer 77*a* as the first gate insulating layer, one embodiment of the present invention is not limited thereto. The first gate insulating layer may have a single-layer structure or a stacked-layer structure of three or more layers. Similarly, the conductive layer 75, the semiconductor layer 79, the insulating layer 81, the conductive layer 83, and the conductive layers 85** may each have a single-layer structure or a stacked-layer structure.

The conductive layer 75 can be provided to be embedded in an insulating layer 284. Planarization treatment may be performed so that a top surface of the conductive layer 75 and the insulating layer 284 are level with or substantially level with each other.

An insulating layer 285 is provided to cover top surfaces and side surfaces of the conductive layers 85 and a side surface of the semiconductor layer 79, and an insulating layer 286 is provided over the insulating layer 285. A top surface of the insulating layer 286 is preferably level with or substantially level with a top surface of the conductive layer 83 and a top surface of the insulating layer 81.

An insulating layer 287 is provided over the insulating layer 286, and the insulating layer 288 is provided over the insulating layer 287.

The capacitor 73 is provided over the insulating layer 288. The capacitor 73 includes a conductive layer 87 functioning as a lower electrode, a conductive layer 89 functioning as an upper electrode, and an insulating layer 91. The insulating layer 91 is sandwiched between the conductive layer 87 and the conductive layer 89 and functions as a dielectric of the capacitor 73. A conductive layer 87A and a conductive layer 87B are provided over the insulating layer 288. The conductive layer 87A and the conductive layer 87B can be formed in the same step as the conductive layer 87.

A plug 274A is provided to be embedded in the insulating layer 288, the insulating layer 287, the insulating layer 286, and the insulating layer 285. FIG. 2 illustrates a structure example in which the capacitor 73 is electrically connected to one of a source and a drain of the transistor 71 through the plug 274A.

An insulating layer 289 is provided over the capacitor 73, and the insulating layer 290 is provided over the insulating layer 289. A plug 274B is provided to be embedded in the insulating layer 289 and the insulating layer 290. A wiring 279 is provided over the insulating layer 290. The insulating layer 291 is provided over the wiring layer 279. A plug 274C is provided to be embedded in the insulating layer 291. A wiring 281 is provided over the insulating layer 291. The insulating layer 293 is provided over the wiring 281. A plug 274D is provided to be embedded in the insulating layer 293.

The light-emitting device 61 is provided over the wiring 281. The light-emitting device 61 includes a conductive layer 63, a conductive layer 67, and an EL layer 65. The EL layer 65 sandwiched between the conductive layer 63 and the conductive layer 67 includes at least a light-emitting layer. The light-emitting layer contains a light-emitting substance that emits light. The EL layer 65 emits light when a voltage is applied between the conductive layer 63 and the conductive layer 67. FIG. 2 illustrates a structure in which the light-emitting device 61 is electrically connected to the capacitor 73 through the plug 274B, the wiring 279, the plug 274C, the wiring 281, and the plug 274D. The conductive layer 63 functions as a pixel electrode of the light-emitting device 61, and the conductive layer 67 functions as a common electrode.

The display apparatus 10 preferably includes a transistor that does not contribute to the operation of the display apparatus 10 (hereinafter, also referred to as a dummy transistor). The dummy transistor has a stacked-layer structure of a semiconductor layer, a conductive layer, and an insulating layer sandwiched between the semiconductor layer and the conductive layer, where one or more of a gate, a drain, and a source are electrically floating. The display apparatus 10 may include a layer that does not contribute to the operation of the display apparatus 10 (hereinafter, also referred to as a dummy layer). As the dummy layer, for example, a conductive layer that does not function as a wiring, i.e., that is electrically floating, can be provided. In addition, a semiconductor layer that is electrically floating may be provided as a dummy layer.

FIG. 2 illustrates a dummy transistor 71DM, a dummy layer 75DMb, a dummy layer 87DM, a dummy layer 89DM, a dummy layer 279DM, and a dummy layer 281DM. The dummy transistor 71DM is provided over the insulating layer 283 and includes a conductive layer 75DMa, the insulating layer 77*a*, the insulating layer 77*b*, a semiconductor layer 79DM, an insulating layer 81DM, a conductive layer 83DM, and a pair of conductive layers 85DM.

The dummy transistor 71DM can be formed in the same steps as the transistor 71. For example, the conductive layer 75DMa can be formed in the same step as the conductive layer 75. The dummy layer 75DMb may be formed at the time of forming the conductive layer 75 and the conductive layer 75DMa. Although FIG. 2 illustrates a structure in which the semiconductor layer 79 of the transistor 71 and the semiconductor layer of the dummy transistor 71DM are separated, one embodiment of the present invention is not limited thereto. A structure in which the semiconductor layer 79 and the semiconductor layer 79DM are not separated, i.e., the transistor 71 and the dummy transistor 71DM share one semiconductor layer may be employed.

The dummy layer 87DM is provided over the insulating layer 288 and can be formed in the same step as the conductive layer 87. The dummy layer 89DM is provided over the insulating layer 91 and can be formed in the same step as the conductive layer 89. The dummy layer 279DM is provided over the insulating layer 290 and can be formed in the same step as the wiring 279. The dummy layer 281DM is provided over the insulating layer 291 and can be formed in the same step as the wiring 281.

One pixel may include a plurality of dummy transistors. Furthermore, a plurality of dummy layers may be provided over the same insulating layer. FIG. 2 illustrates a structure in which two dummy layers 281DM are provided over the insulating layer 291.

Here, the layers included in the display apparatus 10 can be formed by a photolithography method. For example, the semiconductor layer can be formed by etching a semiconductor film to be the semiconductor layer by using, as a mask, a resist mask formed over the semiconductor film. As the etching, one or more of a dry etching method, a wet etching method, and a sandblast method can be used, for example. The conductive layers and the insulating layers can also be formed by similar methods.

The resist mask can be formed by application of a photosensitive resist material over a processing-target film, light exposure, and development. As the resist material, a negative-type resist or a positive-type resist can be used. As the resist material, a chemically amplified resist may be used. For the development, TMAH (Tetra Methyl Ammonium Hydroxide) can be used, for example. For the development, a strongly alkaline aqueous solution to which a surface-active agent is added may be used.

For light used for exposure in a photolithography method, for example, an i-line (with a wavelength of 365 nm), a g-line (with a wavelength of 436 nm), an h-line (with a wavelength of 405 nm), or combined light of any of them can be used. Alternatively, ultraviolet light, KrF laser light, ArF laser light, or the like can be used. Light exposure may be performed by a liquid immersion exposure technique. As the light for exposure, extreme ultra-violet (EUV) light or X-rays may also be used. Furthermore, instead of the light used for the light exposure, an electron beam can also be used. It is preferable to use extreme ultra-violet, X-rays, or an electron beam to enable extremely minute processing. Note that a photomask is not needed when light exposure is performed by scanning with a beam such as an electron beam.

In the development, a polymer, which is a constituent of the resist mask, may flow out into a developer and coagulate into foreign matter, and the foreign matter may be attached to a processing-target film. Furthermore, a developer that has entered the resist mask in the processing with the developer may be eluted in washing after the processing with the developer, so that a polymer, which is a constituent of the resist mask, may flow out to become foreign matter. In some cases, the foreign matter is likely to be attached particularly when the processing-target film has hydrophilicity. In the case where the foreign matter is attached to a region where the resist mask is not provided, the foreign matter may serve as a mask in etching to cause a defective pattern. In addition, a short circuit derived from the defective pattern may occur.

By being provided with the dummy transistor or the dummy layers, the semiconductor device of one embodiment of the present invention can have a high proportion of the total area of resist masks provided over a processing-target film. Accordingly, a decrease in the proportion of the area of a region where the processing-target film is exposed without being covered with the resist masks can be inhibited, and the above-described attachment of foreign matter derived from the resist masks to the region can be inhibited. That is, defective patterns can be reduced and the manufacturing yield of the semiconductor device can be increased.

In manufacturing the semiconductor device, the proportion of the total area of the resist masks provided over the processing-target film is preferably high. In a top view, the proportion of the total area of the resist masks to the area of the region where the pixel circuit 51 is provided is preferably greater than or equal to 10%, further preferably greater than or equal to 12%, still further preferably greater than or equal to 15%, yet further preferably greater than or equal to 17%, further preferably greater than or equal to 20%, still further preferably greater than or equal to 25%, yet further preferably greater than or equal to 30%, further preferably greater than or equal to 40%. Provision of the dummy transistor or the dummy layers in a region where none of the transistor, the capacitor, and the wirings are provided can increase the proportion of the total area of the resist masks. In the case where the proportion of the total area of the resist masks is within the above-described range even without the dummy transistor or the dummy layers, the dummy transistor or the dummy layers are not necessarily provided. In all the photolithography steps, the proportion of the total area of the resist masks is not necessarily within the above-described range. Although the proportion of the total area of the resist masks is preferably high, a high proportion of the total area of the resist masks may generate a defective pattern due to foreign matter that is different from the above-described foreign matter derived from the resist mask. Therefore, in the case where the upper limit of the proportion of the total area of the resist masks is provided, the upper limit is preferably less than or equal to 90%, further preferably less than or equal to 80%, still further preferably less than or equal to 70%. Note that there is no need to provide the upper limit particularly for the proportion of the total area of resist masks used for formation of contact holes.

In this specification and the like, the area of the region where the pixel circuit 51 is provided in a top view may be referred to as the area of the pixel or the area of the subpixel.

Figure 3A:
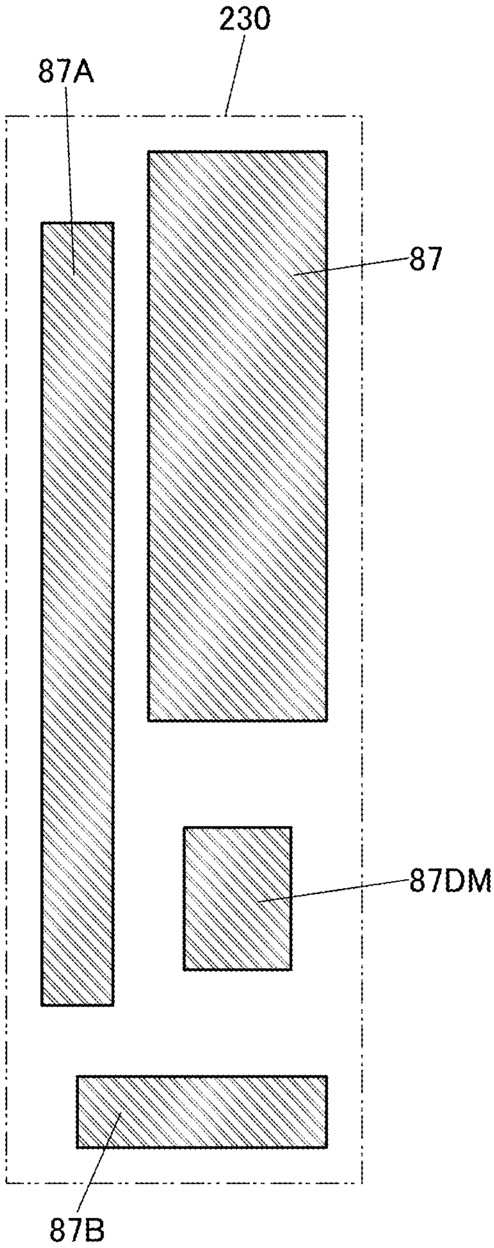
FIG. 3A and FIG. 3B are top views illustrating a structure example of the display apparatus.

The proportion of the total area of layers provided on the same plane is preferably high. In a top view, the proportion of the total area of the layers to the area of the pixel 230 is preferably greater than or equal to 10%, further preferably greater than or equal to 12%, still further preferably greater than or equal to 15%, yet further preferably greater than or equal to 17%, further preferably greater than or equal to 20%, still further preferably greater than or equal to 25%, yet further preferably greater than or equal to 30%, and further preferably greater than or equal to 40%. FIG. 3A is a top view illustrating a structure example of the conductive layer 87, the conductive layer 87A, the conductive layer 87B, and the dummy layer 87DM illustrated in FIG. 2. The conductive layer 87, the conductive layer 87A, the conductive layer 87B, and the dummy layer 87DM are each provided over the insulating layer 288. The proportion of the total area of the conductive layer 87, the conductive layer 87A, the conductive layer 87B, and the dummy layer 87DM to the area of the pixel 230 is preferably within the above-described range. Although the conductive layer 87, the conductive layer 87A, the conductive layer 87B, and the dummy layer 87DM are described as an example here, the same applies to the other layers and the proportion of the total area of layers provided on the same plane is preferably within the above-described range. Note that the proportions of the total areas in all the layers are not necessarily within the above-described range.

In a top view, the area of the capacitor is preferably large. When the area of the capacitor is increased, charge retained in the capacitor can be retained for a long time. Thus, the area of the conductive layer 87 functioning as the lower electrode of the capacitor is preferably large. The proportion of the total area of the conductive layer 87, the conductive layer 87A, the conductive layer 87B, and the dummy layer 87DM is particularly preferably greater than or equal to 25%, further preferably greater than or equal to 30%, still further preferably greater than or equal to 40%. The same applies to the proportion of the total area of the conductive layer 89 functioning as the upper electrode and the layers provided on the same plane as the conductive layer 89.

Note that the number, the positions, and the top surface shapes of the conductive layer 87, the conductive layer 87A, the conductive layer 87B, and the dummy layer 87DM are not limited to FIG. 3A.

Figure 3B:
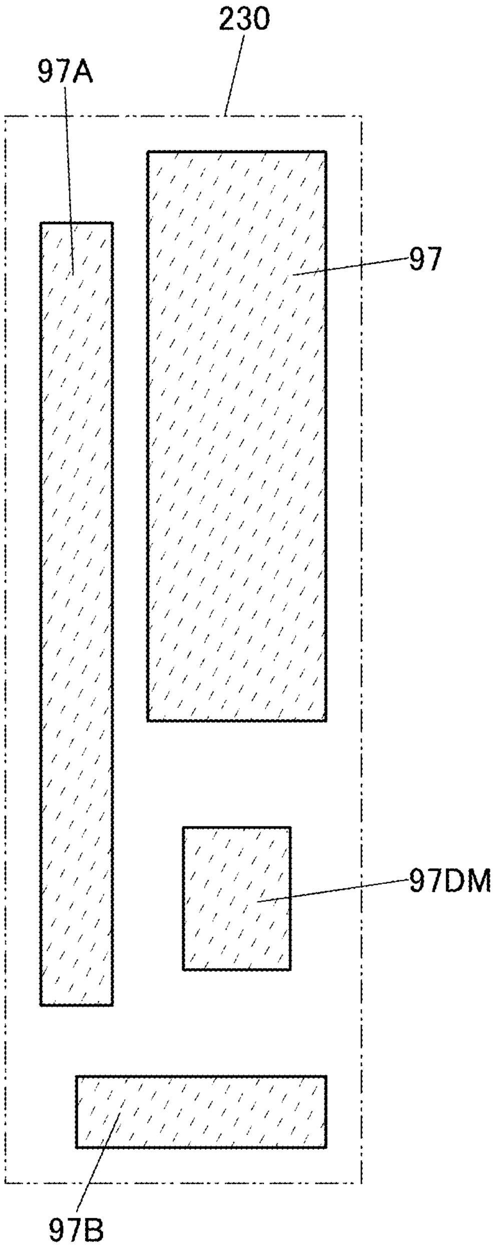

FIG. 3B is a top view of the resist masks at the time of forming the conductive layer 87, the conductive layer 87A, the conductive layer 87B, and the dummy layer 87DM illustrated in FIG. 3A. The resist mask 97, the resist mask 97A, the resist mask 97B, and the resist mask 97DM correspond to the conductive layer 87, the conductive layer 87A, the conductive layer 87B, and the dummy layer 87DM, respectively. The resist mask 97, the resist mask 97A, the resist mask 97B, and the resist mask 97DM are provided over the conductive film to be the conductive layer 87, the conductive layer 87A, the conductive layer 87B, and the dummy layer 87DM. In a top view, the proportion of the total area of the resist mask 97, the resist mask 97A, the resist mask 97B, and the resist mask 97DM to the area of the pixel 230 is preferably within the above-described range. Similarly, the proportion of the total area of resist masks provided on the same plane in the other layers is preferably within the above-described range.

Although FIG. 3B illustrates an example in which the top surface shapes of the resist mask 97, the resist mask 97A, the resist mask 97B, and the resist mask 97DM are quadrangular, the top surface shapes are not particularly limited. Although FIG. 3A and FIG. 3B illustrate an example where the top surface shapes of the conductive layers and the top surface shapes of the resist masks corresponding to the conductive layers are the same, one embodiment of the present invention is not limited thereto. The top surface shapes of the conductive layers and the top surface shapes of the resist masks may be different from each other. For example, an end portion of the conductive layer may be inward or outward from an end portion of the corresponding resist mask.

Similarly in the peripheral driver circuit, the proportion of the total area of resist masks provided on the same plane is preferably high. In a top view, the proportion of the total area of the resist masks provided on the same plane to the area of the peripheral driver circuit is preferably within the above-described range. In a top view, the proportion of the total area of layers provided on the same plane to the area of the peripheral driver circuit is preferably within the above-described range.

The above-described foreign matter derived from the resist mask can be inhibited from being attached to a processing-target film by replacing a developer during processing with a developer, for example. Alternatively, the washing time after the processing with a developer is lengthened or washing is performed a plurality of times, whereby foreign matter can be inhibited from being attached to a processing-target film. For the washing, pure water can be used, for example. For the washing, pure water to which a gas is added may be used. For example, pure water to which carbon dioxide is added, pure water to which hydrogen is added, or pure water to which nitrogen is added can be used. Alternatively, blow dry may be performed after washing, whereby foreign matter can be inhibited from being attached to a processing-target film. For the blow, nitrogen, air, or a noble gas can be used, for example. For the blow, clean dry air (CDA) may be used.

<Circuit Structure Example 1>

Figure 4:
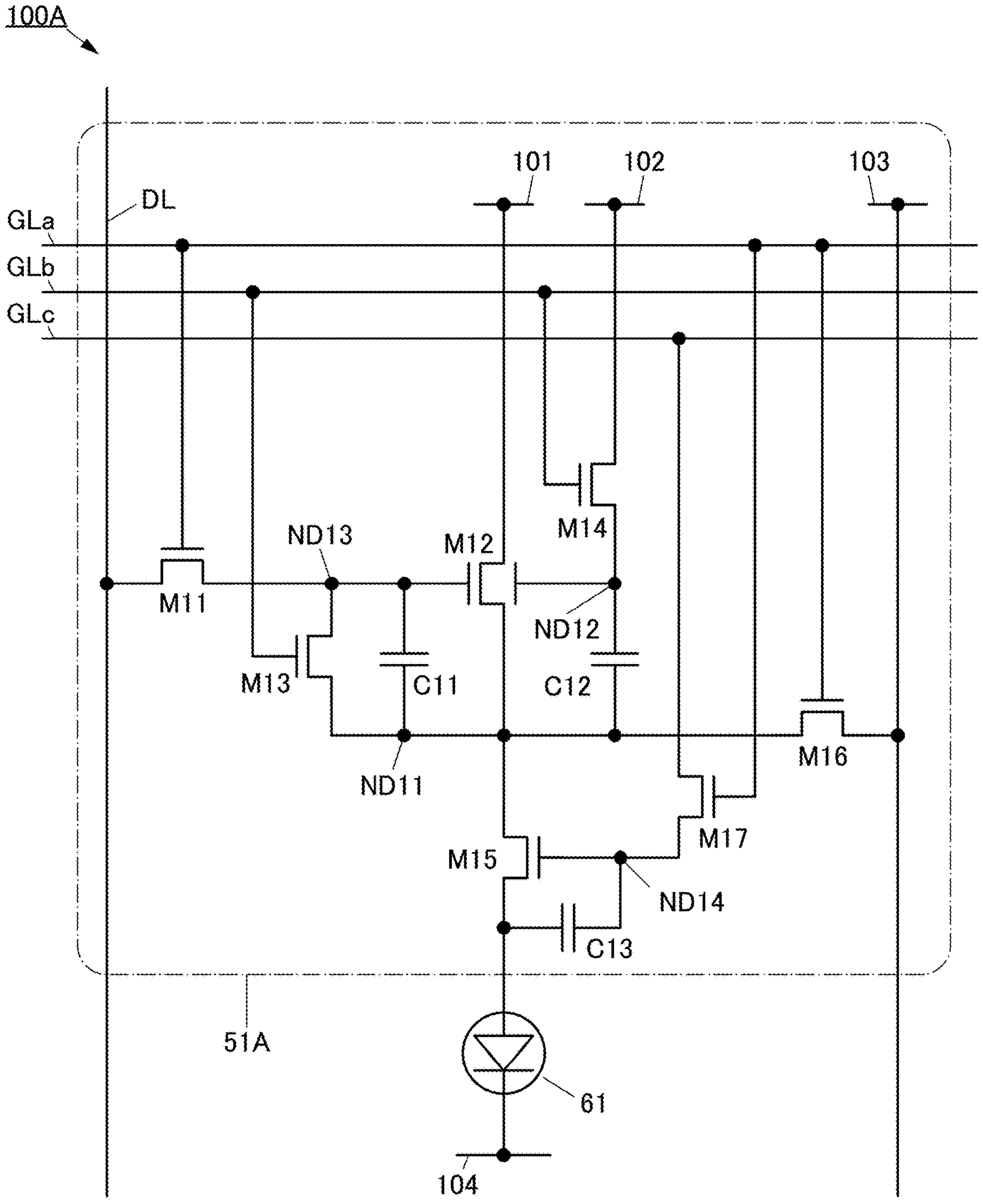
FIG. 4 is a circuit diagram illustrating a semiconductor device.

FIG. 4 illustrates a circuit structure example applicable to the semiconductor device of one embodiment of the present invention. A semiconductor device 100A illustrated in FIG. 4 includes a pixel circuit 51A and the light-emitting device 61.

One terminal of the light-emitting device 61 is electrically connected to the pixel circuit 51A, and the other terminal is electrically connected to a wiring 104. For example, the one terminal of the light-emitting device 61 can be an anode terminal, and the other terminal can be a cathode terminal. Note that the one terminal of the light-emitting device 61 may be a cathode terminal, and the other terminal may be an anode terminal. The pixel circuit 51 has a function of controlling light emission of the light-emitting device 61.

The pixel circuit 51A includes a transistor M11 to a transistor M17 and a capacitor C11 to a capacitor C13.

In this specification and the like, unless otherwise specified, the transistor M11 to the transistor M17 are enhancement (normally-off) n-channel field-effect transistors. Thus, the threshold voltages (Vth) are higher than 0 V.

The one terminal of the light-emitting device 61 is electrically connected to one of a source and a drain of the transistor M15 and one terminal of the capacitor C13.

A gate of the transistor M15 is electrically connected to the other terminal of the capacitor C13 and one of a source and a drain of the transistor M17. The other of the source and the drain of the transistor M15 is electrically connected to one terminal of the capacitor C11, one terminal of the capacitor C12, one of a source and a drain of the transistor M12, one of a source and a drain of the transistor M13, and one of a source and a drain of the transistor M16.

A gate of the transistor M12 is electrically connected to the other terminal of the capacitor C11, the other terminal of the source and the drain of the transistor M13, and one of a source and a drain of the transistor M11. The transistor M12 includes a back gate. The back gate of the transistor M12 is electrically connected to the other terminal of the capacitor C12 and one of a source and a drain of the transistor M14.

The other of the source and the drain of the transistor M11 is electrically connected to a wiring DL, and a gate thereof is electrically connected to a wiring GLa. The transistor M11 has a function of selecting whether to establish electrical continuity between the gate of the transistor M12 and the wiring DL.

The other of the source and the drain of the transistor M12 is electrically connected to a wiring 101. The transistor M12 includes a back gate. The transistor M12 has a function of controlling the amount of current Je flowing through the light-emitting device 61. That is, the transistor M12 has a function of controlling the amount of light emitted from the light-emitting device 61. Thus, the transistor M12 can be regarded as a driving transistor.

A gate of the transistor M13 is electrically connected to a wiring GLb. The transistor M13 has a function of selecting whether to establish electrical continuity between the gate and the source of the transistor M12.

A gate of the transistor M14 is electrically connected to the wiring GLb, and the other of the source and the drain of the transistor M14 is electrically connected to a wiring 102. The transistor M14 has a function of selecting whether to establish electrical continuity between the wiring 102 and the one terminal of the capacitor C12.

The transistor M15 has a function of switching electrical continuity between the transistor M12 and the light-emitting device 61. The light-emitting device 61 does not emit light when the transistor M15 is in the off state, and the light-emitting device 61 can emit light when the transistor M15 is in the on state. In order to surely supply current with the amount determined by the driving transistor to the light-emitting device 61, the transistor M15 needs to be surely in the on state regardless of the values of the source potential and the drain potential.

A gate of the transistor M16 is electrically connected to the wiring GLa, and the other of the source and the drain thereof is electrically connected to a wiring 103. The transistor M16 has a function of selecting whether to establish electrical continuity between the one of the source and the drain of the transistor M12 and the wiring 103.

A gate of the transistor M17 is electrically connected to the wiring GLa, and the other of the source and the drain thereof is electrically connected to a wiring GLc. The transistor M17 has a function of selecting whether to establish electrical continuity between the gate of the transistor M15 and the wiring GLc.

A region where the one terminal of the capacitor C11, the one terminal of the capacitor C12, the one of the source and the drain of the transistor M12, the one of the source and the drain of the transistor M13, the other of the source and the drain of the transistor M15, and the one of the source and the drain of the transistor M16 are electrically connected to one another is referred to as a node ND11.

A region where the other terminal of the capacitor C12, the back gate of the transistor M12, and the one of the source and the drain of the transistor M14 are electrically connected to one another is referred to as a node ND12.

A region where the one of the source and the drain of the transistor M11, the other of the source and the drain of the transistor M13, the other terminal of the capacitor C11, and the gate of the transistor M12 are electrically connected to one another is referred to as a node ND13.

A region where the gate of the transistor M15, the other terminal of the capacitor C13, and the one of the source and the drain of the transistor M17 are electrically connected to one another is referred to as a node ND14.

The capacitor C11 has a function of retaining a potential difference between the one of the source and the drain of the transistor M12 and the gate of the transistor M12 at the time when the node ND13 is in a floating state. The capacitor C12 has a function of retaining a potential difference between the one of the source and the drain of the transistor M12 and the back gate of the transistor M12 at the time when the node ND12 is in a floating state. The capacitor C13 has a function of retaining a potential difference between the one of the source and the drain of the transistor M15 and the gate of the transistor M15 at the time when the node ND14 is in a floating state.

The capacitor C11 to the capacitor C13 preferably have high capacitances. In particular, the capacitances of the capacitor C11 and the capacitor C12 are preferably high and preferably higher than the capacitance of the capacitor C13. The capacitances of the capacitor C11 and the capacitor C12 are preferably greater than or equal to 2 fF, further preferably greater than or equal to 4 fF, still further preferably greater than or equal to 6 fF, yet still further preferably greater than or equal to 8 fF, further preferably greater than or equal to 10 fF. The capacitance of the capacitor C13 is preferably greater than or equal to 1 fF, further preferably greater than or equal to 2 fF, still further preferably greater than or equal to 3 fF, yet further preferably greater than or equal to 4 fF, yet still further preferably greater than or equal to 5 fF. Note that since higher capacitances of the capacitor C11 to the capacitor C13 are preferable, the upper limits do not need to be particularly provided for the capacitances of the capacitor C11 to the capacitor C13. However, in the case where the upper limits are provided, the capacitances of the capacitor C11 and the capacitor C12 are set to less than or equal to 20 fF, and the capacitance of the capacitor C13 is set to less than or equal to 10 fF.

When the capacitance of the capacitor C11 is high, the potential difference between the one of the source and the drain of the transistor M12 and the gate of the transistor M12 can be retained for a long time. When the capacitance of the capacitor C12 is high, the potential difference between the one of the source and the drain of the transistor M12 and the back gate of the transistor M12 can be retained for a long time. When the capacitance of the capacitor C13 is high, the potential difference between the one of the source and the drain of the transistor M15 and the gate of the transistor M15 can be retained for a long time.

Since data retained in the capacitor C11 and the capacitor C12 greatly affects the display quality, the influence of external noise is preferably small. When the capacitances of the capacitor C11 and the capacitor C12 are high, the influence of external noise can be reduced, so that a display apparatus with high display quality can be achieved. The capacitor C11 preferably retains data longer than one frame period. Similarly, the capacitor C12 preferably retains data longer than one frame period, further preferably longer than or equal to 1 second, still further preferably longer than or equal to 1 minute, yet still further preferably longer than or equal to 1 hour. Thus, the capacitance of the capacitor C12 may be higher than the capacitance of the capacitor C11. Meanwhile, the capacitance of the capacitor C13 may be lower than the capacitances of the capacitor C11 and the capacitor C12 as long as the capacitor C13 can retain a voltage that can sufficiently make the transistor M15 in an on state.

The capacitance of the capacitor C11 is preferably higher than or equal to 2 times, further preferably higher than or equal to 3 times, still further preferably higher than or equal to 4 times, yet still further preferably higher than or equal to 5 times the capacitance of the capacitor C13. The capacitance of the capacitor C12 is preferably higher than or equal to 2 times, further preferably higher than or equal to 3 times, still further preferably higher than or equal to 4 times, yet still further preferably higher than or equal to 5 times the capacitance of the capacitor C13.

In a top view, the area of the capacitor C11 is preferably larger than or equal to 2 times, further preferably larger than or equal to 3 times, still further preferably larger than or equal to 4 times, yet still further preferably larger than or equal to 5 times the area of the capacitor C13. The area of the capacitor C12 is preferably larger than or equal to 2 times, further preferably larger than or equal to 3 times, still further preferably larger than or equal to 4 times, yet still further preferably larger than or equal to 5 times the area of the capacitor C13.

Note that in this specification and the like, the area of a capacitor refers to the area of a region where the upper electrode and the lower electrode of the capacitor overlap with each other.

Note that there is no particular limitation on the structure of the transistor included in the semiconductor device of one embodiment of the present invention. For example, any of transistors having a variety of structures such as a planar type, a FIN-type, a TRI-GATE type, a top-gate type, a bottom-gate type, and a dual-gate type (a structure in which gates are placed above and below a channel) can be used in the pixel circuit 51A. A MOS transistor, a junction transistor, a bipolar transistor, or the like can be used as the transistor in one embodiment of the present invention.

There is no particular limitation on a semiconductor material used in a transistor included in the semiconductor device of one embodiment of the present invention. For example, a transistor containing a single crystal semiconductor, a polycrystalline semiconductor, a microcrystalline semiconductor, or an amorphous semiconductor in a region where a channel is formed (hereinafter referred to as a channel formation region) can be used. Furthermore, a compound semiconductor (e.g., silicon germanium (SiGe) or gallium arsenide (GaAs)), an oxide semiconductor, or the like as well as a single element semiconductor whose main component is a single element (e.g., silicon (Si) or germanium (Ge)) can be used.

In this embodiment and the like, an example is described in which the semiconductor device is formed using n-channel transistors; however, one embodiment of the present invention is not limited thereto. As some or all of the transistors included in the semiconductor device, p-channel transistors may be used.

A transistor including an oxide semiconductor in a channel formation region (hereinafter referred to as an OS transistor) may be used in the semiconductor device of one embodiment of the present invention. A transistor including silicon in a channel formation region (hereinafter referred to as a Si transistor) may be used. As silicon, single crystal silicon, polycrystalline silicon, and amorphous silicon can be given.

For example, OS transistors may be used in the pixel circuit 51A. An oxide semiconductor has a band gap of 2 eV or more; thus, an OS transistor has an extremely low off-state current value.

The off-state current value per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). Thus, the off-state current of the OS transistor is lower than the off-state current of the Si transistor by approximately ten orders of magnitude.

When the OS transistor is used in the pixel circuit 51A, charge written to the nodes can be retained for a long period. For example, in the case of displaying a still image for which rewriting every frame is not required, displaying an image can be kept even when the operation of a peripheral driver circuit is stopped. Such a driving method in which the operation of a peripheral driver circuit is stopped during displaying a still image is also referred to as "idling stop driving". The power consumption of a display apparatus can be reduced by performing idling stop driving.

The off-state current of the OS transistor hardly increases even in a high temperature environment. Specifically, the off-state current hardly increases even at an environment temperature higher than or equal to room temperature and lower than or equal to 200° C. Furthermore, the on-state current is unlikely to decrease even in the high-temperature environment. A semiconductor device including the OS transistor can operate stably and have high reliability even in a high-temperature environment.

Moreover, the OS transistor has a high source-drain breakdown voltage. The use of the OS transistor in the pixel circuit 51A makes the operation stable even in the case where a potential difference between a potential Va and a potential Vc is large, so that the semiconductor device can have high reliability. It is particularly preferable to use the OS transistor as one or both of the transistor M12 and the transistor M15.

The semiconductor layer of the OS transistor preferably contains indium, an element M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, the element M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer. Alternatively, an oxide containing indium (In), aluminum (Al), and zinc (Zn) (also referred to as IAZO) may be used for the semiconductor layer. Alternatively, an oxide containing indium (In), aluminum (Al), gallium (Ga), and zinc (Zn) (also referred to as IAGZO) may be used for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

For example, Si transistors may also be used in the pixel circuit 51A. In particular, a transistor including low-temperature polysilicon (LTPS) in a channel formation region (hereinafter also referred to as an LTPS transistor) can suitably be used. The LTPS transistor has high field-effect mobility and favorable frequency characteristics.

The pixel circuit 51A may include a plurality of kinds of transistors formed using different semiconductor materials. For example, the pixel circuit 51A may be formed using LTPS transistors and OS transistors. A structure in which the LTPS transistors and the OS transistors are combined is referred to as LTPO in some cases.

In the case where the pixel circuit 51A includes a plurality of kinds of transistors formed using different semiconductor materials, the transistors may be provided in different layers on the transistor kind basis. For example, in the case where the pixel circuit 51A includes Si transistors and OS transistors, a layer including the Si transistors and a layer including the OS transistors may be provided to overlap with each other. This structure can reduce the area of the pixel circuit 51A.

Either or both of the Si transistors and the OS transistors may be used as the transistors included in the peripheral driver circuit. For example, OS transistors may be used as the transistors included in the pixel circuit 51A and Si transistors may be used as the transistors included in the peripheral driver circuit. The off-state current of the OS transistor is low, so that power consumption can be reduced. Since the Si transistor has a higher operation speed than the OS transistor, the Si transistor is suitably used in the peripheral driver circuit. The display apparatus may include the OS transistors as both the transistors included in the pixel circuit 51A and the transistors included in the peripheral driver circuit and the peripheral driver circuit. The display apparatus may include the Si transistors as both the transistors included in the pixel circuit 51A and the transistors included in the peripheral driver circuit and the peripheral driver circuit. Alternatively, the display apparatus may include the Si transistors as the transistors included in the pixel circuit 51A and the OS transistors as the transistors included in the peripheral driver circuit.

Among the transistors included in the pixel circuit 51A, the transistor M11 and the transistor M13 to the transistor M17 each function as a switch. Therefore, the transistor M11 and the transistor M13 to the transistor M17 can be replaced with elements that can function as switches.

Although FIG. 4 illustrates a structure in which the transistor M12 includes the back gate and the transistors other than the transistor M12 do not include a back gate, one embodiment of the present invention is not limited thereto. The transistors other than the transistor M12 may include a back gate.

A multi-channel-type transistor may be used in the pixel circuit 51A. The multi-channel-type transistor includes a plurality of gates electrically connected to each other and includes a plurality of regions where a semiconductor layer and the gates overlap with each other between a source and a drain. That is, a multi-channel-type transistor includes a plurality of gates electrically connected to each other and includes a plurality of channel formation regions between a source and a drain. Note that in this specification and the like, a multi-channel-type transistor is referred to as a "multi-channel transistor", a "multi-gate transistor", or a "multi-gate-type transistor" in some cases.

Figure 5A:
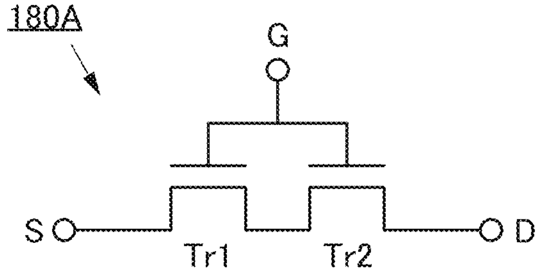
FIG. 5A to FIG. 5C are diagrams illustrating circuit symbols of transistors.

FIG. 5A illustrates a circuit symbol example of a double-gate-type transistor 180A including two channel formation regions between a source and a drain, as an example of a multi-channel transistor.

The transistor 180A has a structure in which a transistor Tr and a transistor Tr2 are connected in series. FIG. 5A illustrates a structure in which one of a source and a drain of the transistor Tr is electrically connected to a terminal S, the other of the source and the drain of the transistor Tr is electrically connected to one of a source and a drain of the transistor Tr2, and the other of the source and the drain of the transistor Tr2 is electrically connected to a terminal D. Gates of the transistor Tr and the transistor Tr2 are electrically connected to each other and electrically connected to a terminal G. The transistor 180A can be regarded as including the transistor Tr and the transistor Tr2 sharing a gate.

The transistor 180A illustrated in FIG. 5A has a function of switching electrical continuity between the terminal S and the terminal D by changing the potential of the terminal G. Thus, the transistor 180A that is a double-gate-type transistor functions as one transistor including the transistor Tr and the transistor Tr2. In other words, it can be said that in FIG. 5A, one of a source and a drain of the transistor 180A is electrically connected to the terminal S, the other of the source and the drain thereof is electrically connected to the terminal D, and a gate thereof is electrically connected to the terminal G.

Figure 5B:
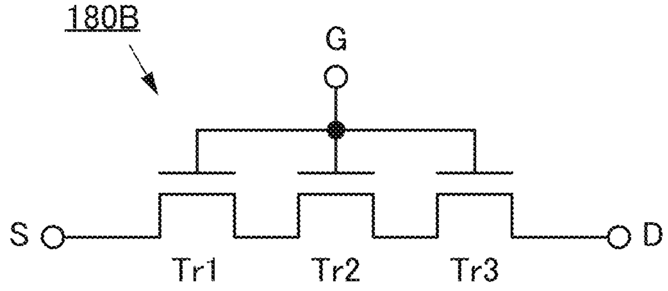

A triple-gate-type transistor may be used in the pixel circuit 51A. FIG. 5B illustrates a circuit symbol example of a triple-gate-type transistor 180B.

The transistor 180B has a structure in which the transistor Tr1, the transistor Tr2, and a transistor Tr3 are connected in series. FIG. 5B illustrates a structure in which the one of the source and the drain of the transistor Tr is electrically connected to the terminal S, the other of the source and the drain of the transistor Tr is electrically connected to the one of the source and the drain of the transistor Tr2, the other of the source and the drain of the transistor Tr2 is electrically connected to one of a source and a drain of the transistor Tr3, and the other of the source and the drain of the transistor Tr3 is electrically connected to the terminal D. Gates of the transistor Tr1, the transistor Tr2, and the transistor Tr3 are electrically connected to each other and electrically connected to the terminal G.

The transistor 180B illustrated in FIG. 5B has a function of switching electrical continuity between the terminal S and the terminal D by changing the potential of the terminal G. Thus, the transistor 180B that is a triple-gate-type transistor functions as one transistor including the transistor Tr1, the transistor Tr2, and the transistor Tr3. In other words, it can be said that in FIG. 5B, one of a source and a drain of the transistor 180B is electrically connected to the terminal S, the other of the source and the drain thereof is electrically connected to the terminal D, and a gate thereof is electrically connected to the terminal G.

The transistors included in the pixel circuit 51A may each have a structure in which four or more transistors are connected in series. A transistor 180C illustrated in FIG. 5C includes serially connected six transistors (the transistor Tr to a transistor Tr6). A structure in which gates of the six transistors are electrically connected to each other and electrically connected to the terminal G is illustrated.

Figure 5C:
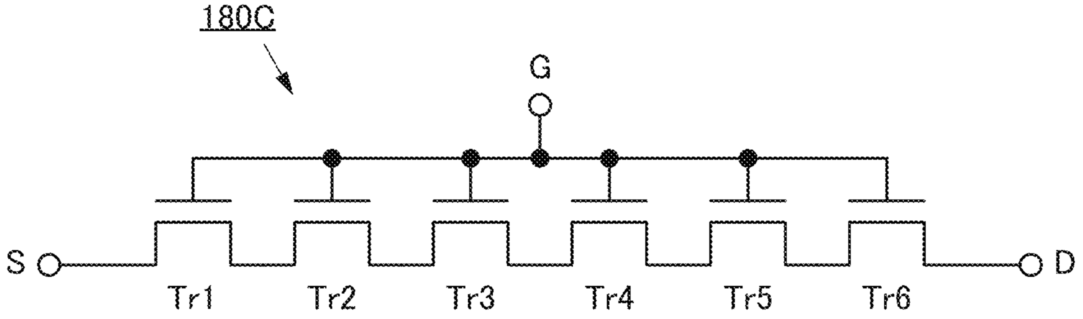

The transistor 180C illustrated in FIG. 5C has a function of switching electrical continuity between the terminal S and the terminal D by changing the potential of the terminal G. Thus, the transistor 180C functions as one transistor including the transistor Tr to the transistor Tr6. That is, it can be said that in FIG. 5C, one of a source and a drain of the transistor 180C is electrically connected to the terminal S, the other of the source and the drain of the transistor 180C is electrically connected to the terminal D, and a gate of the transistor 180C is electrically connected to the terminal G.

In the case where a transistor operates in a saturation region, for example, the channel length of the transistor is sometimes lengthened so that its electrical characteristics in the saturation region can be improved. A multi-gate transistor may be used to achieve a transistor having a long channel length.

Although each of the transistors included in the multi-gate transistor is not provided with a back gate in FIG. 5A to FIG. 5C, one embodiment of the present invention is not limited thereto. Each of the transistors included in the multi-gate transistor may include a back gate.

Structure Example 2

Figure 6:
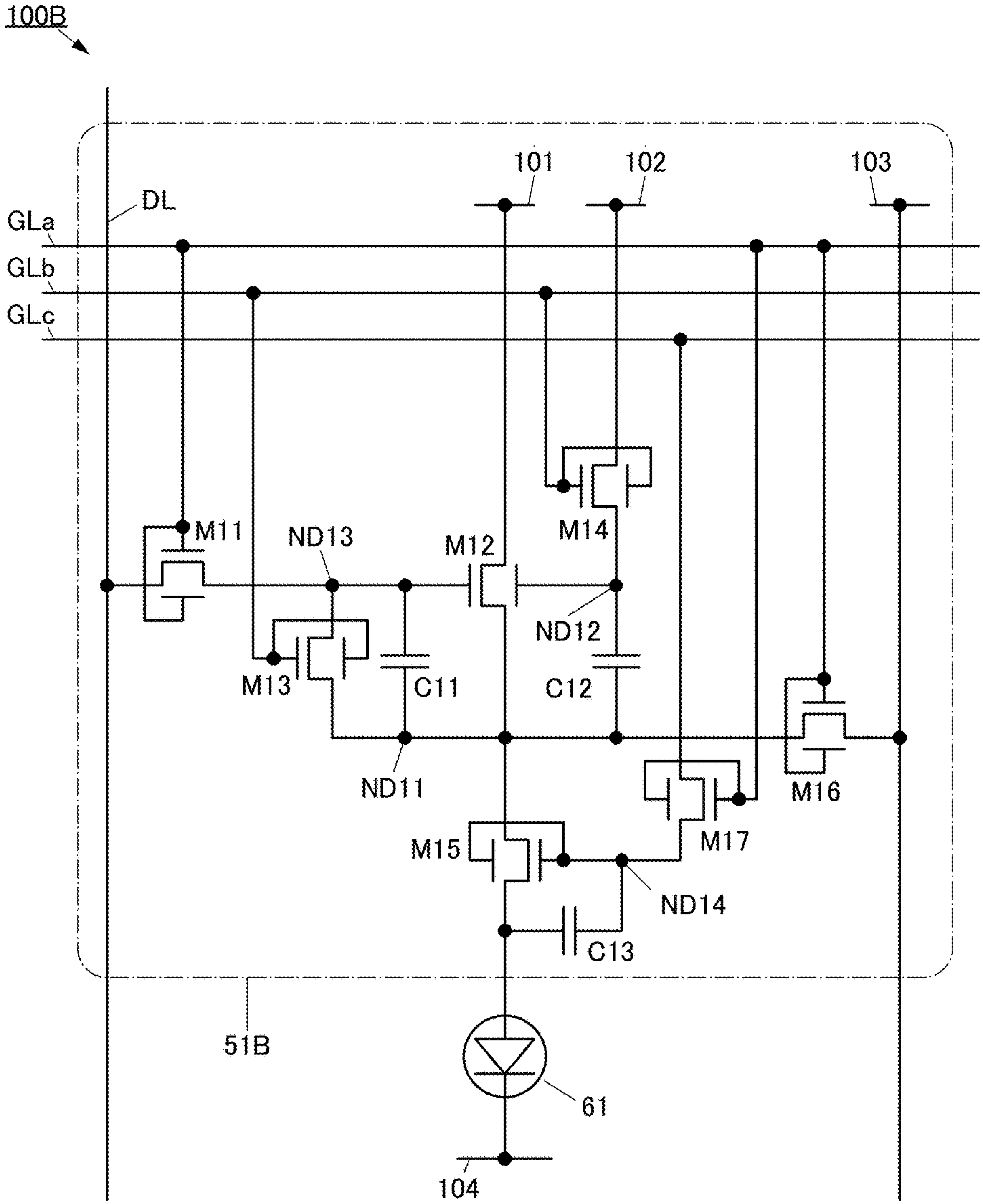
FIG. 6 is a circuit diagram illustrating a semiconductor device.

FIG. 6 illustrates a structure example different from that of the semiconductor device 100A illustrated in FIG. 4. A semiconductor device 100B illustrated in FIG. 6 includes a pixel circuit 51B and the light-emitting device 61. The semiconductor device 100B is different from the semiconductor device 100A mainly in that the transistor M11 and the transistor M13 to the transistor M17 included in the pixel circuit 51B each include a back gate.

FIG. 6 illustrates an example in which the gate and the back gate of each of the transistor M11 and the transistor M13 to the transistor M17 are electrically connected to each other. Without electrical connection between the gate and the back gate, a given potential may be supplied to the back gate. Note that the potential supplied to the back gate is not limited to a fixed potential. The potentials supplied to the back gates of the transistors included in the semiconductor device may be different from one another or may be the same. Not all the transistors included in the semiconductor device necessarily have back gates. The semiconductor device may include transistors having back gates and transistors not having back gates.

Figure 7:
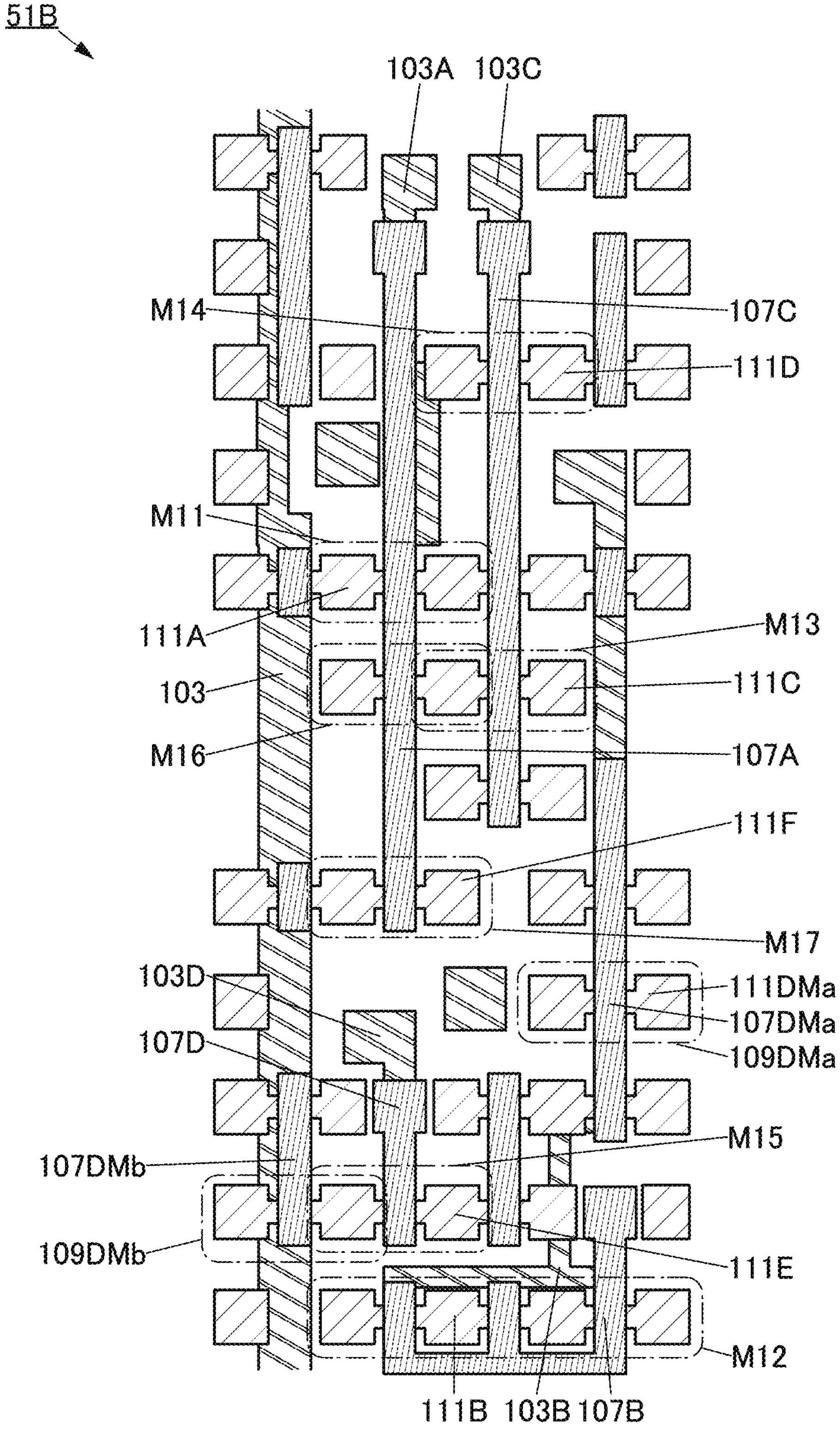
FIG. 7 is a top view illustrating the semiconductor device.

FIG. 7 is a top view illustrating a structure example of the pixel circuit 51B illustrated in FIG. 6. FIG. 7 illustrates the transistor M11 to the transistor M17. Furthermore, some wirings included in the pixel circuit 51B are also illustrated. In FIG. 7, some components of the pixel circuit 51B (e.g., insulating films) are omitted to avoid complexity.

As illustrated in FIG. 7, the transistor M11 includes a semiconductor layer 111A. A conductive layer 107A includes a region overlapping with a conductive layer 103A with the semiconductor layer 111A therebetween. Part of the conductive layer 107A functions as the gate of the transistor M11, and part of the conductive layer 103A functions as the back gate of the transistor M11.

The transistor M12 includes a semiconductor layer 111B. A conductive layer 107B includes a region overlapping with a conductive layer 103B with the semiconductor layer 111B therebetween. Part of the conductive layer 107B functions as the gate of the transistor M11, and part of the conductive layer 103B functions as the back gate of the transistor M11.

FIG. 7 illustrates an example in which a triple-gate-type transistor is used as the transistor M12.

The transistor M13 includes a semiconductor layer 111C. A conductive layer 107C includes a region overlapping with a conductive layer 103C with the semiconductor layer 111C therebetween. Part of the conductive layer 107C functions as the gate of the transistor M13, and part of the conductive layer 103C functions as the back gate of the transistor M13.

The transistor M14 includes a semiconductor layer 111D. The conductive layer 107C includes a region overlapping with the conductive layer 103C with the semiconductor layer 111D therebetween. Part of the conductive layer 107C functions as the gate of the transistor M14, and part of the conductive layer 103C functions as the back gate of the transistor M14.

The transistor M15 includes a semiconductor layer 111E. A conductive layer 107D includes a region overlapping with a conductive layer 103D with the semiconductor layer 111E therebetween. Part of the conductive layer 107D functions as the gate of the transistor M15, and part of the conductive layer 103D functions as the back gate of the transistor M15.

The transistor M16 includes the semiconductor layer 111C. The conductive layer 107A includes a region overlapping with the conductive layer 103A with the semiconductor layer 111C therebetween. Part of the conductive layer 107A functions as the gate of the transistor M16, and part of the conductive layer 103A functions as the back gate of the transistor M16. Although FIG. 7 illustrates a structure in which the transistor M16 and the transistor M13 share part of the semiconductor layer 111C, one embodiment of the present invention is not limited thereto. The transistor M16 and the transistor M13 do not necessarily share the semiconductor layer, and each of the transistors may include a separate semiconductor layer.

The transistor M17 includes a semiconductor layer 111F. The conductive layer 107A includes a region overlapping with the conductive layer 103A with the semiconductor layer 111F therebetween. Part of the conductive layer 107A functions as the gate of the transistor M17, and part of the conductive layer 103A functions as the back gate of the transistor M17.

For the wiring 103 and the conductive layer 103A to the conductive layer 103D, the same material can be used. The wiring 103 and the conductive layer 103A to the conductive layer 103D can be formed in the same step. Note that different materials may be used for the wiring 103 and the conductive layer 103A to the conductive layer 103D.

For the semiconductor layer 111A to the semiconductor layer 111F, the same material can be used. The semiconductor layer 111A to the semiconductor layer 111F can be formed in the same step. Note that different materials may be used for the semiconductor layer 111A to the semiconductor layer 111F.

For the conductive layer 107A to the conductive layer 107D, the same material can be used. The conductive layer 107A to the conductive layer 107D can be formed in the same step. Note that different materials may be used for the conductive layer 107A to the conductive layer 107D.

The pixel circuit 51B preferably includes one or more dummy transistors in addition to the transistor M11 to the transistor M17. Out of a plurality of dummy transistors included in the pixel circuit 51B, a dummy transistor 109DMa and a dummy transistor 109DMb are denoted by reference numerals in FIG. 7.

The dummy transistor 109DMa includes a semiconductor layer 111DMa and a conductive layer 107DMa over the semiconductor layer 111DMa. The dummy transistor 109DMb includes the semiconductor layer 111E and a conductive layer 107DMb over the semiconductor layer 111E.

The dummy transistor may include a layer shared by any of the transistor M11 to the transistor M17. FIG. 7 illustrates an example in which the dummy transistor 109DMb shares the semiconductor layer 111E with the transistor M15. The dummy transistor does not necessarily include a layer shared with any of the transistor M11 to the transistor M17. The conductive layer 107DMa in the dummy transistor 109DMa and the conductive layer 107DMb in the dummy transistor 109DMb correspond to the gates of the transistor M11 to the transistor M17. The conductive layer 107DMa and the conductive layer 107DMb can also be referred to as dummy layers.

Figure 8:
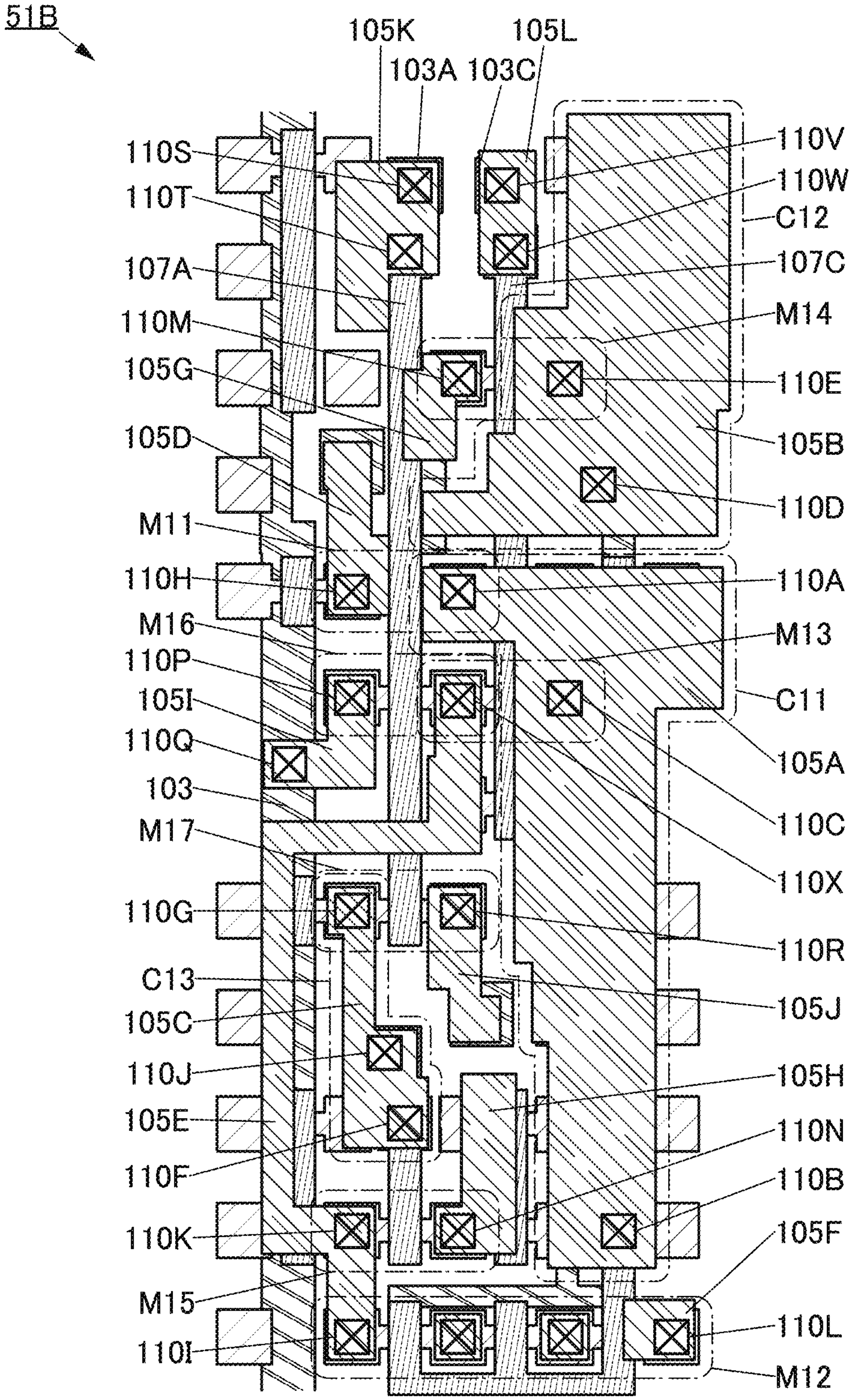
FIG. 8 is a top view illustrating the semiconductor device.

FIG. 8 is a top view illustrating the capacitor C11 to the capacitor C13 which are added over the transistor M11 to the transistor M17 illustrated in FIG. 7. In order to avoid complexity, FIG. 8 illustrates lower electrodes of the capacitor C11 to the capacitor C13. Furthermore, some wirings included in the pixel circuit 51B are also illustrated.

The capacitor C11 to the capacitor C13 can be provided over the transistor M11 to the transistor M17.

A conductive layer 105A functioning as the lower electrode of the capacitor C11 is electrically connected to the one of the source and the drain of the transistor M11 through a contact hole 110A. The conductive layer 105A is electrically connected to the gate of the transistor M12 through a contact hole 110B. The conductive layer 105A is electrically connected to the other of the source and the drain of the transistor M13 through a contact hole 110C. Note that two elements and wirings electrically connected to each other may be electrically connected to each other through a plug provided in a contact hole.

A conductive layer 105B functioning as the lower electrode of the capacitor C12 is electrically connected to the back gate of the transistor M12 through a contact hole 110D. The conductive layer 105B is electrically connected to the one of the source and the drain of the transistor M14 through a contact hole 110E.

A conductive layer 105C functioning as the lower electrode of the capacitor C13 is electrically connected to the gate of the transistor M15 through a contact hole 110F. The conductive layer 105C is electrically connected to the back gate of the transistor M15 through a contact hole 110J. That is, the gate and the back gate of the transistor M15 are electrically connected to each other through the conductive layer 105C. The conductive layer 105C is electrically connected to the one of the source and the drain of the transistor M17 through a contact hole 110G.

As illustrated in FIG. 8, the capacitor C11 preferably includes regions overlapping with regions overlapping with the transistor M11 and the transistor M13. The capacitor C12 preferably includes a region overlapping with the transistor M14. The capacitor C13 preferably includes a region overlapping with the transistor M17. When the capacitor includes a region overlapping with the transistor, the area of the pixel circuit 51A can be reduced and a high-resolution display apparatus can be obtained.

A conductive layer 105D is electrically connected to the other of the source and the drain of the transistor M11 through a contact hole 110H.

A conductive layer 105E is electrically connected to the one of the source and the drain of the transistor M12 through a contact hole 110I. The conductive layer 105E is electrically connected to the other of the source and the drain of the transistor M15 through a contact hole 110K. The conductive layer 105E is electrically connected to the one of the source and the drain of the transistor M13 and the one of the source and the drain of the transistor M16 through a contact hole 110X.

A conductive layer 105F is electrically connected to the other of the source and the drain of the transistor M12 through a contact hole 110L.

A conductive layer 105G is electrically connected to the other of the source and the drain of the transistor M14 through a contact hole 110M.

A conductive layer 105H is electrically connected to the one of the source and the drain of the transistor M15 through a contact hole 110N.

A conductive layer 105I is electrically connected to the other of the source and the drain of the transistor M16 through a contact hole 110P. The conductive layer 105I is electrically connected to the wiring 103 through a contact hole 110Q. That is, the other of the source and the drain of the transistor M16 is electrically connected to the wiring 103 through the conductive layer 105I. A conductive layer that electrically connects two elements or wirings, like the conductive layer 105I electrically connecting the transistor M16 and the wiring 103, can be referred to as a lead wiring or simply a wiring. For example, two transistors can be electrically connected by a lead wiring.

A conductive layer 105J is electrically connected to the other of the source and the drain of the transistor M17 through a contact hole 110R.

A conductive layer 105K is electrically connected to the conductive layer 103A through a contact hole 110S. The conductive layer 105K is electrically connected to the conductive layer 107A through a contact hole 110T. That is, through the conductive layer 105K, the gate and the back gate of the transistor M11 are electrically connected to each other, the gate and the back gate of the transistor M16 are electrically connected to each other, and the gate and the back gate of the transistor M17 are electrically connected to each other.

A conductive layer 105L is electrically connected to the conductive layer 103C through a contact hole 110V. The conductive layer 105L is electrically connected to the conductive layer 107C through a contact hole 110W. That is, through the conductive layer 105L, the gate and the back gate of the transistor M13 are electrically connected to each other, and the gate and the back gate of the transistor M14 are electrically connected to each other.

For the conductive layer 105A to the conductive layer 105L, the same material can be used. The conductive layer 105A to the conductive layer 105L can be formed in the same step. Note that different materials may be used for the conductive layer 105A to the conductive layer 105L.

Figure 9:
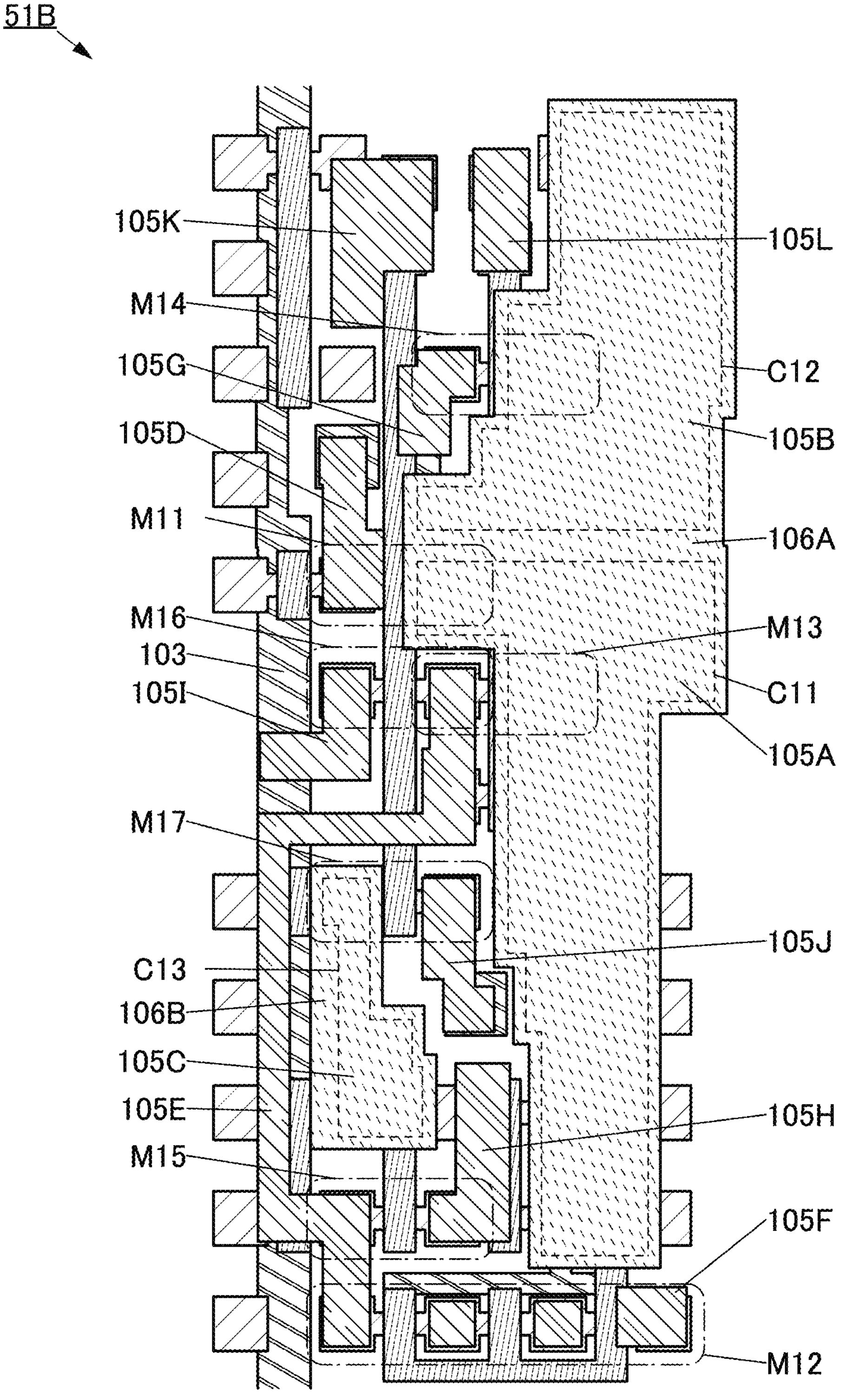
FIG. 9 is a top view illustrating the semiconductor device.

FIG. 9 is a top view illustrating upper electrodes which are added over the lower electrodes of the capacitor C11 to the capacitor C13 illustrated in FIG. 8.

A conductive layer 106A functioning as the upper electrodes of the capacitor C11 and the capacitor C12 includes a region overlapping with the conductive layer 105A and a region overlapping with the conductive layer 105B. A conductive layer 106B functioning as the upper electrode of the capacitor C13 includes a region overlapping with the conductive layer 105C. FIG. 9 illustrates an example in which an end portion of the upper electrode of each of the capacitor C11 to the capacitor C13 is positioned inward from an end portion of the lower electrode, that is, in which the upper electrode covers the lower electrode. When the upper electrode covers the lower electrode, leakage from the capacitor can be reduced. Note that the end portion of the upper electrode of each of the capacitor C11 to the capacitor C13 may be positioned outward from the end portion of the lower electrode.

For the conductive layer 106A and the conductive layer 106B, the same material can be used. The conductive layer 106A and the conductive layer 106B can be formed in the same step. Note that the conductive layer 106A and the conductive layer 106B may be formed using different materials.

The capacitor C11 to the capacitor C13 each include an insulating layer that is sandwiched between the upper electrode and the lower electrode and functions as a dielectric. The insulating layer included in the capacitor C11, the insulating layer included in the capacitor C12, and the insulating layer included in the capacitor C13 can be formed in the same step.

The capacitance of each of the capacitor C11 to the capacitor C13 is preferably within the above-described range. The area of each of the capacitor C11 to the capacitor C13 in the top view is preferably within the above-described range. As illustrated in FIG. 9, in the case where the upper electrode of the capacitor covers the lower electrode, the area of the capacitor can be replaced with the area of the lower electrode. That is, in the top view, the area of the lower electrode of the capacitor C11 is preferably larger than or equal to 2 times, further preferably larger than or equal to 3 times, still further preferably larger than or equal to 4 times, yet still further preferably larger than or equal to 5 times the area of the lower electrode of the capacitor C13. The area of the lower electrode of the capacitor C12 is preferably larger than or equal to 2 times, further preferably larger than or equal to 3 times, still further preferably larger than or equal to 4 times, yet still further preferably larger than or equal to 5 times the area of the lower electrode of the capacitor C13.

Figure 10:
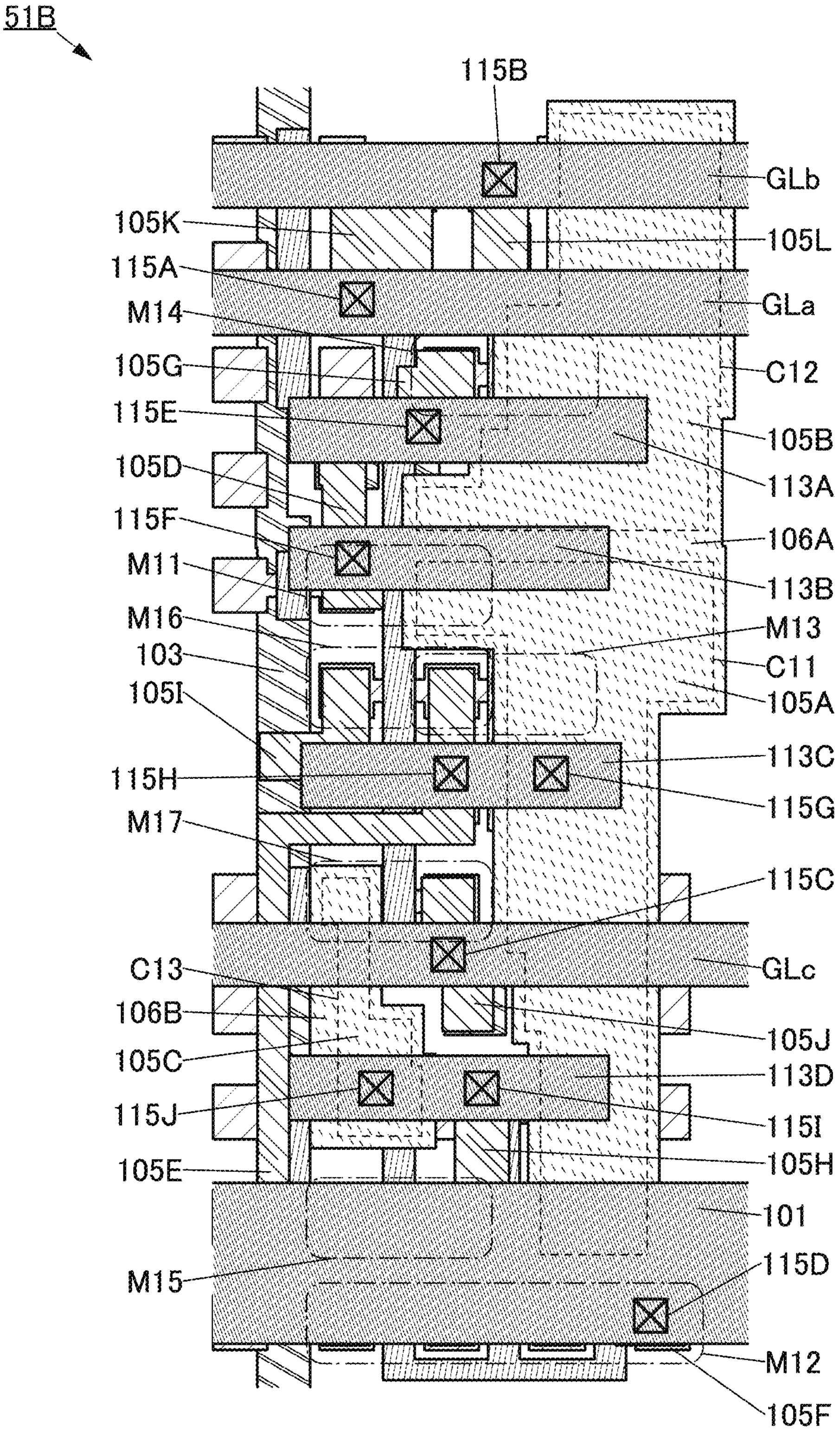
FIG. 10 is a top view illustrating the semiconductor device.

FIG. 10 is a top view illustrating the wiring GLa to the wiring GLc and the wiring 101 which are added over the transistor M11 to the transistor M17 and the capacitor C11 to the capacitor C13 illustrated in FIG. 9. Furthermore, some wirings included in the pixel circuit 51B are also illustrated.

The wiring GLa is electrically connected to the conductive layer 105K through a contact hole 115A. That is, the wiring GLa is electrically connected to the gate of the transistor M11, the gate of the transistor M16, and the gate of the transistor M17.

The wiring GLb is electrically connected to the conductive layer 105L through a contact hole 115B. That is, the wiring GLb is electrically connected to the gate of the transistor M13 and the gate of the transistor M14.

The wiring GLc is electrically connected to the conductive layer 105J through a contact hole 115C. That is, the wiring GLc is electrically connected to the other of the source and the drain of the transistor M17.

The wiring 101 is electrically connected to the conductive layer 105F through a contact hole 115D. That is, the wiring 101 is electrically connected to the other of the source and the drain of the transistor M12.

A conductive layer 113A is electrically connected to the conductive layer 105G through a contact hole 115E.

A conductive layer 113B is electrically connected to the conductive layer 105D through a contact hole 115F.

A conductive layer 113C is electrically connected to the conductive layer 106A through a contact hole 115G. The conductive layer 113C is electrically connected to the conductive layer 105E through a contact hole 115H. That is, the one terminal of the capacitor C11, the one terminal of the capacitor C12, the one of the source and the drain of the transistor M12, the one of the source and the drain of the transistor M13, the other of the source and the drain of the transistor M15, and the one of the source and the drain of the transistor M16 are electrically connected to each other through the conductive layer 113C.

A conductive layer 113D is electrically connected to the conductive layer 105H through a contact hole 115I. The conductive layer 113D is electrically connected to the conductive layer 106B through a contact hole 115J. That is, the one of the source and the drain of the transistor M15 and the one terminal of the capacitor C13 are electrically connected to each other through the conductive layer 113D.

For the wiring GLa to the wiring GLc, the wiring 101, and the conductive layer 113A to the conductive layer 113D, the same material can be used. The wiring GLa to the wiring GLc, the wiring 101, and the conductive layer 113A to the conductive layer 113D can be formed in the same step. Note that different materials may be used for the wiring GLa to the wiring GLc, the wiring 101, and the conductive layer 113A to the conductive layer 113D.

Figure 11:
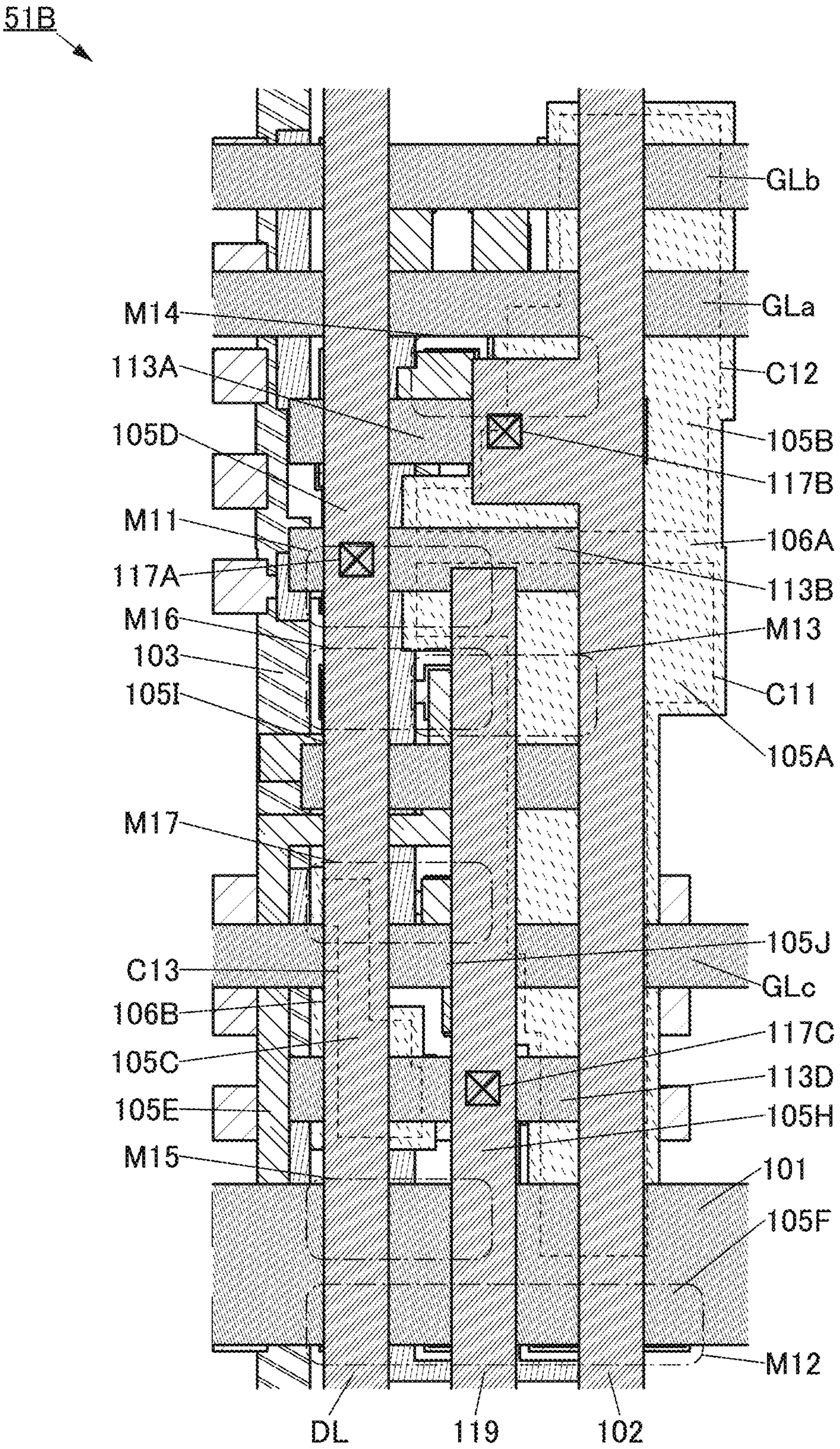
FIG. 11 is a top view illustrating the semiconductor device.

FIG. 11 is a top view illustrating the wiring DL and the wiring 102 which are added over the wiring GLa to the wiring GLc, the wiring 101, and the conductive layer 113A to the conductive layer 113D illustrated in FIG. 10. Furthermore, some wirings included in the pixel circuit 51B are also illustrated.

The wiring DL is electrically connected to the conductive layer 113B through a contact hole 117A. That is, the wiring DL is electrically connected to the other of the source and the drain of the transistor M11.

The wiring 102 is electrically connected to the conductive layer 113A through a contact hole 117B. That is, the wiring 102 is electrically connected to the other of the source and the drain of the transistor M14.

A wiring 119 is electrically connected to the conductive layer 113D through a contact hole 117C.

In the top view, the proportion of the total area of the layers provided on the same plane to the area of the region where the pixel circuit 51B is provided is preferably greater than or equal to 10%, further preferably greater than or equal to 12%, still further preferably greater than or equal to 15%, yet further preferably greater than or equal to 17%, further preferably greater than or equal to 20%, still further preferably greater than or equal to 25%, yet further preferably greater than or equal to 30%, further preferably greater than or equal to 40%. Note that the proportion of the total area in all the layers is not necessarily within the above-described range.

The proportion of the total area of the layers provided on the same plane is specifically described.

Figure 12A:
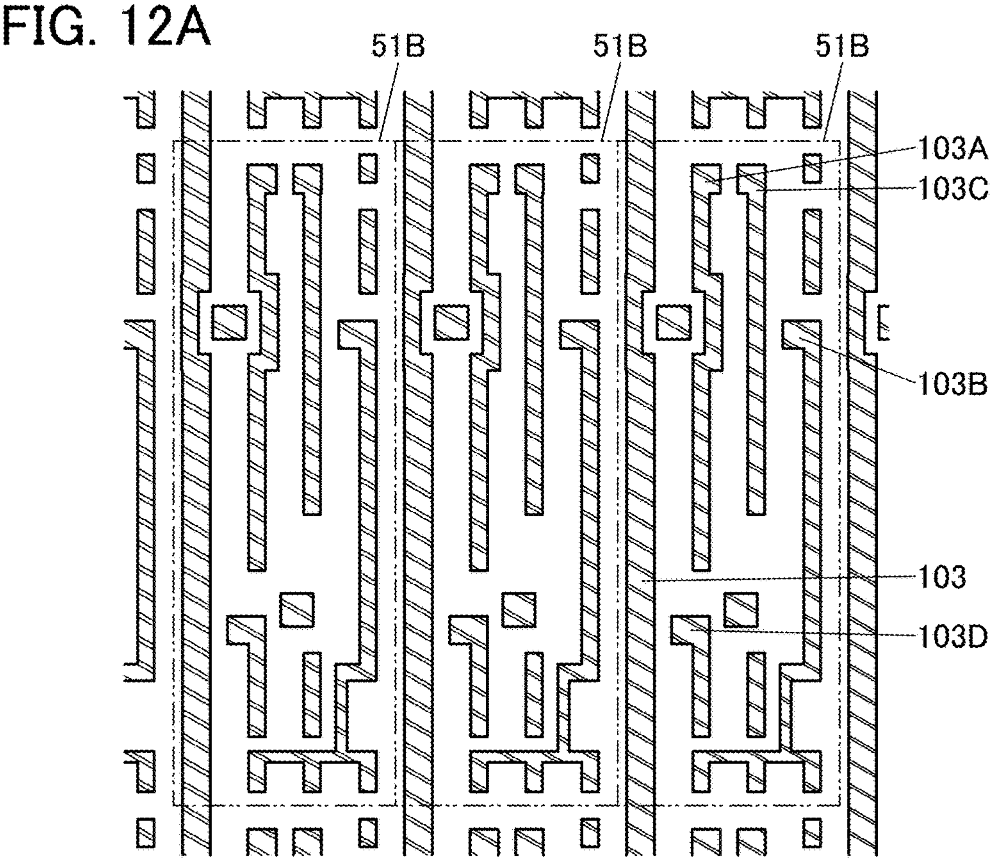
FIG. 12A and FIG. 12B are top views illustrating the semiconductor device.

FIG. 12A is a top view of the back gates of the transistor M11 to the transistor M17, back gates of the dummy transistors, the wiring 103, and the wiring and the dummy layers provided on the same plane as the back gates and the wiring 103. FIG. 12A illustrates three continuous pixel circuits 51B in the row direction. In the top view, the proportion of the total area of the back gates, the wiring 103, the wiring, and the dummy layers is preferably high, and particularly preferably within the above-described range. Note that in the case of the structure example illustrated in FIG. 12A, the proportion of the total area of the layers to the area of the region where the pixel circuit 51 is provided is 34%.

Figure 12B:
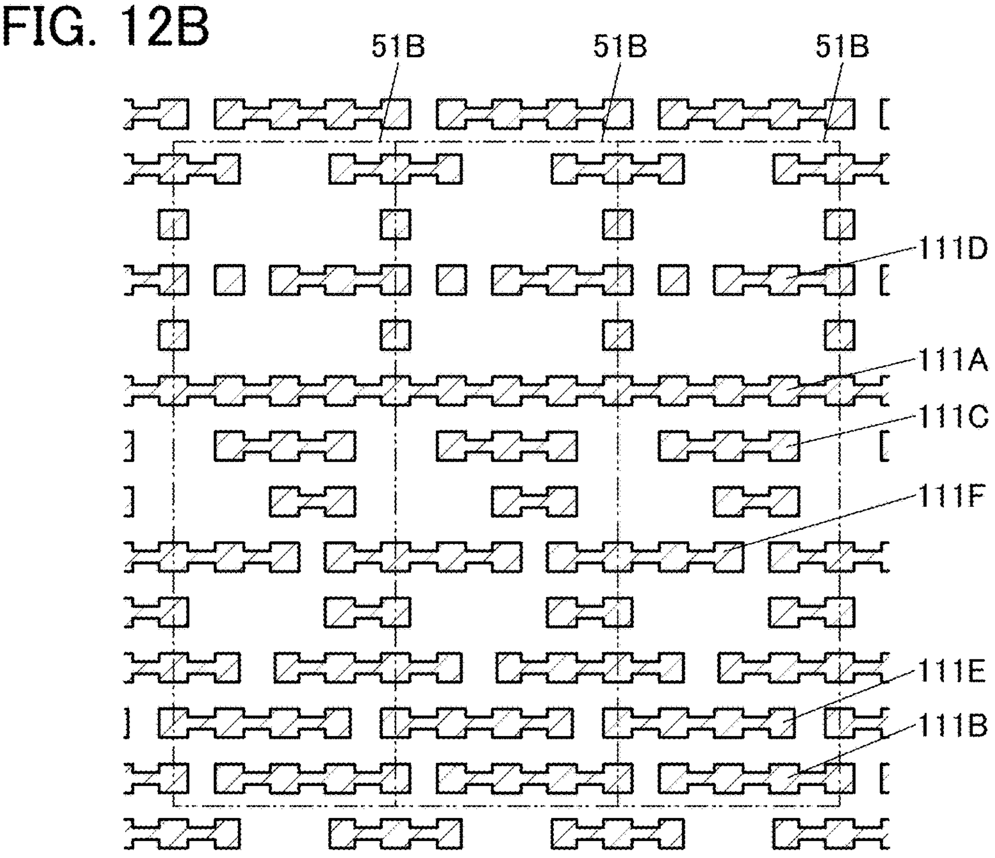

FIG. 12B is a top view of the semiconductor layers of the transistor M11 to the transistor M17, the semiconductor layers of the dummy transistors, and the semiconductor layers provided on the same plane as those semiconductor layers. In the top view, the proportion of the total area of the semiconductor layers is preferably high, and particularly preferably within the above-described range. Note that in the case of the structure example illustrated in FIG. 12B, the proportion of the total area of the layers to the area of the region where the pixel circuit 51 is provided is approximately 23%.

Figure 13A:
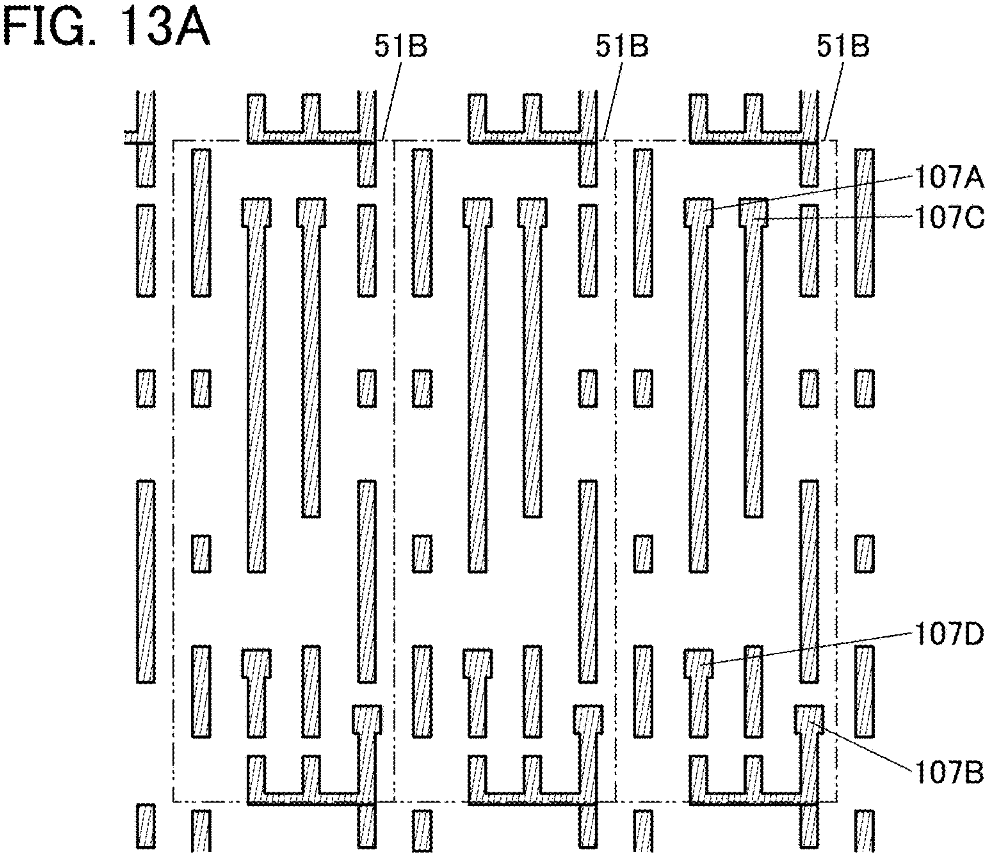
FIG. 13A and FIG. 13B are top views illustrating the semiconductor device.

FIG. 13A is a top view of the gates of the transistor M11 to the transistor M17, gates of the dummy transistors, and the wiring and dummy layers provided on the same plane as the gates. In the top view, the proportion of the total area of the gates, the wiring, and the dummy layers is preferably high, and particularly preferably within the above-described range. Note that in the case of the structure example illustrated in FIG. 13A, the proportion of the total area of the layers to the area of the region where the pixel circuit 51 is provided is approximately 21%.

Figure 13B:
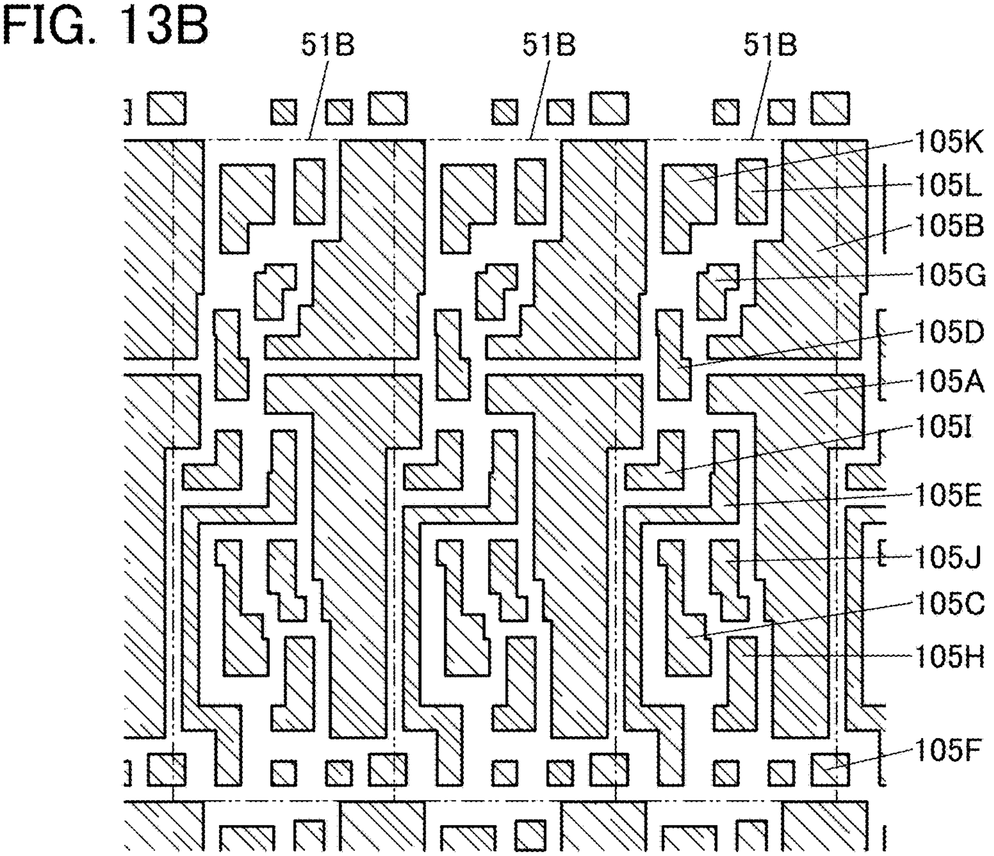

FIG. 13B is a top view of the lower electrodes of the capacitor C11 to the capacitor C13 and the wiring provided on the same plane as the lower electrodes. In the top view, the proportion of the total area of the lower electrodes and the wiring is preferably high, and particularly preferably within the above-described range. Note that in the case of the structure example illustrated in FIG. 13B, the proportion of the total area of the layers to the area of the region where the pixel circuit 51 is provided is approximately 58%.

Figure 14A:
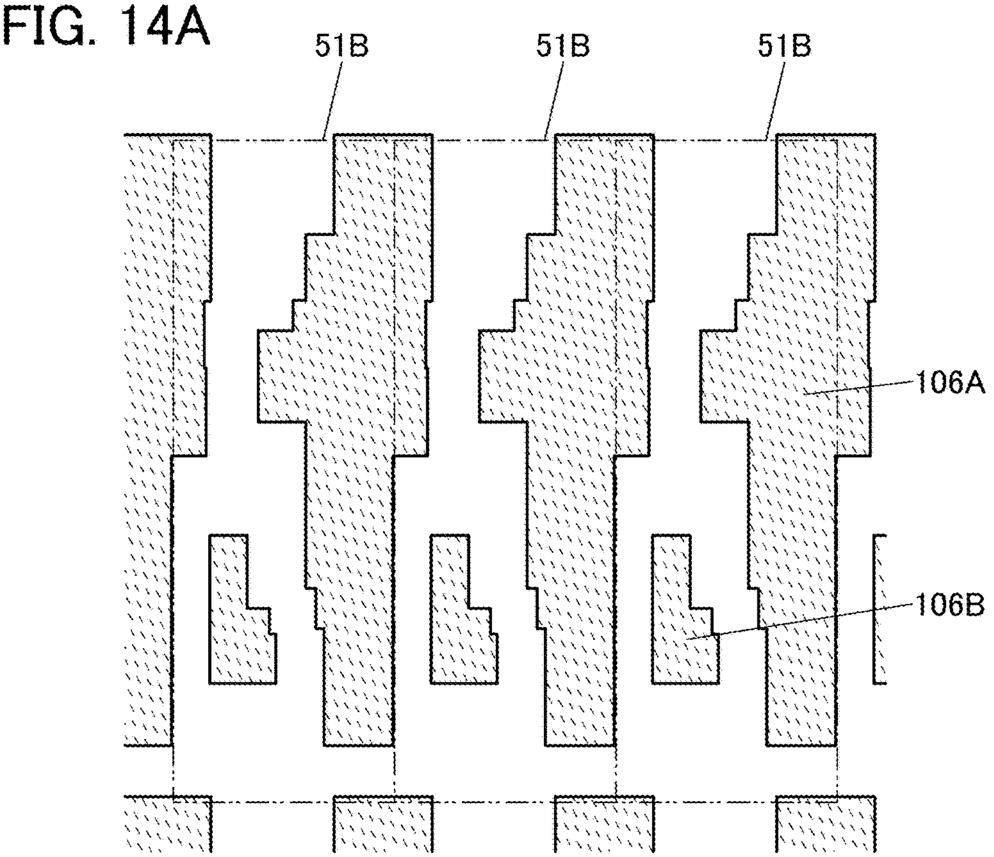
FIG. 14A and FIG. 14B are top views illustrating the semiconductor device.

FIG. 14A is a top view of the upper electrodes of the capacitor C11 to the capacitor C13. In the top view, the proportion of the total area of the upper electrodes is preferably high, and particularly preferably within the above-described range. Note that in the case of the structure example illustrated in FIG. 14A, the proportion of the total area of the layers to the area of the region where the pixel circuit 51 is provided is approximately 49%.

Figure 14B:
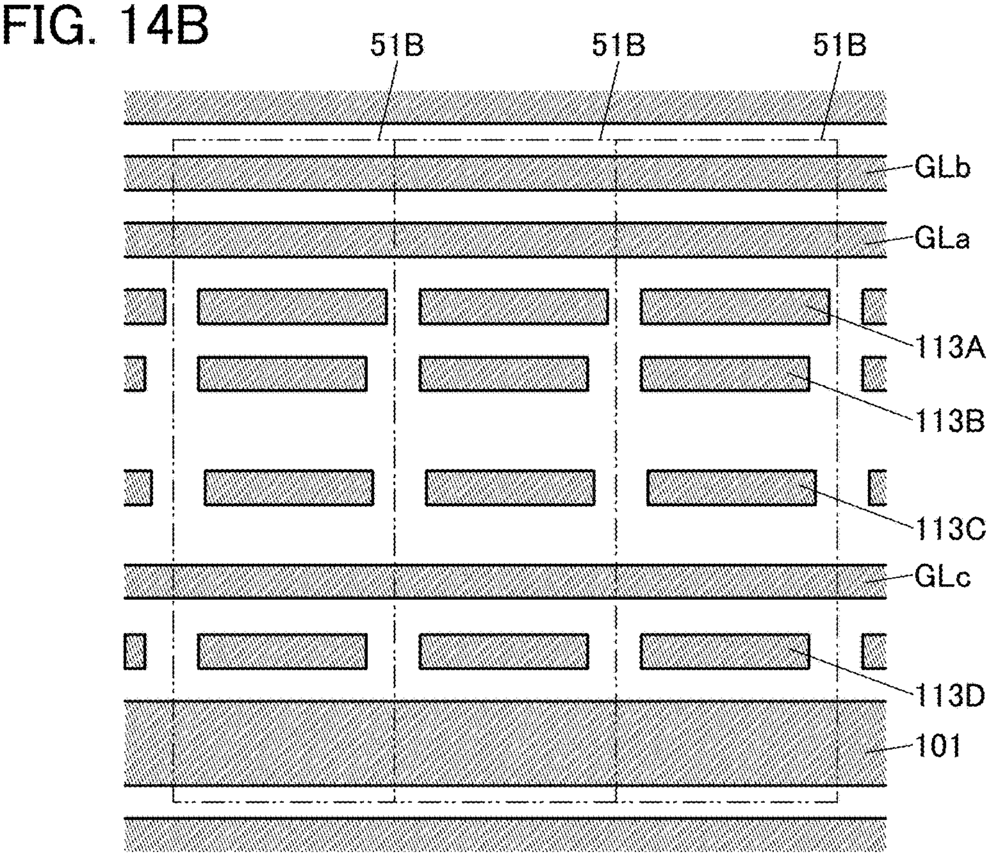

FIG. 14B is a top view of the wiring GLa to the wiring GLc, the wiring 101, and the wiring provided on the same plane as those wirings. In the top view, the proportion of the total area of the wirings is preferably high, and particularly preferably within the above-described range. Note that in the case of the structure example illustrated in FIG. 14B, the proportion of the total area of the layers to the area of the region where the pixel circuit 51 is provided is approximately 44%.

Figure 15A:
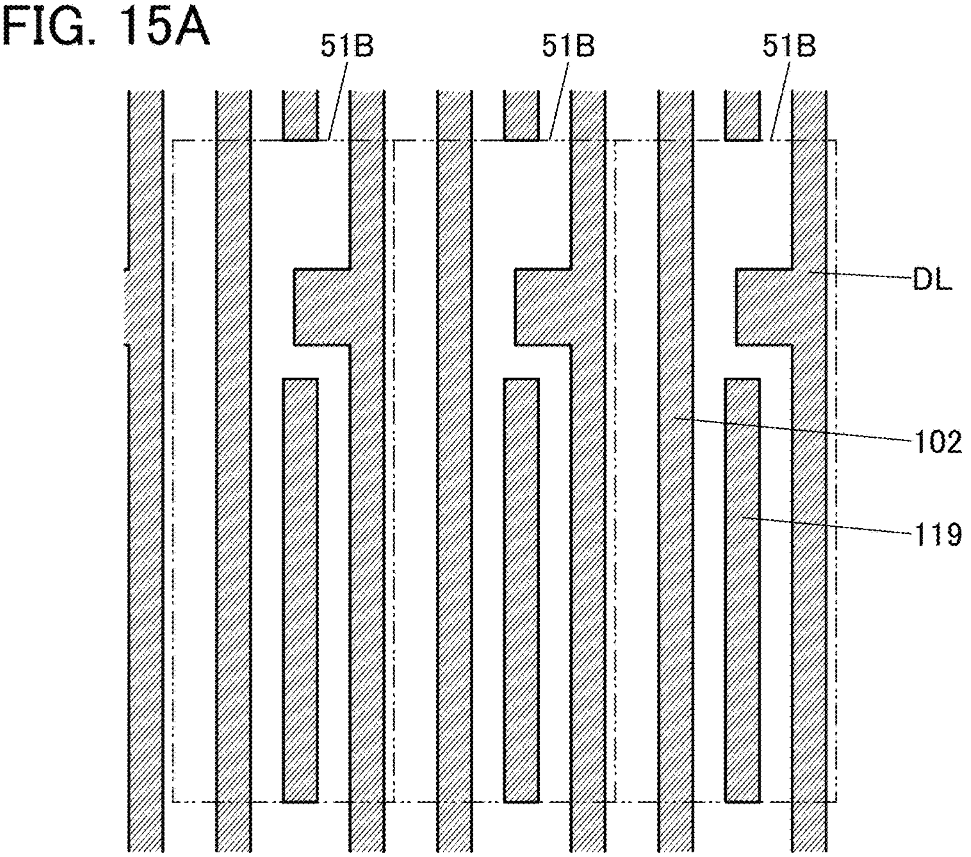
FIG. 15A and FIG. 15B are top views illustrating the semiconductor device.

FIG. 15A is a top view of the wiring DL, the wiring 102, and the wiring provided on the same plane as those wirings. In the top view, the proportion of the total area of the wirings is preferably high, and particularly preferably within the above-described range. Note that in the case of the structure example illustrated in FIG. 15A, the proportion of the total area of the layers to the area of the region where the pixel circuit 51 is provided is approximately 43%.

Figure 15B:
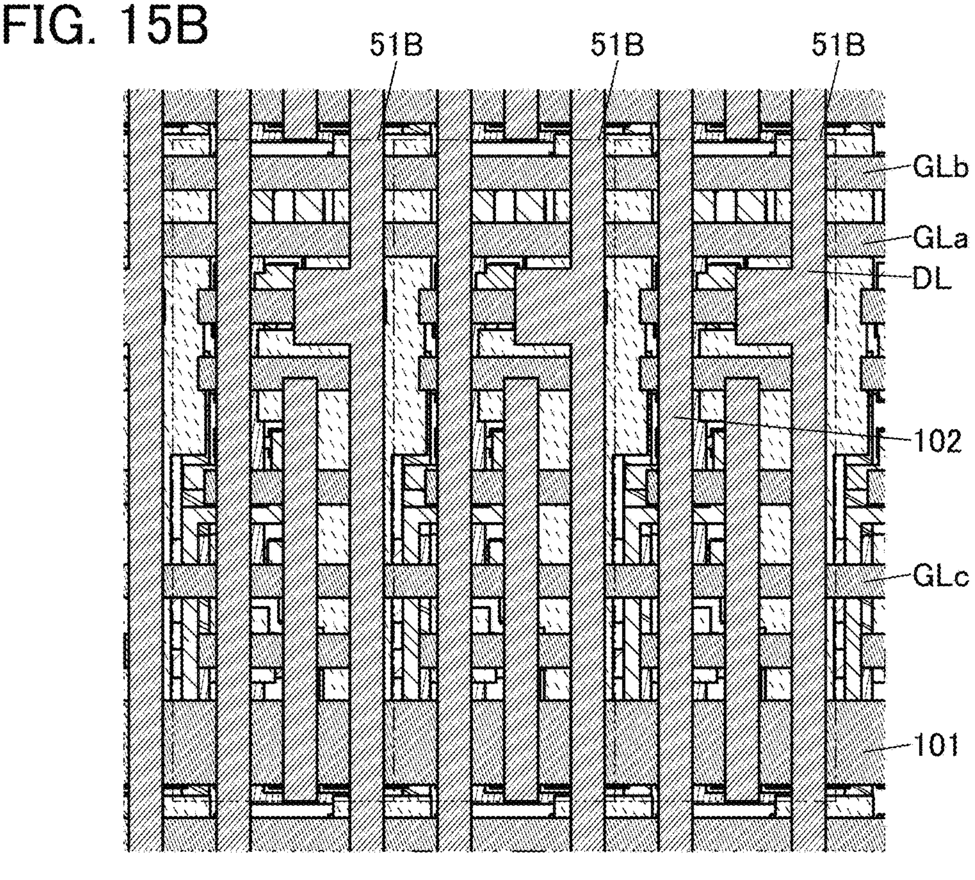

FIG. 15B is a top view in which the layers illustrated in FIG. 12A to FIG. 15A are superposed on each other. Although FIG. 15B illustrates the three pixel circuits 51B connected in the row direction, pixel circuits arranged in a matrix are provided in the display region 235 as illustrated in FIG. 1A and the like.

<Pixel Arrangement Example>

Pixel arrangement will be described.

Full-color display can be achieved by making the pixel 230 having a function of emitting red light, the pixel 230 having a function of emitting green light, and the pixel 230 having a function of emitting blue light collectively function as one pixel and by controlling the amount of light (emission luminance) emitted from each pixel 230. Thus, the three pixels 230 each function as a subpixel. Each subpixel includes the light-emitting device 61 and the pixel circuit 51 that controls light emission of the light-emitting device 61.

The arrangement of the subpixels is not particularly limited, and various pixel arrangements can be used. Examples of the arrangement of the light-emitting devices 61 include stripe arrangement, S-stripe arrangement, matrix arrangement, delta arrangement, Bayer arrangement, and pentile arrangement.

FIG. 16A to FIG. 16G illustrate examples of subpixel arrangement. The top surface shapes of the subpixels illustrated in FIG. 16A to FIG. 16G correspond to those of the light-emitting regions of the light-emitting devices. Note that the top surface shape of the region where the pixel circuit 51 is provided and the top surface shape of the light-emitting region of the light-emitting device 61 that is controlled by the pixel circuit 51 are not necessarily the same.

Figure 16A:
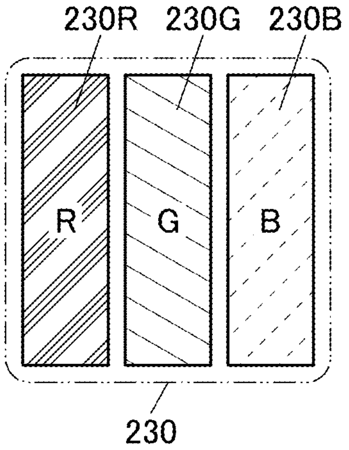
FIG. 16A to FIG. 16G are top views illustrating structure examples of a pixel.
Figure 16B:
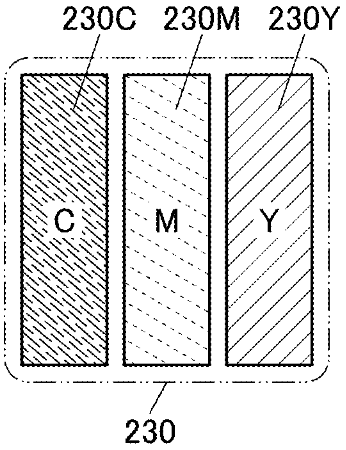

FIG. 16A illustrates an example of stripe arrangement. The pixel 230 illustrated in FIG. 16A includes a subpixel 230R having a function of emitting red light, a subpixel 230G having a function of emitting green light, and a subpixel 230B having a function of emitting blue light in the row direction.

Although FIG. 16A illustrates an example in which the subpixels each have a rectangular top surface shape, one embodiment of the present invention is not limited thereto. Examples of the top surface shape of the subpixels include polygons such as a triangle, a tetragon (including a rectangle and a square), and a pentagon; polygons with rounded corners; an ellipse; and a circle.

The colors of light emitted by the three subpixels are not limited to a combination of red (R), green (G), and blue (B) and may be cyan (C), magenta (M), and yellow (Y). The pixel 230 illustrated in FIG. 16B includes a subpixel 230C having a function of emitting cyan light, a subpixel 230M having a function of emitting magenta light, and a subpixel 230Y having a function of emitting yellow light in the row direction.

Figure 16C:
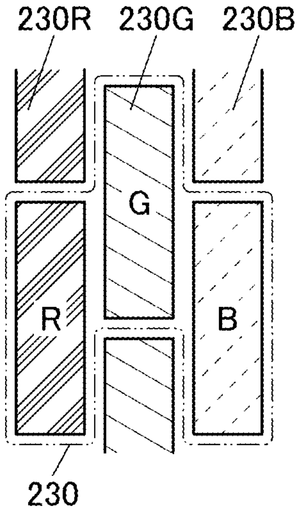

FIG. 16C illustrates an example of delta arrangement. As illustrated in FIG. 16C, the subpixels may be arranged so that a line connecting the center points of the subpixels can form a triangle.

The areas of the subpixels may be different from each other. In the case where luminous efficiency, reliability, or the like varies depending on the emission color, the subpixel area may be changed depending on the emission color.

Figure 16D:
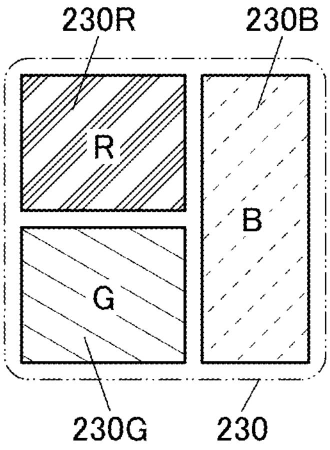

FIG. 16D illustrates an example of S-stripe arrangement. The pixel 230 illustrated in FIG. 16D is composed of two rows and two columns, and includes two subpixels (the subpixel 230R and the subpixel 230G) in the left column (first column) and one subpixel (the subpixel 230B) in the right column (second column). In other words, the pixel 230 includes two subpixels (the subpixel 230R and the subpixel 230B) in the upper row (first row) and two subpixels (the subpixel 230G and the subpixel 230B) in the lower row (second row); the subpixel 230B is included over the two rows.

Figure 16E:
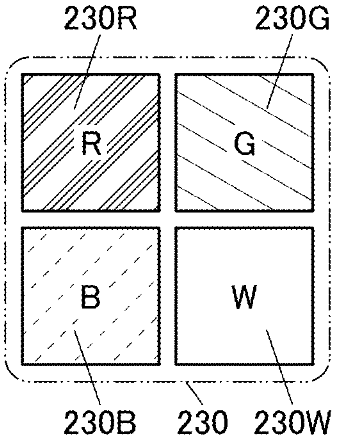
Figure 16F:
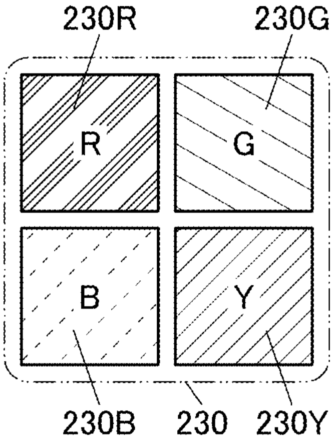
Figure 16G:
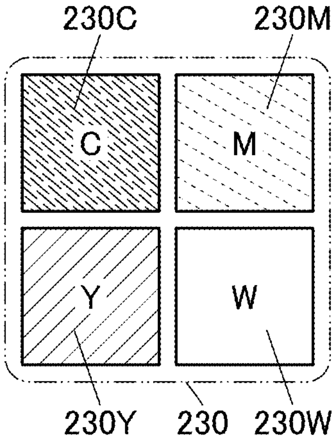

Four subpixels may collectively function as one pixel 230. For example, as illustrated in FIG. 16E, the pixel 230 may include four subpixels which are the subpixel 230R, the subpixel 230G, the subpixel 230B, and a subpixel 230W including the light-emitting device 61 emitting white light. When the subpixel 230W is provided in addition to the subpixel 230R and the subpixel 230G, the luminance of the display region can be increased in the pixel 230. As illustrated in FIG. 16F, the subpixel 230Y may be provided in addition to the subpixel 230R, the subpixel 230G, and the subpixel 230B. As illustrated in FIG. 16G, the subpixel 230W may be provided in addition to the subpixel 230C, the subpixel 230M, and the subpixel 230Y.

When the number of subpixels functioning as one pixel is increased and a subpixel that controls light of red, green, blue, cyan, magenta, yellow, or the like is used appropriately in combination, the reproducibility of halftones can be increased. Thus, display quality can be improved.

The display apparatus of one embodiment of the present invention can reproduce the color gamut of various standards. For example, the display apparatus of one embodiment of the present invention can reproduce the color gamut of the PAL (Phase Alternating Line) standard and the NTSC (National Television System Committee) standard used for TV broadcasting; the sRGB (standard RGB) standard and the Adobe RGB standard widely used for display apparatuses used in electronic devices such as personal computers, digital cameras, and printers; the ITU-R BT.709 (International Telecommunication Union Radiocommunication Sector Broadcasting Service (Television) 709) standard used for HDTV (High Definition Television, also referred to as Hi-Vision); the DCI-P3 (Digital Cinema Initiatives P3) standard used for digital cinema projection; the ITU-R BT.2020 (REC.2020 (Recommendation 2020)) standard used for UHDTV (Ultra High Definition Television, also referred to as Super Hi-Vision); and the like.

Using the pixels 230 arranged in a matrix of 1920×1080, the display apparatus 10 that can perform full-color display with a definition of what is called full high definition (also referred to as "2K definition", "2K1K", "2K", or the like) can be obtained. For example, using the pixels 230 arranged in a matrix of 3840×2160, the display apparatus 10 that can perform full-color display with a definition of what is called ultra-high definition (also referred to as "4K definition", "4K2K", "4K", or the like) can be obtained. For example, using the pixels 230 arranged in a matrix of 7680×4320, the display apparatus 10 that can perform full-color display with a definition of what is called super high definition (also referred to as "8K definition", "8K4K", "8K", or the like) can be obtained. By increasing the number of pixels 230, the display apparatus 10 that can perform full-color display with 16K or 32K definition can also be obtained.

The pixel density of the display region 235 is preferably higher than or equal to 100 ppi and lower than or equal to 10000 ppi, and further preferably higher than or equal to 1000 ppi and lower than or equal to 10000 ppi. For example, the pixel density may be higher than or equal to 2000 ppi and lower than or equal to 6000 ppi, or higher than or equal to 3000 ppi and lower than or equal to 5000 ppi.

Note that there is no particular limitation on the aspect ratio of the display region 235. For example, the display region 235 of the display apparatus 10 can have a variety of aspect ratios such as 1:1 (square), 4:3, 16:9, and 16:10.

The diagonal size of the display region 235 may be greater than or equal to 0.1 inches and less than or equal to 100 inches and may be greater than or equal to 100 inches.

In the case where the display apparatus 10 is used as a display apparatus for virtual reality (VR) or augmented reality (AR), the diagonal size of the display region 235 can be greater than or equal to 0.1 inches and less than or equal to 5.0 inches, preferably greater than or equal to 0.5 inches and less than or equal to 2.0 inches, further preferably greater than or equal to 1 inch and less than or equal to 1.7 inches. For example, the diagonal size of the display region 235 may be 1.5 inches or in the vicinity of 1.5 inches. When the diagonal size of the display region 235 is less than or equal to 2.0 inches, preferably in the vicinity of 1.5 inches, the number of times of light exposure treatment using a light exposure apparatus (typified by a scanner apparatus) can be one; thus, the productivity of a manufacturing process can be improved.

The structure of transistors used in the display region 235 may be selected as appropriate depending on the diagonal size of the display region 235. In the case where single crystal Si transistors are used in the display region 235, for example, the diagonal size of the display region 235 is preferably greater than or equal to 0.1 inches and less than or equal to 3 inches. In the case where LTPS transistors are used in the display region 235, the diagonal size of the display region 235 is preferably greater than or equal to 0.1 inches and less than or equal to 30 inches, further preferably greater than or equal to 1 inch and less than or equal to 30 inches. In the case where LTPO (a structure in which an LTPS transistor and an OS transistor are combined) is employed in the display region 235, the diagonal size of the display region 235 is preferably greater than or equal to 0.1 inches and less than or equal to 50 inches, further preferably greater than or equal to 1 inch and less than or equal to 50 inches. In the case where OS transistors are used in the display region 235, the diagonal size of the display region 235 is preferably greater than or equal to 0.1 inches and less than or equal to 200 inches, further preferably greater than or equal to 50 inches and less than or equal to 100 inches.

In the case of a single-crystal Si transistor, it is significantly difficult to increase the size of the display region 235 to be larger than the size of the single crystal Si substrate. Furthermore, LTPS transistors are unlikely to respond to a size increase (typically to a screen diagonal greater than 30 inches) since a laser crystallization apparatus is used in the manufacturing process. By contrast, since the manufacturing process does not necessarily require a laser crystallization apparatus or the like or can be performed at a relatively low process temperature (typically, lower than or equal to 450° C.), OS transistors can be used for a display panel with a relatively large area (typically, a screen diagonal greater than or equal to 50 inches and less than or equal to 100 inches). In addition, LTPO is applicable to a display panel with a size midway between the case of using LTPS transistors and the case of using OS transistors (typically, a diagonal size greater than or equal to 1 inch and less than or equal to 50 inches).

Figure 17A:
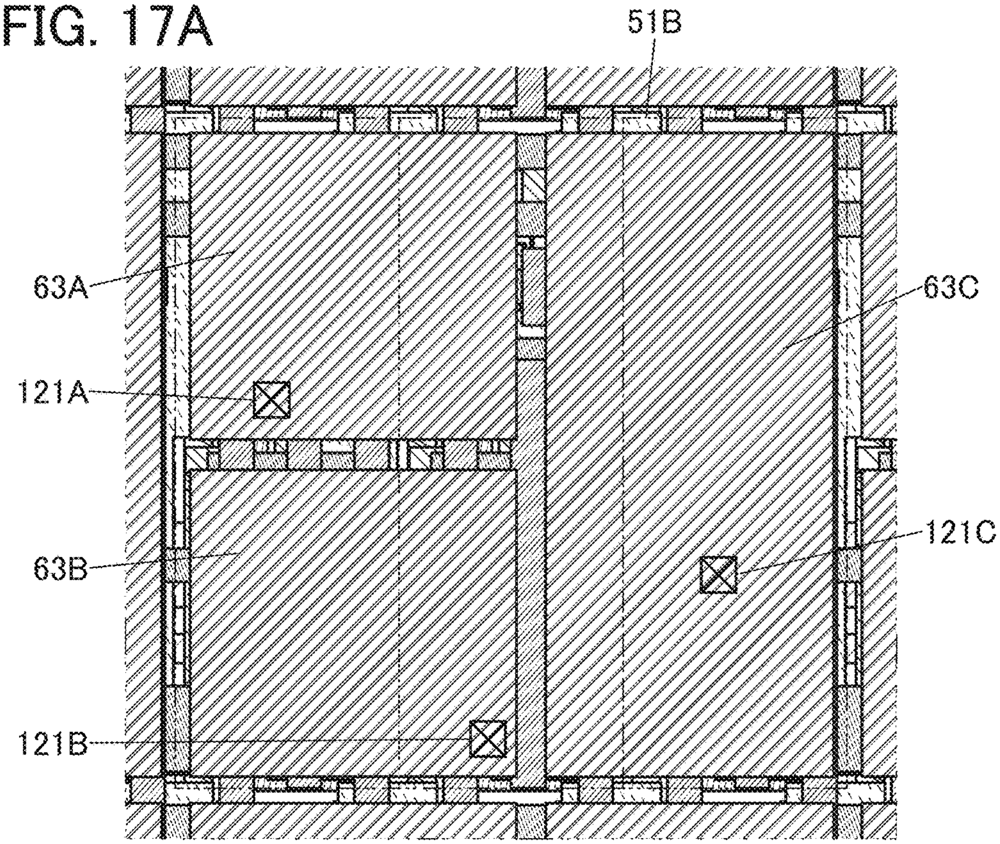
FIG. 17A and FIG. 17B are top views illustrating the semiconductor device.

FIG. 17A is a top view illustrating a conductive layer functioning as the pixel electrode of the light-emitting device 61, which is added over the pixel circuit 51B illustrated in FIG. 15B. Note that as illustrated in FIG. 17A, the top surface shapes of a conductive layer 63A, a conductive layer 63B, and a conductive layer 63C functioning as the pixel electrodes and the top surface shape of the region including the pixel circuit 51B are not necessarily the same.

The conductive layer 63A is electrically connected to the wiring 119 illustrated in FIG. 11 through a contact hole 121A. That is, the conductive layer 63A functioning as the pixel electrode of the light-emitting device 61 is electrically connected to the one of the source and the drain of the transistor M15 and the one terminal of the capacitor C13. Similarly, the conductive layer 63B is electrically connected to the one of the source and the drain of the transistor M15 and the one terminal of the capacitor C13 through a contact hole 121B. The conductive layer 63C is electrically connected to the one of the source and the drain of the transistor M15 and the one terminal of the capacitor C13 through a contact hole 121C.

Figure 17B:
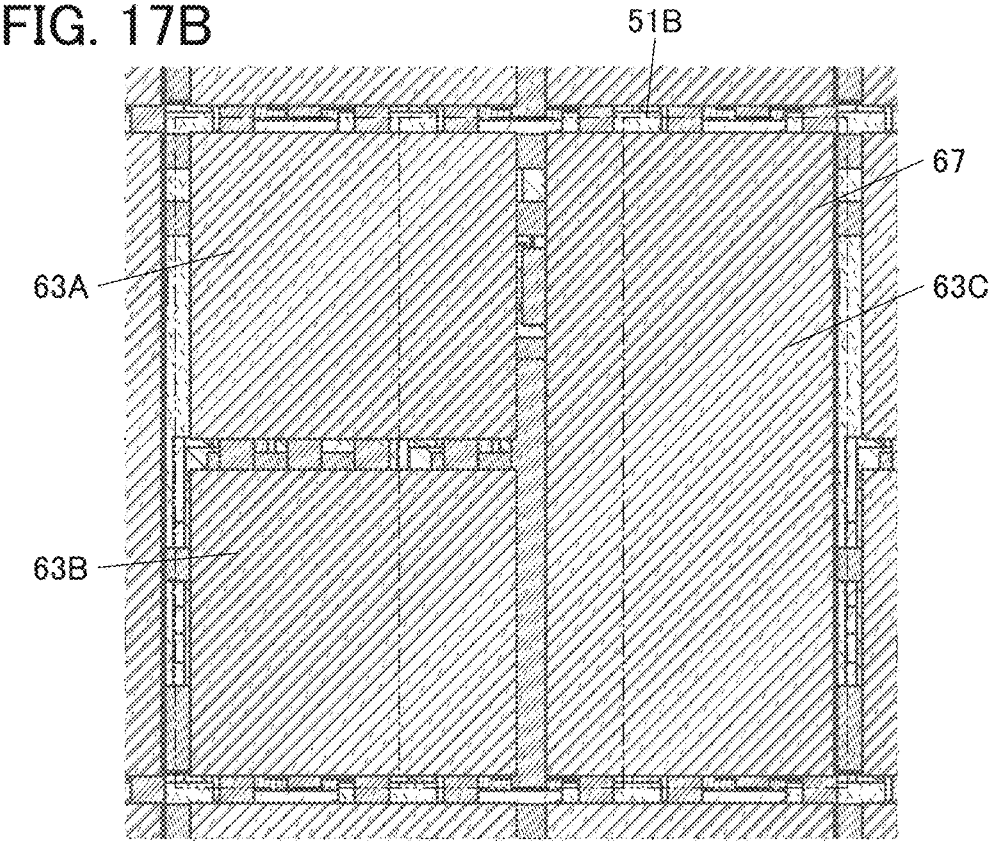

FIG. 17B is a top view illustrating the conductive layer 67 functioning as the common electrode of the light-emitting device 61, which is added over the pixel electrode illustrated in FIG. 15B. Note that in FIG. 17B, hatching of the conductive layer 67 is illustrated transparently so that components under the conductive layer 67 are clearly shown.

Figure 18A:
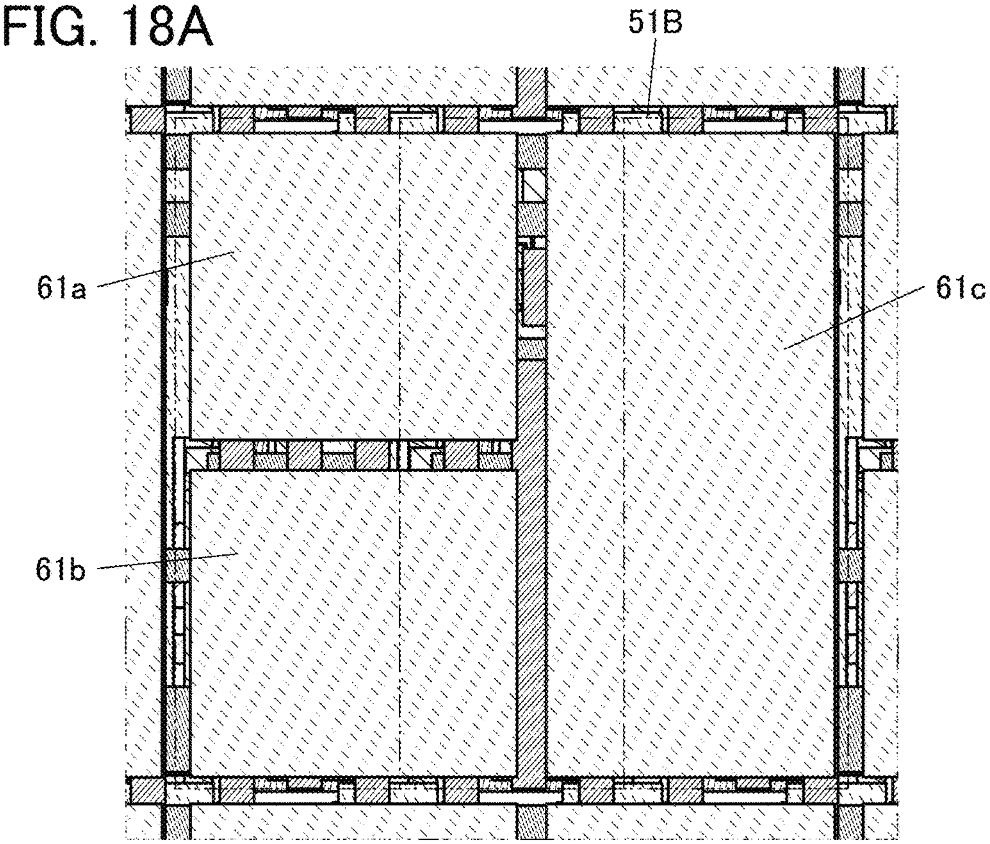
FIG. 18A and FIG. 18B are top views illustrating the semiconductor device.

An EL layer (not illustrated) is provided between each of the conductive layer 63A, the conductive layer 63B, and the conductive layer 63C functioning as the pixel electrodes and the conductive layer 67 functioning as the common electrode, whereby the light-emitting device 61 can be formed over the pixel circuit 51B. FIG. 18A illustrates a structure in which a light-emitting device 61*a*, a light-emitting device 61*b*, and a light-emitting device 61*c* are provided over the pixel circuit 51B.

Figure 18B:
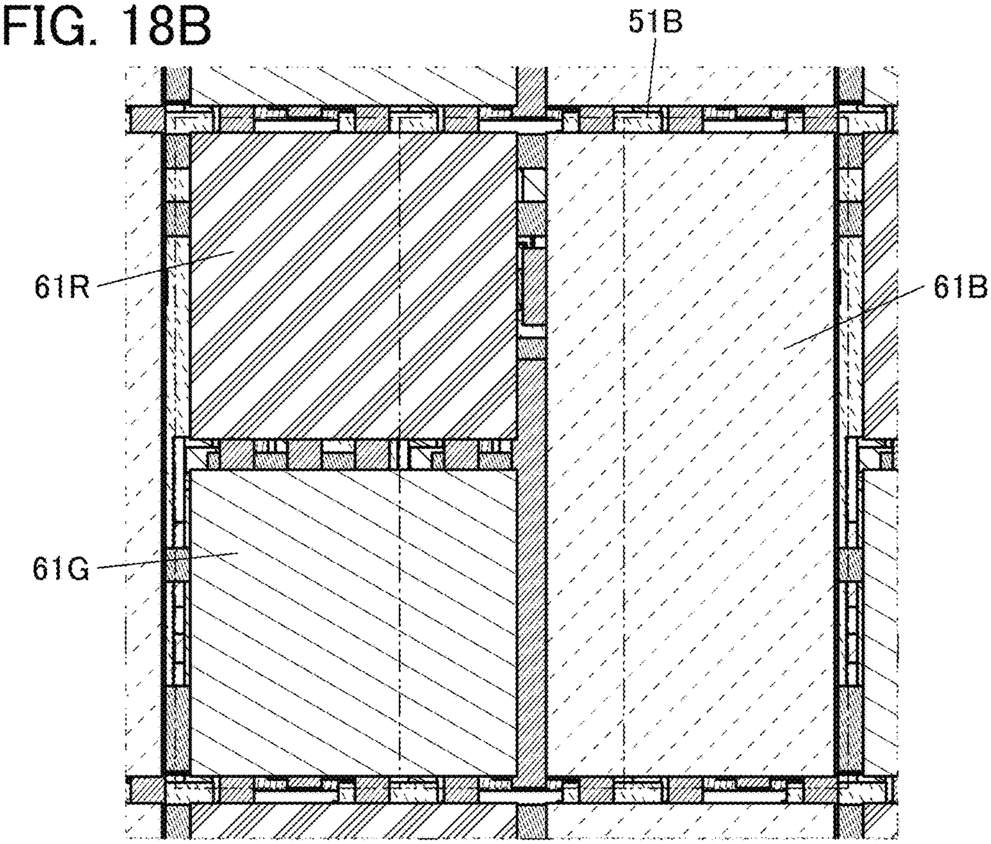

For example, when an EL layer that emits red light is provided between the conductive layer 63A and the conductive layer 67, a light-emitting device 61R can be formed. When an EL layer that emits green light is provided between the conductive layer 63B and the conductive layer 67, a light-emitting device 61G can be formed. An EL layer that emits blue light is provided between the conductive layer 63C and the conductive layer 67, whereby a light-emitting device 61B can be formed. FIG. 18B illustrates the light-emitting device 61R having a function of emitting red light, the light-emitting device 61G having a function of emitting green light, and the light-emitting device 61B having a function of emitting blue light, which are provided over the pixel circuit 51B. Note that the arrangement of the light-emitting devices 61 illustrated in FIG. 18B corresponds to S-stripe arrangement illustrated in FIG. 16D.

Operation Example

Figure 19:
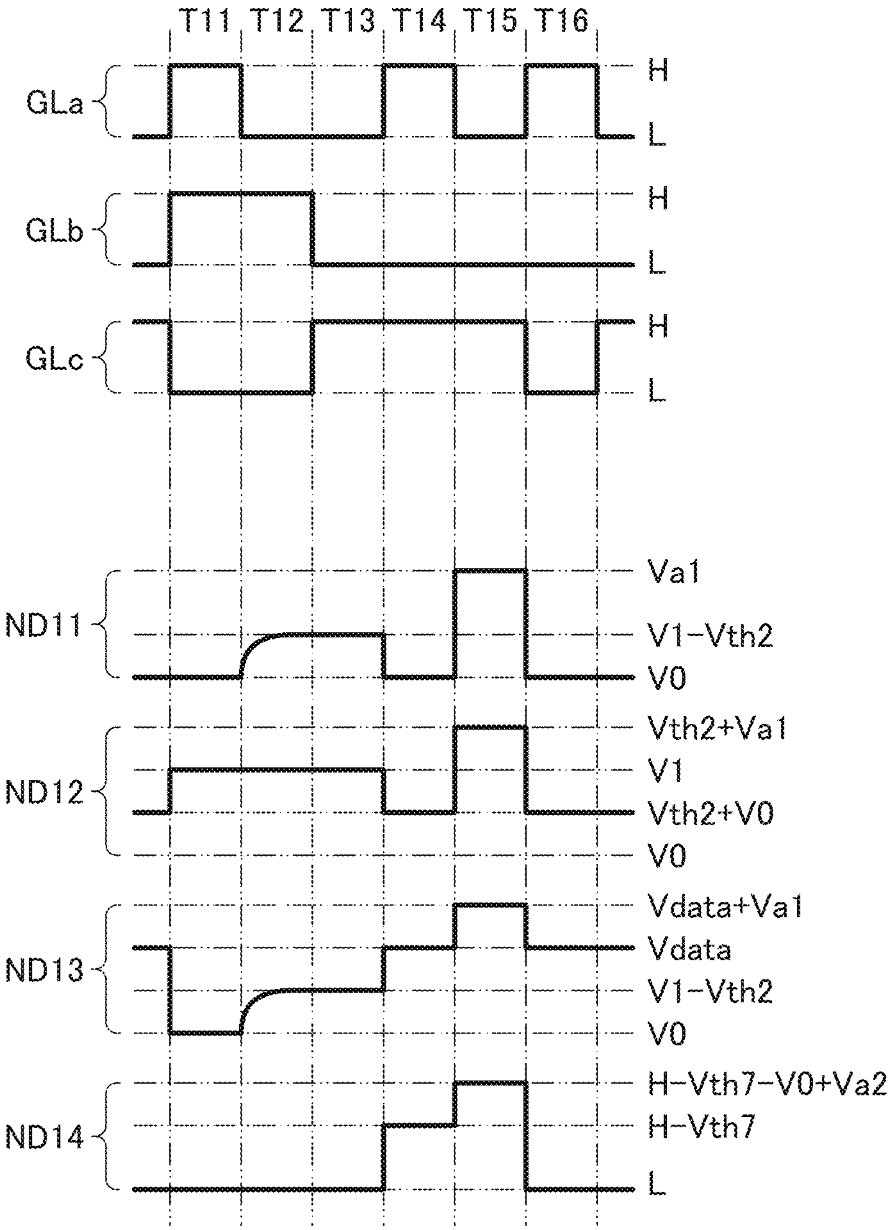
FIG. 19 is a timing chart showing an operation of a semiconductor device.

Next, an operation example of the semiconductor device 100B is described. FIG. 19 is a timing chart showing the operation example of the semiconductor device 100A. FIG. 20 to FIG. 25 are circuit diagrams illustrating the operation example of the semiconductor device 100A.

[Vth Correction Operation]

Figure 20:
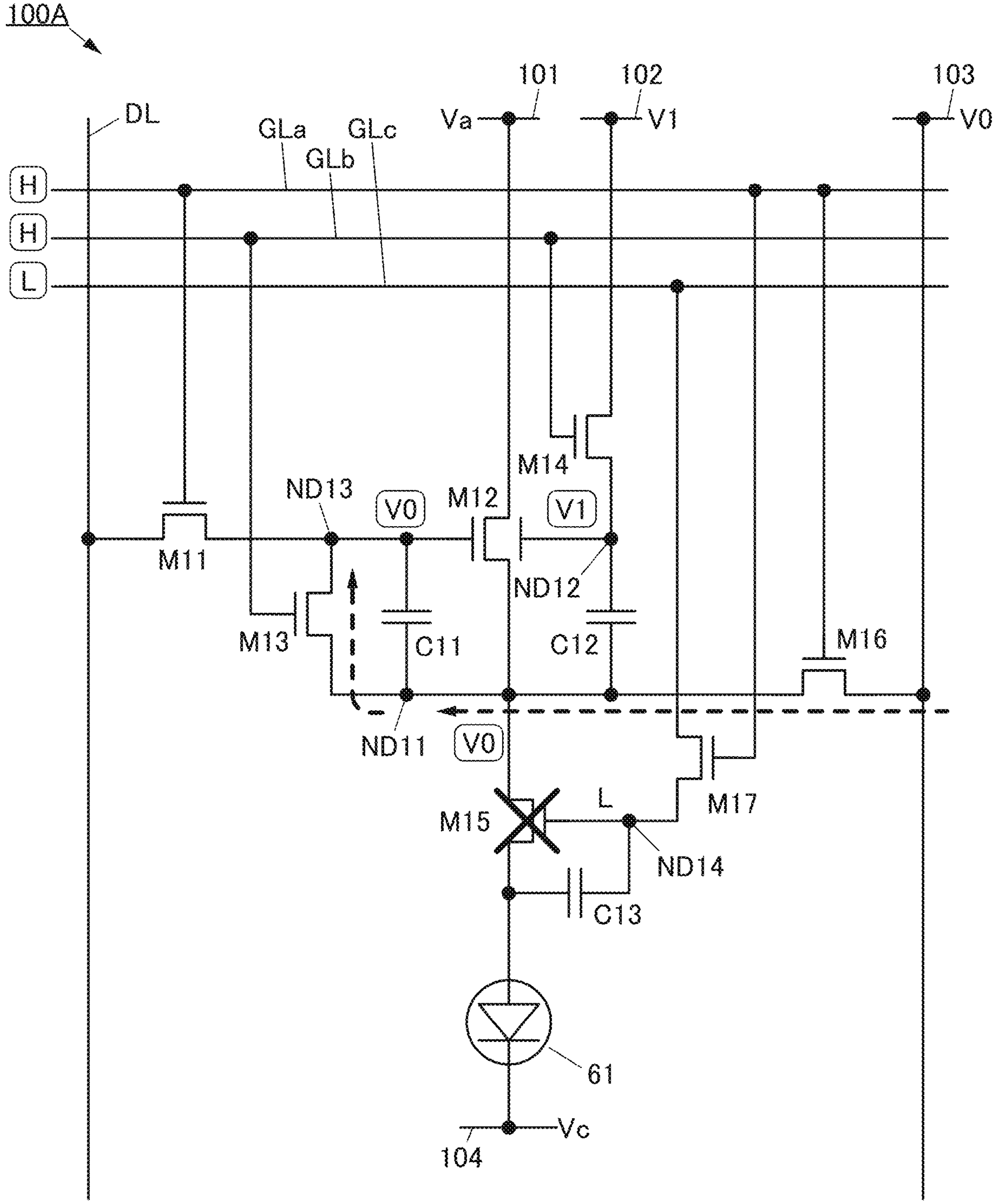
FIG. 20 is a diagram illustrating an operation of the semiconductor device.

First, a reset operation is performed in a period T11. Specifically, a potential H is supplied to the wiring GLa and the wiring GLb, and a potential L is supplied to the wiring GLc. As illustrated in FIG. 20, the transistor M11, the transistor M13, the transistor M14, the transistor M16, and the transistor M17 are brought into the on state.

A potential V0 is supplied to the node ND11 through the transistor M6. Furthermore, a potential V0 is supplied to the node ND3 through the transistor M16 and the transistor M13. A potential V1 is supplied to the node ND12 through the transistor M14. A potential L is supplied to the node ND14 through the transistor M17. Accordingly, the transistor M15 is brought into the off state.

In the period T11, electrical continuity is established between the wiring DL and the wiring 103 through the transistor M11, the transistor M13, and the transistor M16. Thus, in the period T11, it is preferable that the potentials of the wiring DL and the wiring 103 be equal to each other or the wiring DL be brought into a floating state.

Figure 21:
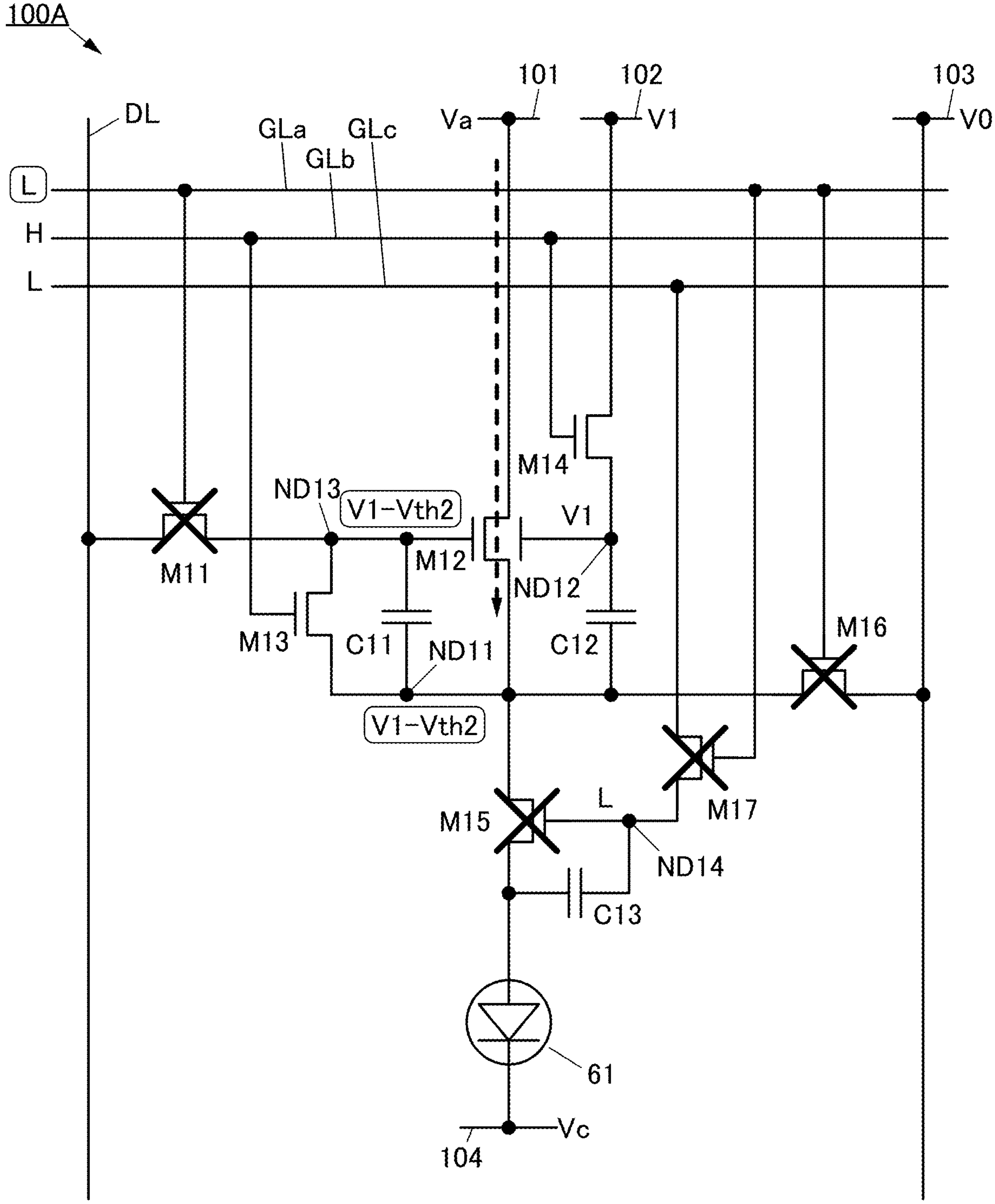
FIG. 21 is a diagram illustrating an operation of the semiconductor device.

Next, in a period T12, a potential L is supplied to the wiring GLa. As illustrated in FIG. 21, the transistor M11, the transistor M16, and the transistor M17 are brought into the off state.

The node ND14 is brought into a floating state and charge supplied to the node ND14 is retained, so that the off state of the transistor M15 is maintained. Since the potential of the node ND12 is V1, the transistor M12 is in the on state. Thus, charge is supplied from the wiring 101 to the node ND11 through the transistor M12 and the potential of the node ND11 increases. Since the transistor M13 is also in the on state, the potential of the node ND13 also increases. Specifically, the potentials of the node ND11 and the node ND13 each increase to a value obtained by subtracting Vth2 of the transistor M12 from V1.

Here, since the potential of the node ND12 is fixed at V1, the increase in the potentials of the node ND11 and the node ND13 reduces a difference in potential between the back gate of the transistor M12 and the source of the transistor M12. When the potential of the node ND11 increases to the vicinity of V1−Vth2, the current flowing from the wiring 101 to the node ND11 through the transistor M12 becomes small, and the rate of increase in the potential of the node ND11 is decreased. Thus, in the period T12, time enough for the potential of the node ND11 to increase to V1−Vth2 can be ensured. Specifically, the period T12 is preferably more than or equal to 1 μs, further preferably more than or equal to 10 μs.

Figure 22:
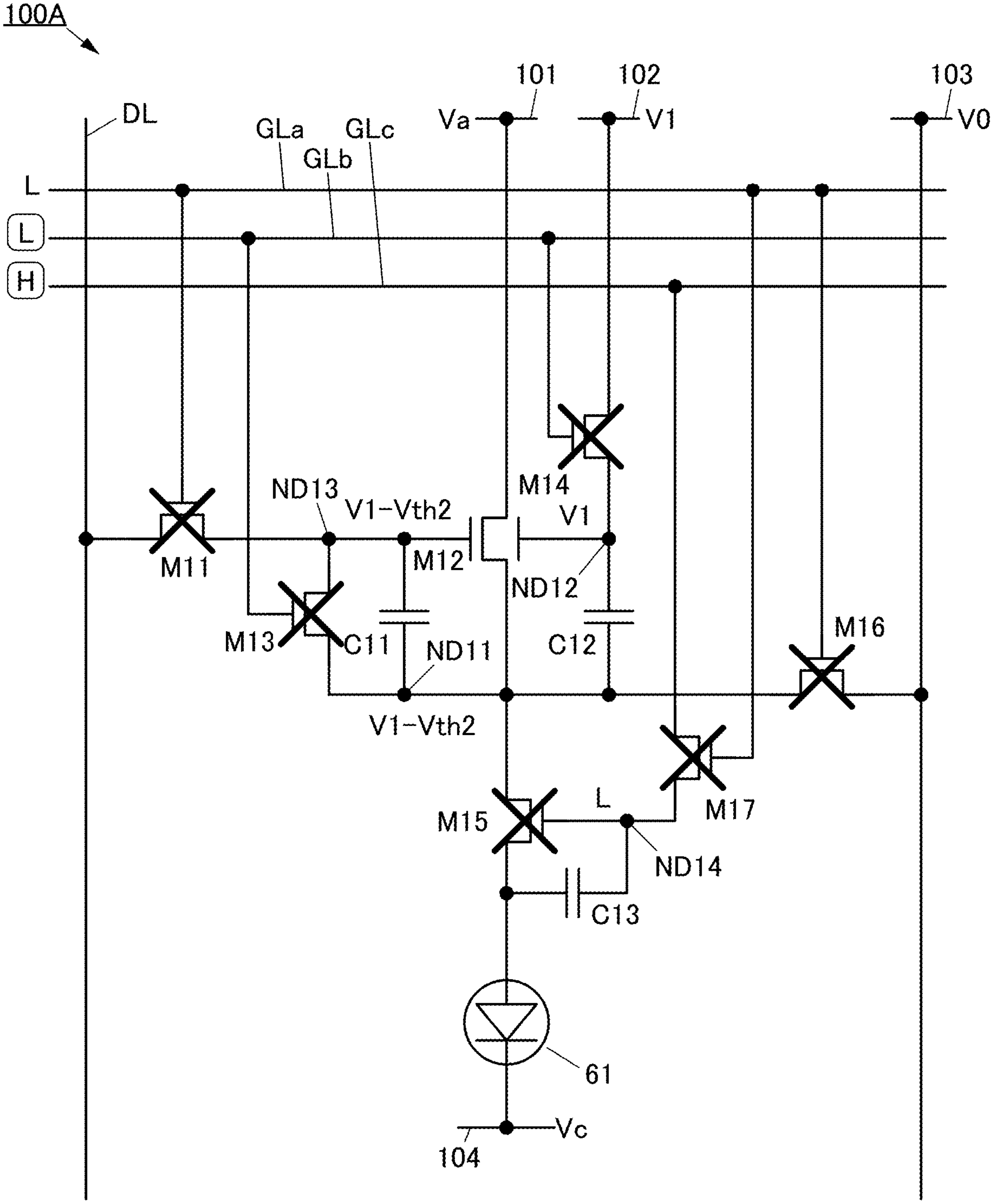
FIG. 22 is a diagram illustrating an operation of the semiconductor device.

Next, in a period T13, a potential L is supplied to the wiring GLb, and a potential H is supplied to the wiring GLc. As illustrated in FIG. 22, the transistor M13 and the transistor M14 are brought into the off state. The node ND11, the node ND12, and the node ND13 are brought into a floating state, and charge supplied to the nodes are retained. In addition, the off state of the transistor M15 is maintained.

[Data Writing Operation]

Figure 23:
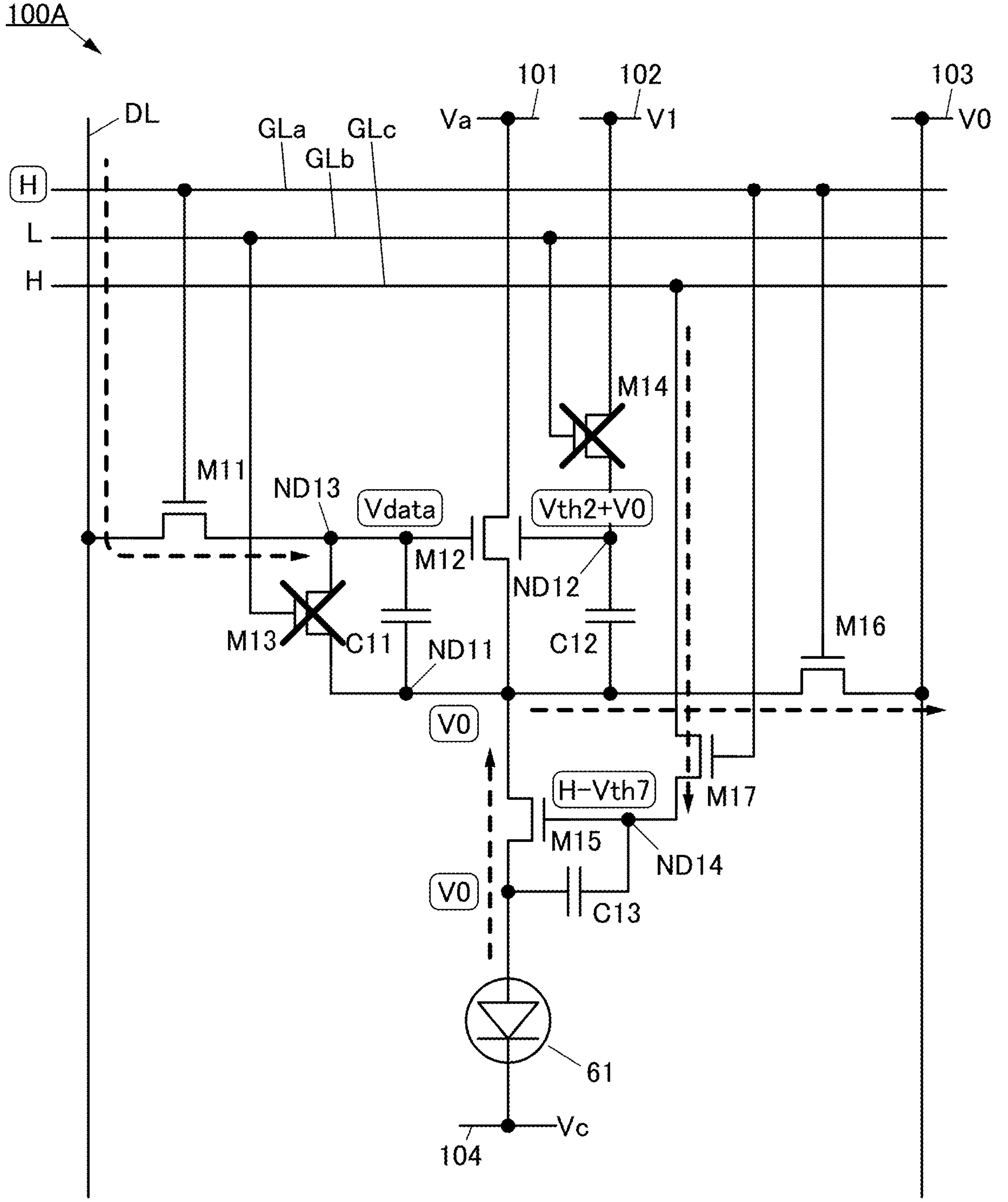
FIG. 23 is a diagram illustrating an operation of the semiconductor device.

In a period T14, the potential H is supplied to the wiring GLa. As illustrated in FIG. 23, the transistor M11 is brought into the on state, so that a video signal Vdata is supplied to the node ND13. Furthermore, the transistor M16 is brought into the on state, so that the potential V0 is supplied to the node ND11.

The node ND11 and the node ND12 are capacitively coupled through the capacitor C12; thus, when the potential of the node ND11 changes from V1−Vth2 to V0, the potential of the node ND12 changes in a similar manner. Since the potential V0 is 0 V in this embodiment and the like, the potential of the node ND12 is represented by V1−(V1−Vth2). That is, the potential of the node ND12 becomes Vth2.

The transistor M17 is brought into the on state, so that charge is supplied from the wiring GLc to the node ND14. The potential of the node ND14 increases to a value obtained by subtracting Vth7 of the transistor M17 from the potential H. Assuming that the potential H is 6 V and Vth5 of the transistor M15 and Vth7 of the transistor M17 are each 1 V, for example, the potential of the node ND14 (H−Vth7) is 5 V. Accordingly, the transistor M15 is brought into the on state, so that the potential of the anode terminal of the light-emitting device 61 becomes V0.

[Light-Emitting Operation]

Figure 24:
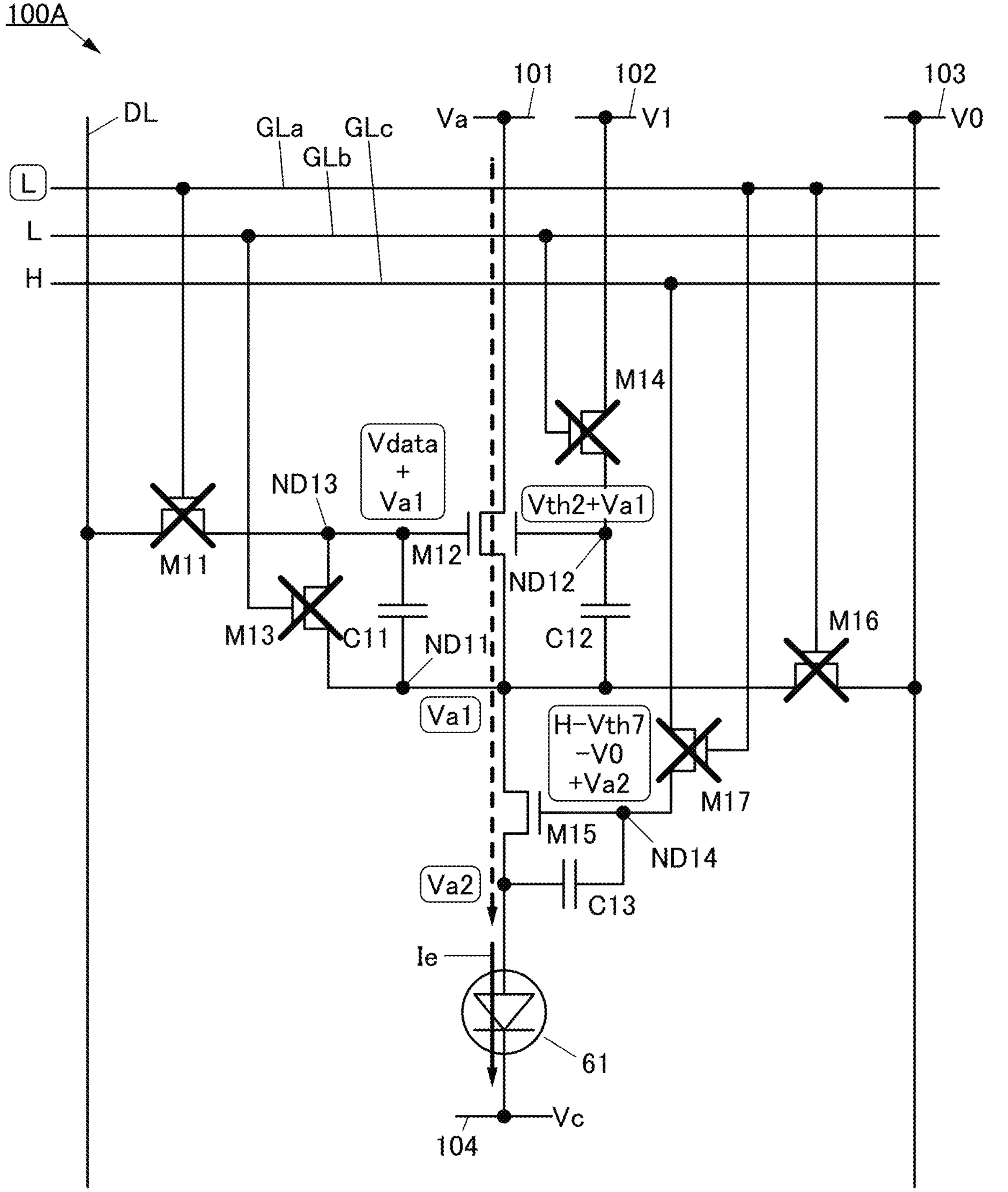
FIG. 24 is a diagram illustrating an operation of the semiconductor device.

In a period T15, the potential L is supplied to the wiring GLa. As illustrated in FIG. 24, the transistor M11 and the transistor M16 are brought into the off state. A current flows from the wiring 101 to the wiring 104, and the light-emitting device 61 emits light with a luminance corresponding to the current Ie. The potentials of the node ND11 and the anode terminal of the light-emitting device 61 increase.

The node ND13 is in a floating state, and the node ND11 and the node ND13 are capacitively coupled through the capacitor C11. In the period T15, when the potential of the node ND11 changes from V0 to Va1, the potential of the node ND13 changes in a similar manner. Here, the potential of the node ND13 becomes the video signal Vdata+Va1. That is, even when the source potential of the transistor M12 changes, the difference in potential (voltage) between the gate of the transistor M12 and the source of the transistor M12 is maintained at the video signal Vdata.

Similarly, the node ND12 is in a floating state, and the node ND11 and the node ND13 are capacitively coupled through the capacitor C11. Thus, the potential of the node ND12 changes to Vth2+Va1 in accordance with the potential change of the node ND11. The difference in potential between the back gate of the transistor M12 and the source of the transistor M12 is maintained at Vth2.

The transistor M17 is brought into the off state, so that the node ND14 is brought into a floating state. The anode terminal of the light-emitting device 61 and the node ND14 are capacitively coupled through the capacitor C13. Thus, when the potential of the anode terminal of the light-emitting device 61 changes from V0 to Va2, the potential of the node ND14 changes in a similar manner. Since the potential V0 is 0 V in this embodiment or the like, the potential of the node ND14 becomes H−Vth7+Va2. That is, even when the potential of the anode terminal of the light-emitting device 61 changes, the difference in potential (voltage) between the gate of the transistor M15 and the source of the transistor M15 is maintained at the potential H−Vth7.

For example, in the case where the gate of the transistor M15 has a fixed potential, an increase in the source potential of the transistor M15 decreases the potential difference between the gate of the transistor M15 and the source of the transistor M15. When the potential difference between the gate of the transistor M15 and the source of the transistor M15 falls below the threshold voltage of the transistor M15, the transistor M15 is brought into the off state. Thus, increasing the anode potential requires supply of a high potential also to the gate of the transistor M15, which creates the need for adding a power source or a power supply circuit for supplying the high potential.

In the semiconductor device 100A of one embodiment of the present invention, the capacitor C13 is provided between the gate of the transistor M15 and the source of the transistor M15 so that a bootstrap circuit can be formed; thus, even when the anode potential is increased, the on state of the transistor M15 can be maintained without addition of a power supply circuit. Accordingly, the current Ie can be stably supplied to the light-emitting device 61. Note that the capacitor C13 is sometimes referred to as a "bootstrap capacitor". The capacitor C11 and the capacitor C12 each also function as a bootstrap capacitor.

The semiconductor device 100A of one embodiment of the present invention can be suitably used not only in a light-emitting device with a single structure but also in a light-emitting device with a tandem structure that requires a higher driving voltage than the light-emitting device with a single structure.

As described above, the amount of current Ie flowing through the light-emitting device 61 is determined by the video signal Vdata and Vth2 of the transistor M12. When a Vth value correction operation is performed in the semiconductor device 100A of one embodiment of the present invention, the amount of current Ie flowing through the light-emitting device 61 can be controlled by the video signal Vdata.

Since the emission luminance of the light-emitting device 61 is controlled by the video signal Vdata, the transistor M15 needs to be surely in the on state at the time of the light-emitting operation. In the semiconductor device 100A of one embodiment of the present invention, the transistor M15 can be surely in the on state at the time of the light-emitting operation. When the semiconductor device 100A of one embodiment of the present invention is used for a display apparatus, the current Ie can be accurately controlled so that the color reproducibility of halftones can be increased. Consequently, the display quality of the display apparatus can be improved.

[Non-Light-Emission Operation]

Figure 25:
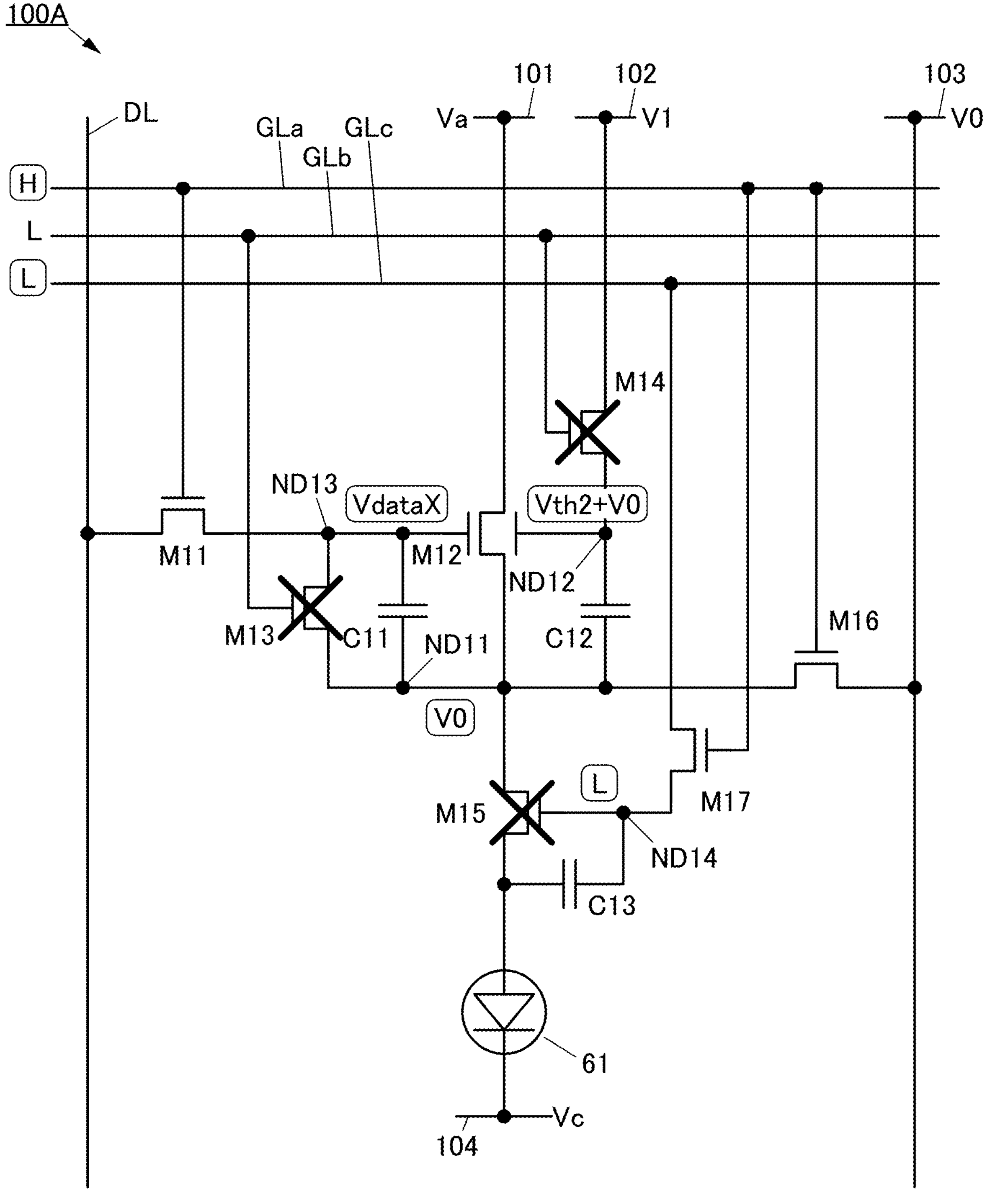
FIG. 25 is a diagram illustrating an operation of the semiconductor device.

In a period T16, the potential H is supplied to the wiring GLa, and the potential L is supplied to the wiring GLc. As illustrated in FIG. 25, the transistor M11, the transistor M16, and the transistor M17 are brought into the on state, the potential of the node ND11 becomes V0, and the potential of the node ND14 becomes the L potential. When the potential of the node ND14 becomes the L potential, the transistor M15 is brought into the off state and thus light emission from the light-emitting device 61 is stopped (non-light-emission).

Although the video signals Vdata to be written to the other semiconductor devices 100A electrically connected to the wiring DL are sometimes supplied to the node ND13 through the transistor M11 in the period T16, the non-light-emission operation is not affected because the transistor M15 is in the off state. Note that such a video signal Vdata is denoted by VdataX in FIG. 25 in order to be distinguished from the video signal Vdata in the period T14 (data writing operation).

In a display apparatus using a light-emitting device such as an EL element as a display element, the light-emitting device can continuously emit light during one frame period. Such a driving method is also referred to as a "hold type" or "hold-type driving". When the hold-type driving is used as a driving method of a display apparatus, a flicker phenomenon or the like on a display screen can be reduced. However, the hold-type driving is likely to cause an afterimage, an image blur, and the like in moving image display. The definition that is perceived by a person in displaying moving images is also referred to as "moving image definition". That is, the hold-type driving is likely to decrease the moving image definition.

Furthermore, "black insertion driving," which solves an afterimage, an image blur, and the like in moving image display, is known. The "black insertion driving" is also referred to as a "pseudo impulsive type" or "pseudo impulsive driving". The black insertion driving refers to a driving method in which black display is performed in every other frame or black display is performed for a certain period in one frame.

The semiconductor device 100A can be suitably used not only in a light-emitting device with a single structure but also in a light-emitting device with a tandem structure that requires a higher driving voltage than the light-emitting device with a single structure. In addition, the semiconductor device 100A can perform black insertion driving easily owing to the non-light-emission operation. A display apparatus using the semiconductor device 100A of one embodiment of the present invention can achieve high-quality moving image display whose moving image definition is unlikely to decrease.

The structure described in this embodiment can be used in combination as appropriate with any of the structures described in the other embodiments and Examples.

Embodiment 2

In this embodiment, a light-emitting device that can be used in a semiconductor device of one embodiment of the present invention will be described.

Structure Examples of Light-Emitting Device

Figure 26A:
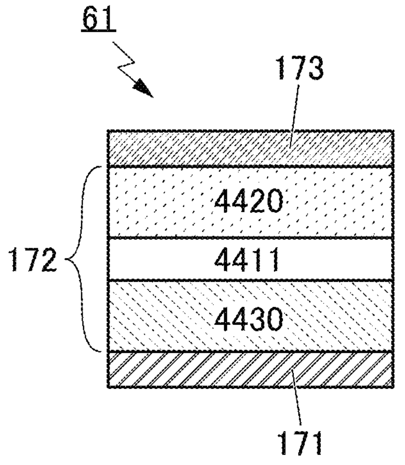
FIG. 26A to FIG. 26D are diagrams illustrating structure examples of a light-emitting device.

As illustrated in FIG. 26A, the light-emitting device 61 includes an EL layer 172 between a pair of electrodes (a conductive layer 171 and a conductive layer 173). The EL layer 172 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can function as a single light-emitting unit, and the structure in FIG. 26A is referred to as a single structure in this specification and the like.

Figure 26B:
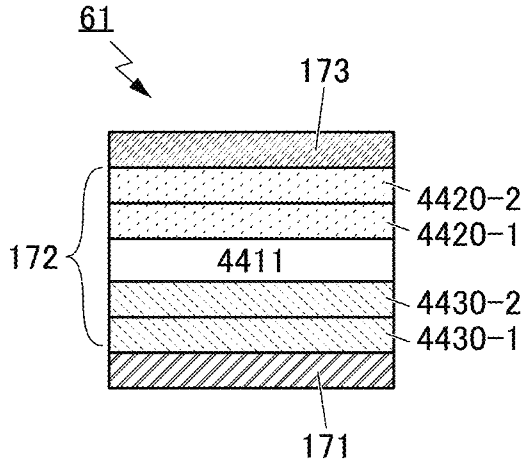

FIG. 26B is a variation example of the EL layer 172 included in the light-emitting device 61 illustrated in FIG. 26A. Specifically, the light-emitting device 61 illustrated in FIG. 26B includes a layer 4430-1 over the conductive layer 171, a layer 4430-2 over the layer 4430-1, the light-emitting layer 4411 over the layer 4430-2, a layer 4420-1 over the light-emitting layer 4411, a layer 4420-2 over the layer 4420-1, and the conductive layer 173 over the layer 4420-2. For example, in the case where the conductive layer 171 serves as an anode and the conductive layer 173 serves as a cathode, the layer 4430-1 serves as a hole-injection layer, the layer 4430-2 serves as a hole-transport layer, the layer 4420-1 serves as an electron-transport layer, and the layer 4420-2 serves as an electron-injection layer. Alternatively, in the case where the conductive layer 171 serves as a cathode and the conductive layer 173 serves an anode, the layer 4430-1 serves as an electron-injection layer, the layer 4430-2 serves as an electron-transport layer, the layer 4420-1 serves as a hole-transport layer, and the layer 4420-2 serves as a hole-injection layer. With such a layer structure, carriers can be efficiently injected to the light-emitting layer 4411, and the efficiency of the recombination of carriers in the light-emitting layer 4411 can be enhanced.

Figure 26C:
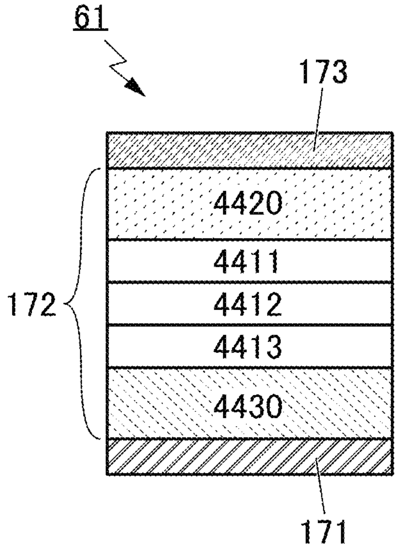

The structure in which a plurality of light-emitting layers (the light-emitting layer 4411, a light-emitting layer 4412, and a light-emitting layer 4413) is provided between the layer 4420 and the layer 4430 as illustrated in FIG. 26C is another example of the single structure.

Figure 26D:
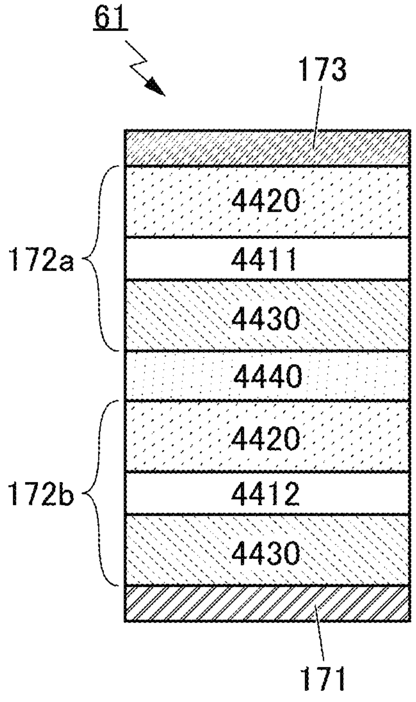

The structure in which a plurality of light-emitting units (an EL layer 172*a* and an EL layer 172*b*) are connected in series with an intermediate layer (charge-generation layer) 4440 therebetween as illustrated in FIG. 26D is referred to as a tandem structure or a stack structure in this specification and the like. With the tandem structure, a light-emitting device capable of high luminance light emission can be provided.

In the case where the light-emitting device 61 has the tandem structure illustrated in FIG. 26D, the EL layers 172*a* and 172*b* may emit light of the same color. For example, the colors of light emitted by the EL layers 172*a* and 172*b* may both green. Note that in the case where the display region 235 includes three subpixels of R, G, and B and each subpixel includes a light-emitting device, a tandem structure may be employed in each of the light-emitting devices of the subpixels. Specifically, the EL layers 172*a* and 172*b* in the subpixel of R each contain a material capable of emitting red light, the EL layers 172*a* and 172*b* in the subpixel of G each contain a material capable of emitting green light, and the EL layers 172*a* and 172*b* in the subpixel of B each contain a material capable of emitting blue light. In other words, the light-emitting layers 4411 and 4412 may contain the same material. When the EL layers 172*a* and 172*b* emit light of the same color, the current density per unit emission luminance can be reduced. Thus, the reliability of the light-emitting device 61 can be improved.

The emission color of the light-emitting device can be changed to red, green, blue, cyan, magenta, yellow, white, or the like depending on the material of the EL layer 172. When the light-emitting device has a microcavity structure, the color purity can be further increased.

The light-emitting layer may contain two or more substances emitting light of red (R), green (G), blue (B), yellow (Y), orange (O), or the like. A light-emitting device emitting white light preferably has a structure in which a light-emitting layer contains two or more kinds of light-emitting substances. To obtain white light emission, the two or more kinds of light-emitting substances are selected so as to emit light of complementary colors. For example, the emission colors of first and second light-emitting layers are complementary, so that a light-emitting device can emit white light as a whole. In the case of a light-emitting device including three or more light-emitting layers, white light emission can be obtained by mixing of the emission colors.

The light-emitting layer preferably contains two or more light-emitting substances emitting light of red (R), green (G), blue (B), yellow (Y), orange (O), or the like. Alternatively, the light-emitting layer preferably contains two or more light-emitting substances emitting light containing two or more of spectral components of R, G, and B.

<Formation Method of Light-Emitting Device>

An example of a formation method of the light-emitting device 61 is described below.

Figure 27A:
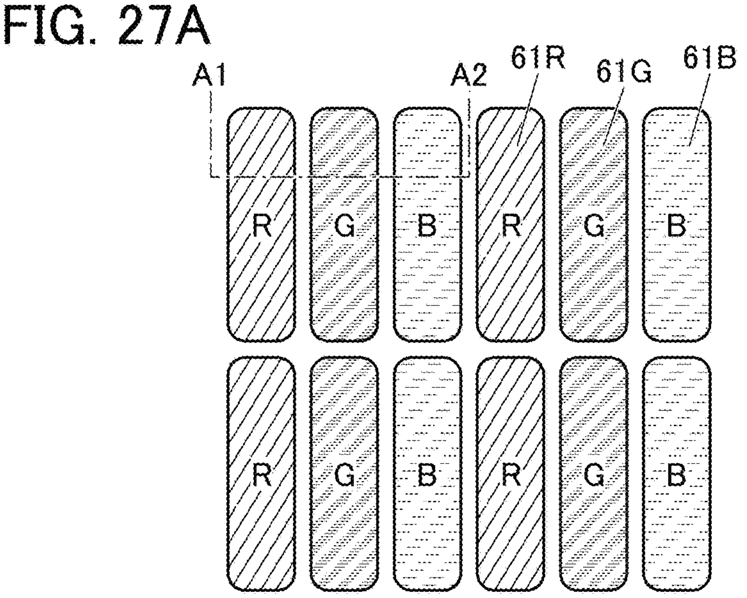
FIG. 27A to FIG. 27D are diagrams illustrating structure examples of the light-emitting device.

FIG. 27A is a schematic top view of the light-emitting device 61. The light-emitting device 61 includes a plurality of light-emitting devices 61R exhibiting red, a plurality of light-emitting devices 61G exhibiting green, and a plurality of light-emitting devices 61B exhibiting blue. In FIG. 27A, light-emitting regions of the light-emitting devices are denoted by R, G, and B to easily differentiate the light-emitting devices. Note that the structure of the light-emitting device 61 illustrated in FIG. 27A may be referred to as a side-by-side (SBS) structure. Although the structure illustrated in FIG. 27A has three emission colors of red (R), green (G), and blue (B), one embodiment of the present invention is not limited thereto. For example, the structure may have four or more colors.

The light-emitting device 61R, the light-emitting device 61G, and the light-emitting device 61B are arranged in a matrix. Although FIG. 27A illustrates what is called a stripe arrangement in which the light-emitting devices of the same color are arranged in one direction, the arrangement method of the light-emitting devices is not limited thereto. As another arrangement method of the light-emitting devices, a delta arrangement, a zig-zag arrangement, an S-Stripe RGB arrangement, a pentile arrangement, or the like can be employed.

Figure 27B:
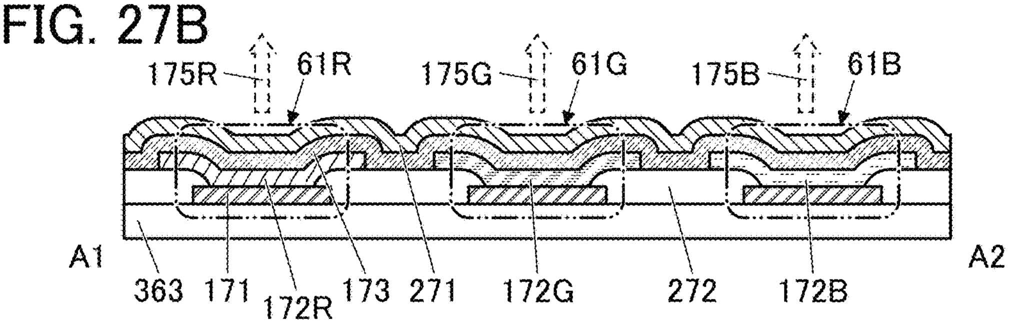

FIG. 27B is a schematic cross-sectional view taken along dashed-dotted line A1-A2 in FIG. 27A. FIG. 27B illustrates cross sections of the light-emitting device 61R, the light-emitting device 61G, and the light-emitting device 61B. The light-emitting device 61R, the light-emitting device 61G, and the light-emitting device 61B are provided over an insulating layer 363, and include the conductive layer 171 functioning as a pixel electrode and the conductive layer 173 functioning as a common electrode. For the insulating layer 363, one or both of an inorganic insulating film and an organic insulating film can be used. An inorganic insulating film is preferably used for the insulating layer 363. Examples of the inorganic insulating film include an oxide insulating film and a nitride insulating film, such as a silicon oxide film, a silicon oxynitride film, a silicon nitride oxide film, a silicon nitride film, an aluminum oxide film, an aluminum oxynitride film, and a hafnium oxide film.

The light-emitting device 61R includes an EL layer 172R between the conductive layer 171 functioning as a pixel electrode and the conductive layer 173 functions as a common electrode. The EL the layer 172R contains at least a light-emitting organic compound that emits light with intensity in a red wavelength range. An EL layer 172G included in the light-emitting device 61G contains at least a light-emitting organic compound that emits light with intensity in a green wavelength range. An EL layer 172B included in the light-emitting device 61B contains at least a light-emitting organic compound that emits light with intensity in a blue wavelength range.

The EL layers 172R, 172G, and 172B may each include one or more of an electron-injection layer, an electron-transport layer, a hole-injection layer, and a hole-transport layer in addition to the layer containing a light-emitting organic compound (the light-emitting layer).

The conductive layer 171 functioning as a pixel electrode is provided for each of the light-emitting devices. The conductive layer 173 functioning as a common electrode is provided as a common layer to the light-emitting devices. A conductive film that has a property of transmitting visible light is used for either the conductive layer 171 functioning as a pixel electrode or the conductive layer 173 functioning as a common electrode, and a reflective conductive film is used for the other. When the conductive layer 171 functioning as a pixel electrode has a light-transmitting property and the conductive layer 173 functioning as a common electrode has a reflective property, a bottom-emission display apparatus can be obtained. When the conductive layer 171 functioning as a pixel electrode has a reflective property and the conductive layer 173 functioning as a common electrode has a light-transmitting property, a top-emission display apparatus can be obtained. Note that when both the conductive layer 171 functioning as a pixel electrode and the conductive layer 173 functioning as a common electrode transmit light, a dual-emission display apparatus can be obtained.

For example, in the case where the light-emitting device 61R has a top-emission structure, light 175R is emitted from the light-emitting device 61R to the conductive layer 173 side. In the case where the light-emitting device 61R has a top-emission structure, light 175G is emitted from the light-emitting device 61G to the conductive layer 173 side. In the case where the light-emitting device 61B has a top-emission structure, light 175B is emitted from the light-emitting device 61B to the conductive layer 173 side.

An insulating layer 272 is provided to cover an end portion of the conductive layer 171 functioning as a pixel electrode. An end portion of the insulating layer 272 is preferably tapered. For the insulating layer 272, a material similar to the material that can be used for the insulating layer 363 can be used.

The insulating layer 272 is provided to prevent an unintentional electric short-circuit between adjacent light-emitting devices 61 and unintended light emission therefrom. The insulating layer 272 also has a function of preventing the contact of a metal mask with the conductive layer 171 in the case where the metal mask is used to form the EL layer 172.

The EL layer 172R, the EL layer 172G, and the EL layer 172B each include a region in contact with the top surface of the conductive layer 171 functioning as a pixel electrode and a region in contact with a surface of the insulating layer 272. End portions of the EL layer 172R, the EL layer 172G, and the EL layer 172B are positioned over the insulating layer 272.

As illustrated in FIG. 27B, there is a gap between the EL layers of two light-emitting devices of different colors. The EL layer 172R, the EL layer 172G, and the EL layer 172G are thus preferably provided not to be in contact with each other. This suitably prevents unintentional light emission (also referred to as crosstalk) from being caused by a current flowing through two adjacent EL layers. As a result, the contrast can be increased to achieve a display apparatus with high display quality.

The EL layer 172R, the EL layer 172G, and the EL layer 172G can be formed separately by a vacuum evaporation method or the like using a shadow mask such as a metal mask. These layers may be formed separately by a photolithography method. The use of the photolithography method enables a display apparatus with high resolution, which is difficult to obtain in the case of using a metal mask.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure. A display apparatus having an MML structure is manufactured without using a metal mask and thus has higher flexibility in designing the pixel arrangement, the pixel shape, and the like than a display apparatus having an MM structure.

A protective layer 271 is provided over the conductive layer 173 functioning as a common electrode to cover the light-emitting device 61R, the light-emitting device 61G, and the light-emitting device 61B. The protective layer 271 has a function of preventing diffusion of impurities such as water into each light-emitting device from the above.

The protective layer 271 can have, for example, a single-layer structure or a stacked-layer structure at least including an inorganic insulating film. Examples of the inorganic insulating film include an oxide film and a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as indium gallium oxide or indium gallium zinc oxide (IGZO) may be used for the protective layer 271. The protective layer 271 may be formed by one or more of an ALD method, a CVD method, and a sputtering method. Although the protective layer 271 includes an inorganic insulating film in this example, one embodiment of the present invention is not limited thereto. For example, the protective layer 271 may have a stacked-layer structure of an inorganic insulating film and an organic insulating film.

Note that in this specification, a nitride oxide refers to a compound in which the nitrogen content is higher than the oxygen content. An oxynitride refers to a compound in which the oxygen content is higher than the nitrogen content. The content of each element can be measured by Rutherford backscattering spectrometry (RBS), for example.

In the case where an indium gallium zinc oxide is used for the protective layer 271, the indium gallium zinc oxide can be processed by a wet etching method or a dry etching method. For example, in the case where IGZO is used for the protective layer 271, a chemical solution of oxalic acid, phosphoric acid, a mixed chemical solution (e.g., a mixed chemical solution of phosphoric acid, acetic acid, nitric acid, and water, which is also referred to as a mixed acid aluminum etchant), or the like can be used. Note that the volume ratio of phosphoric acid, acetic acid, nitric acid, and water mixed in the mixed acid aluminum etchant can be 53.3:6.7:3.3:36.7 or in the neighborhood thereof.

Figure 27C:
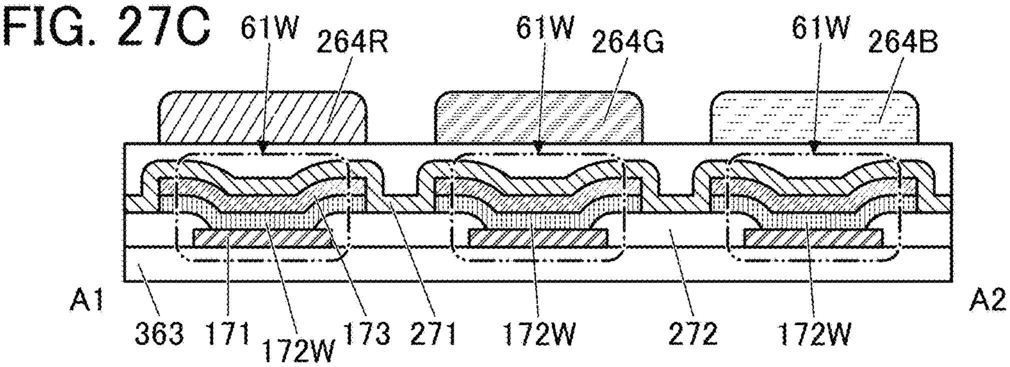

FIG. 27C illustrates an example different from the above. Specifically, in FIG. 27C, a light-emitting device 61W emitting white light is provided. The light-emitting device 61W includes an EL layer 172W emitting white light between the conductive layer 171 functioning as a pixel electrode and the conductive layer 173 functioning as a common electrode.

The EL layer 172W can have, for example, a stacked structure of two light-emitting layers that are selected so as to emit light of complementary colors. It is also possible to use a stacked EL layer in which a charge-generation layer is provided between light-emitting layers. In the case where three or more light-emitting layers are stacked, white light emission can be obtained by mixing of their emission colors.

FIG. 27C illustrates three light-emitting devices 61W side by side. A coloring layer 264R is provided above the left light-emitting device 61W. The coloring layer 264R functions as a band path filter transmitting red light. Similarly, a coloring layer 264G transmitting green light is provided above the middle light-emitting device 61W, and a coloring layer 264B transmitting blue light is provided above the right light-emitting device 61W. This enables the display apparatus to display color images.

The EL layer 172W and the conductive layer 173 functioning as a common electrode are each separated between adjacent two light-emitting devices 61W. This suitably prevents unintentional light emission from being caused by a current flowing through the EL layers 172W in the two adjacent light-emitting devices 61W. Particularly when the EL layer 172W is a stacked EL layer in which a charge-generation layer is provided between two light-emitting layers, the effect of crosstalk is more significant as the resolution increases, i.e., as the distance between adjacent pixels decreases, leading to lower contrast. Thus, the above structure can achieve a display apparatus having both high resolution and high contrast.

The EL layer 172W and the conductive layer 173 functioning as a common electrode are preferably isolated by a photolithography method. This can reduce the distance between light-emitting devices, achieving a display apparatus with a higher aperture ratio than that formed using, for example, a shadow mask such as a metal mask.

Note that in the case of a bottom-emission light-emitting device, coloring layers may be provided between the conductive layer 171 functioning as a pixel electrode and the insulating layer 363.

Figure 27D:
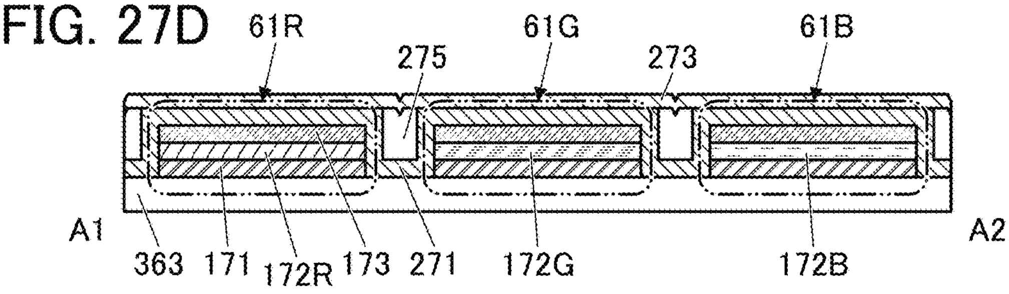

FIG. 27D illustrates an example different from the above. Specifically, in FIG. 27D, the insulating layers 272 are not provided between the light-emitting device 61R, the light-emitting device 61G, and the light-emitting device 61B. With such a structure, a display apparatus with a high aperture ratio can be obtained. When the insulating layer 272 is not provided, unevenness formed by the light-emitting devices 61 can be reduced, thereby improving the viewing angle of the display apparatus. Specifically, the viewing angle can be greater than or equal to 150° and less than 180°, preferably greater than or equal to 160° and less than 180°, further preferably greater than or equal to 160° and less than 180°.

The protective layer 271 covers the side surfaces of the EL layer 172R, the EL layer 172G, and the EL layer 172B. With this structure, impurities (typically, water or the like) can be prevented from entering the EL layer 172R, the EL layer 172G, and the EL layer 172B through their side surfaces. In addition, a leakage current between adjacent light-emitting devices 61 is reduced, so that color saturation and contrast ratio are improved and power consumption is reduced.

In the structure illustrated in FIG. 27D, the conductive layer 171, the EL layer 172R, and the conductive layer 173 have substantially the same top surface shape. This structure can be formed in such a manner that the conductive layer 171, the EL layer 172R, and the conductive layer 173 are formed, and collectively processed using a resist mask or the like. In this process, the EL layer 172R and the conductive layer 173 are processed using the conductive layer 173 as a mask, and thus this process can be referred to as self-alignment patterning. Although the EL layer 172R is described here, the EL layer 172G and the EL layer 172B can each have a similar structure.

In FIG. 27D, a protective layer 273 is further provided over the protective layer 271. For example, the protective layer 271 can be formed with an apparatus that can form a film with excellent coverage (typically, an ALD apparatus), and the protective layer 273 can be formed with an apparatus that can form a film with coverage inferior to that of the protective layer 271 (typically, a sputtering apparatus), whereby a region 275 can be provided between the protective layer 271 and the protective layer 273. In other words, the regions 275 are positioned between the EL layer 172R and the EL layer 172G and between the EL layer 172G and the EL layer 172B.

Note that the region 275 includes, for example, one or more selected from air, nitrogen, oxygen, carbon dioxide, and Group 18 elements (typically, helium, neon, argon, xenon, and krypton). Furthermore, a gas used during the formation of the protective layer 273 is sometimes contained in the region 275. For example, in the case where the protective layer 273 is formed using a sputtering method, one or more of the above-described Group 18 elements may be contained in the region 275. In the case where a gas is contained in the region 275, a gas can be identified with a gas chromatography method or the like. Alternatively, in the case where the protective layer 273 is formed using a sputtering method, a gas used in the sputtering is sometimes contained in the protective layer 273. In this case, an element such as argon may be detected when the protective layer 273 is analyzed by an energy dispersive X-ray analysis (EDX analysis) or the like.

In the case where the refractive index of the region 275 is lower than that of the protective layer 271, light emitted from the EL layer 172R, the EL layer 172G, or the EL layer 172B is reflected at the interface between the protective layer 271 and the region 275. Thus, light emitted from the EL layer 172R, the EL layer 172G, or the EL layer 172B can be prevented from entering an adjacent pixel in some cases. This can inhibit color mixture of light emitted from adjacent pixels and thus can improve the display quality of the display apparatus.

In the case of the structure illustrated in FIG. 27D, a region between the light-emitting device 61R and the light-emitting device 61G or a region between the light-emitting device 61G and the light-emitting device 61B (hereinafter simply referred to as a distance between the light-emitting devices) can be shortened. Specifically, the distance between the light-emitting devices can be 1 μm or shorter, preferably 500 nm or shorter, further preferably 200 nm or shorter, 100 nm or shorter, 90 nm or shorter, 70 nm or shorter, 50 nm or shorter, 30 nm or shorter, 20 nm or shorter, 15 nm or shorter, or 10 nm or shorter. In other words, the display apparatus includes a region in which an interval between a side surface of the EL layer 172R and a side surface of the EL layer 172G or an interval between a side surface of the EL layer 172G and a side surface of the EL layer 172B is 1 μm or shorter, preferably 0.5 μm (500 nm) or shorter, further preferably 100 nm or shorter.

In the case where the region 275 contains a gas, for example, the light-emitting devices can be isolated from each other and color mixture of light from the light-emitting devices, crosstalk, or the like can be inhibited.

Alternatively, the region 275 may be filled with a filler. Examples of the filler include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. Alternatively, a photoresist may be used as the filler. The photoresist used as the filler may be a positive photoresist or a negative photoresist.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white light-emitting device is preferable in terms of lower manufacturing cost or higher manufacturing yield because the manufacturing process of the white light-emitting device is simpler than that of a light-emitting device having an SBS structure.

Figure 28A:
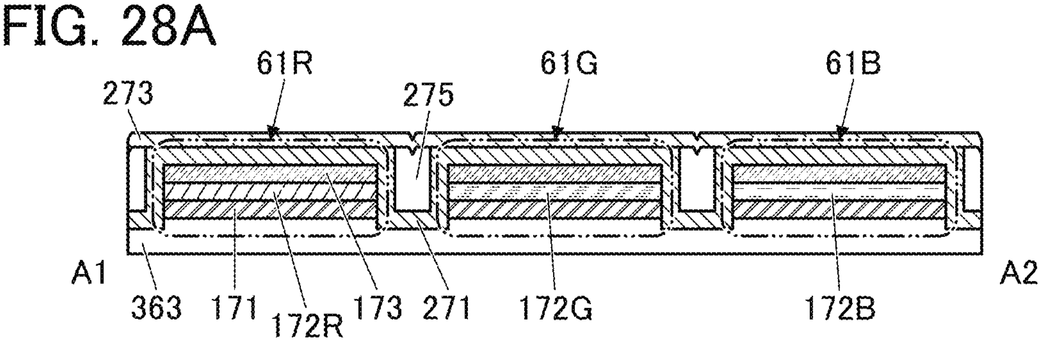
FIG. 28A to FIG. 28D are diagrams illustrating structure examples of the light-emitting device.

FIG. 28A illustrates an example different from the above example. Specifically, the structure illustrated in FIG. 28A is different from that in FIG. 27D in the structure of the insulating layer 363. The insulating layer 363 has a depressed portion in its top surface that is formed by being partially etched when the light-emitting device 61R, the light-emitting device 61G, and the light-emitting device 61B are processed. In addition, the protective layer 271 is formed in the depressed portion. In other words, in the cross-sectional view, there is a region in which the bottom surface of the protective layer 271 is positioned below the bottom surface of the conductive layer 171. With the region, impurities (typically, water or the like) can be suitably prevented from entering the light-emitting device 61R, the light-emitting device 61G, and the light-emitting device 61B from the bottom. It is likely that the depressed portion can be formed when impurities (also referred to as residue) that could be attached to the side surfaces of the light-emitting device 61B, the light-emitting device 61G, and the light-emitting device 61B in processing of the light-emitting devices are removed by wet etching or the like. After the residue is removed, the side surfaces of the light-emitting devices are covered with the protective layer 271, whereby a highly reliable display apparatus can be provided.

Figure 28B:
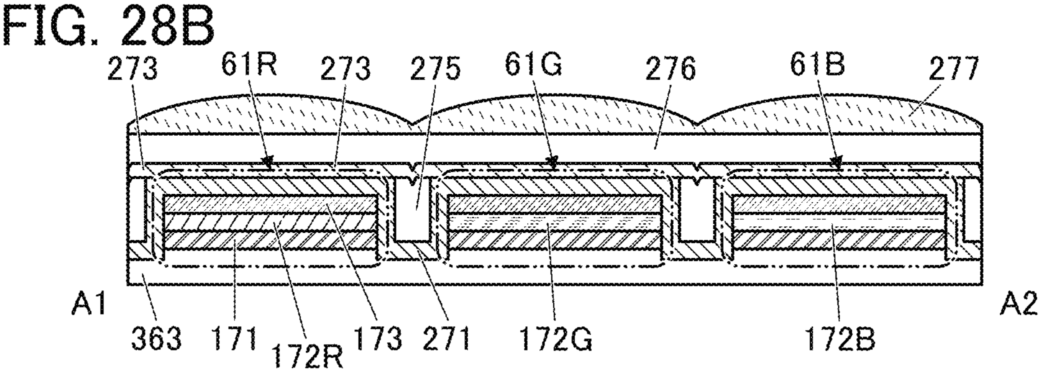

FIG. 28B illustrates an example different from the above example. Specifically, the structure illustrated in FIG. 28B includes an insulating layer 276 and a microlens array 277 in addition to the structure illustrated in FIG. 28A. The insulating layer 276 has a function of an adhesive layer. Note that when the refractive index of the insulating layer 276 is lower than that of the microlens array 277, the microlens array 277 can condense light emitted from the light-emitting device 61R, the light-emitting device 61G, and the light-emitting device 61B. This can increase the outcoupling efficiency of the display apparatus. In particular, this is suitable, because a user can see bright images when the user sees the display surface from the front of the display apparatus. As the insulating layer 276, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferable. A two-component-mixture-type resin may be used. An adhesive sheet or the like may be used.

Figure 28C:
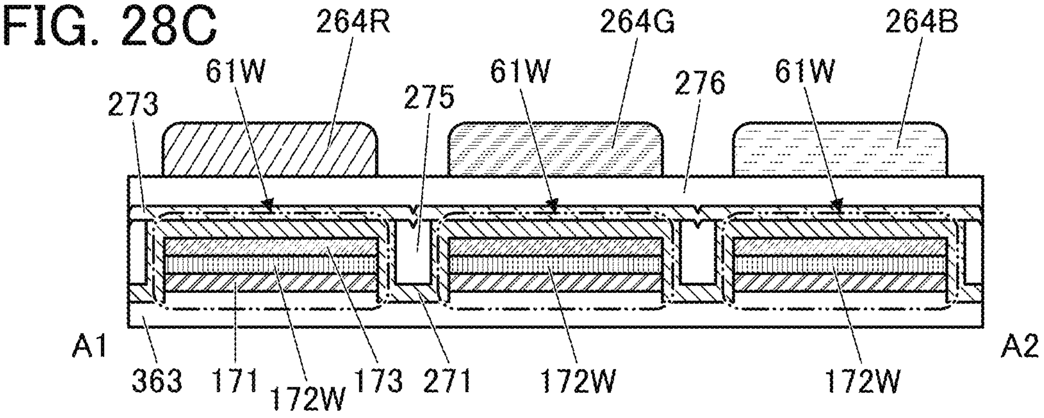

FIG. 28C illustrates an example different from the above example. Specifically, the structure illustrated in FIG. 28C includes three light-emitting devices 61W instead of the light-emitting device 61R, the light-emitting device 61G, and the light-emitting device 61B in the structure illustrated in FIG. 28A. In addition, the insulating layer 276 is provided over the three light-emitting devices 61W, and the coloring layer 264R, the coloring layer 264G, and the coloring layer 264B are provided over the insulating layer 276. Specifically, the coloring layer 264R transmitting red light is provided at a position overlapping with the left light-emitting device 61W, the coloring layer 264G transmitting green light is provided at a position overlapping with the middle light-emitting device 61W, and the coloring layer 264B transmitting blue light is provided at a position overlapping with the right light-emitting device 61W. This enables the semiconductor device to display color images. The structure illustrated in FIG. 28C is a variation example of the structure illustrated in FIG. 27C.

Figure 28D:
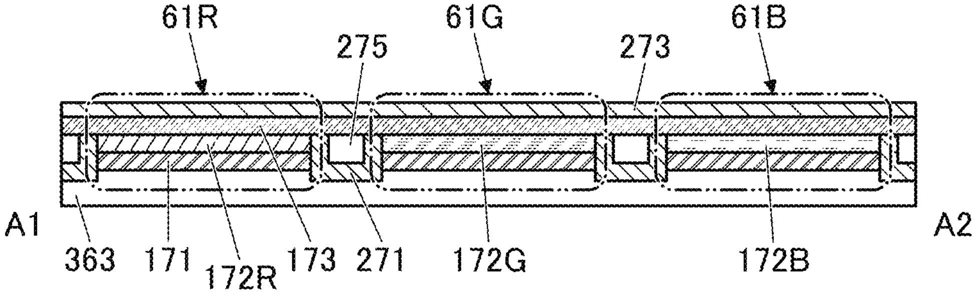

FIG. 28D illustrates an example different from the above example. Specifically, in the structure illustrated in FIG. 28D, the protective layer 271 is provided to be in contact with the side surfaces of the conductive layer 171 and the EL layer 172. The conductive layer 173 is provided as a continuous layer shared by the light-emitting devices. In the structure illustrated in FIG. 28D, the region 275 is preferably filled with a filler.

When the light-emitting device 61 has a micro-optical resonator (microcavity) structure, the color purity of each emission color can be increased. In order that the light-emitting device 61 has a microcavity structure, a product of a distance d between the conductive layer 171 and the conductive layer 173 and a refractive index n of the EL layer 172 (optical path length) is set to m times one-half of a wavelength λ (m is an integer of 1 or more). The distance d can be obtained by Formula 1.

$$d = m \times \lambda/(2 \times n). \quad \text{Formula 1}$$

According to Formula 1, in the light-emitting device 61 having the microcavity structure, the distance d is determined in accordance with the wavelength (emission color) of emitted light. The distance d corresponds to the thickness of the EL layer 172. Thus, the EL layer 172G is provided to have a larger thickness than the EL layer 172B, and the EL layer 172R is provided to have a larger thickness than the EL layer 172G in some cases.

Therefore, one of the pair of electrodes of the light-emitting device 61 is preferably an electrode having properties of transmitting and reflecting visible light (a transflective electrode), and the other is preferably an electrode having a property of reflecting visible light (a reflective electrode). To be exact, the distance d is a distance from a reflection region in the conductive layer 171 functioning as a reflective electrode to a reflection region in the conductive layer 173 functioning as a transflective electrode. For example, in the case where the conductive layer 171 has a stacked-layer structure of silver and indium tin oxide (hereinafter also referred to as ITO) that is a transparent conductive film and the ITO is positioned on the EL layer 172 side, the distance d corresponding to the emission color can be set by adjusting the thickness of the ITO. That is, even when the EL layer 172R, the EL layer 172G, and the EL layer 172B have the same thickness, the distance d suitable for the emission color can be obtained by changing the thickness of the ITO.

However, it is sometimes difficult to determine the exact position of the reflection region in the conductive layer 171 and the conductive layer 173. In this case, it is assumed that the effect of the microcavity structure can be obtained sufficiently with a certain position in the conductive layer 171 and the conductive layer 173 being supposed as the reflection region.

The light-emitting device 61 includes a hole-injection layer, a hole-transport layer, a light-emitting layer, an electron-transport layer, an electron-injection layer, and the like. A specific structure example of the light-emitting device 61 will be described in another embodiment. In order to increase the outcoupling efficiency in the microcavity structure, the optical path length from the conductive layer 171 functioning as a reflective electrode to the light-emitting layer is preferably set to an odd multiple of λ/4. In order to achieve this optical path length, the thicknesses of the layers in the light-emitting device 61 are preferably adjusted as appropriate.

In the case where light is emitted from the conductive layer 173 side, the reflectance of the conductive layer 173 is preferably higher than the transmittance thereof. The transmittance of the conductive layer 173 is preferably higher than or equal to 2% and lower than or equal to 50%, further preferably higher than or equal to 2% and lower than or equal to 30%, still further preferably higher than or equal to 2% and lower than or equal to 10%. When the transmittance of the conductive layer 173 is set low (the reflectance is set high), the effect of the microcavity structure can be enhanced.

Figure 29A:
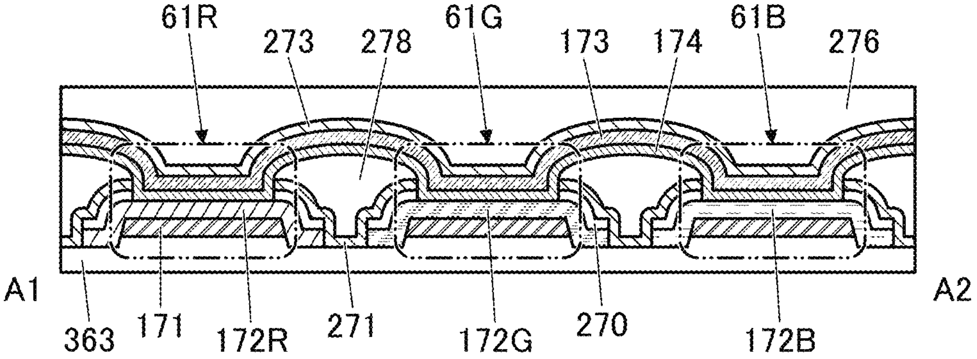
FIG. 29A and FIG. 29B are diagrams illustrating structure examples of the light-emitting device.

FIG. 29A illustrates an example different from the above. Specifically, in the structure illustrated in FIG. 29A, the EL layer 172 extends beyond an end portion of the conductive layer 171 in each of the light-emitting device 61R, the light-emitting device 61G, and the light-emitting device 61B. For example, in the light-emitting device 61R, the EL layer 172R extends beyond the end portion of the conductive layer 171. In the light-emitting device 61G, the EL layer 172G extends beyond the end portion of the conductive layer 171. In the light-emitting device 61B, the EL layer 172B extends beyond the end portion of the conductive layer 171.

The light-emitting device 61R, the light-emitting device 61G, and the light-emitting device 61B each include a region where the EL layer 172 and the protective layer 271 overlap with each other with an insulating layer 270 therebetween. In a region between adjacent light-emitting devices 61, an insulating layer 278 is provided over the protective layer 271.

For the insulating layer 278, an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like can be used. Alternatively, a photoresist may be used as the insulating layer 278. The photoresist used as the insulating layer 278 may be a positive photoresist or a negative photoresist.

A common layer 174 is provided over the light-emitting device 61R, the light-emitting device 61G, the light-emitting device 61B, and the insulating layer 278, and the conductive layer 173 is provided over the common layer 174. The common layer 174 includes a region in contact with the EL layer 172R, a region in contact with the EL layer 172G, and a region in contact with the EL layer 172B. The common layer 174 is shared by the light-emitting device 61R, the light-emitting device 61G, and the light-emitting device 61B.

One or more of a hole-injection layer, a hole-transport layer, a hole-blocking layer, an electron-blocking layer, an electron-transport layer, and an electron-injection layer can be used as the common layer 174. For example, the common layer 174 may be a carrier-injection layer (a hole-injection layer or an electron-injection layer). The common layer 174 can also be regarded as part of the EL layer 172. Note that the common layer 174 is provided as necessary. In the case where the common layer 174 is provided, a layer having the same function as the common layer 174 is not necessarily provided in the EL layer 172.

The protective layer 273 is provided over the conductive layer 173, and the insulating layer 276 is provided over the protective layer 273.

Figure 29B:
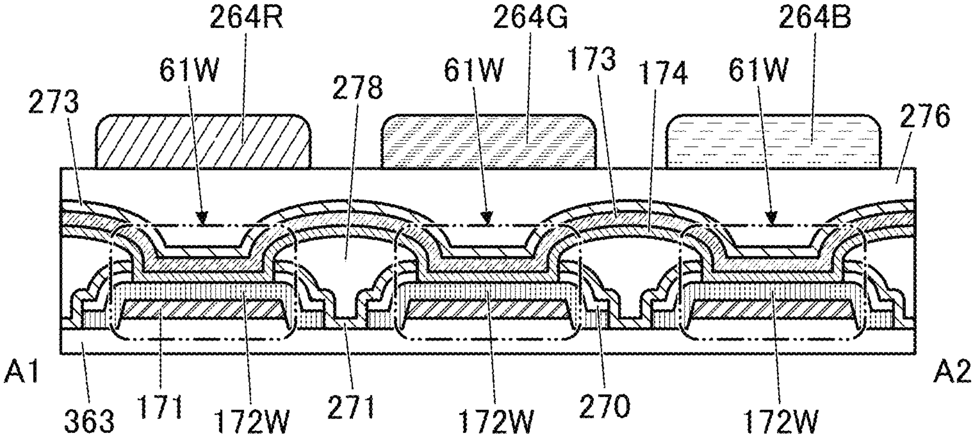

FIG. 29B illustrates an example different from the above. Specifically, the structure illustrated in FIG. 29B includes three light-emitting devices 61W instead of the light-emitting device 61R, the light-emitting device 61G, and the light-emitting device 61B in the structure illustrated in FIG. 29A. In addition, the insulating layer 276 is provided over the three light-emitting devices 61W, and the coloring layer 264R, the coloring layer 264G, and the coloring layer 264B are provided over the insulating layer 276. Specifically, the coloring layer 264R transmitting red light is provided at a position overlapping with the left light-emitting device 61W, the coloring layer 264G transmitting green light is provided at a position overlapping with the middle light-emitting device 61W, and the coloring layer 264B transmitting blue light is provided at a position overlapping with the right light-emitting device 61W. This enables the semiconductor device to display color images. The structure illustrated in FIG. 29B is a variation example of the structure illustrated in FIG. 28C.

Some of the transistors included in the functional circuit included in the layer 40 may be provided in the layer 50. Some of the transistors included in the pixel circuit 51 included in the layer 50 may be provided in the layer 40. Thus, the functional circuit may include a Si transistor and an OS transistor. The pixel circuit 51 may include a Si transistor and an OS transistor.

Figure 30:
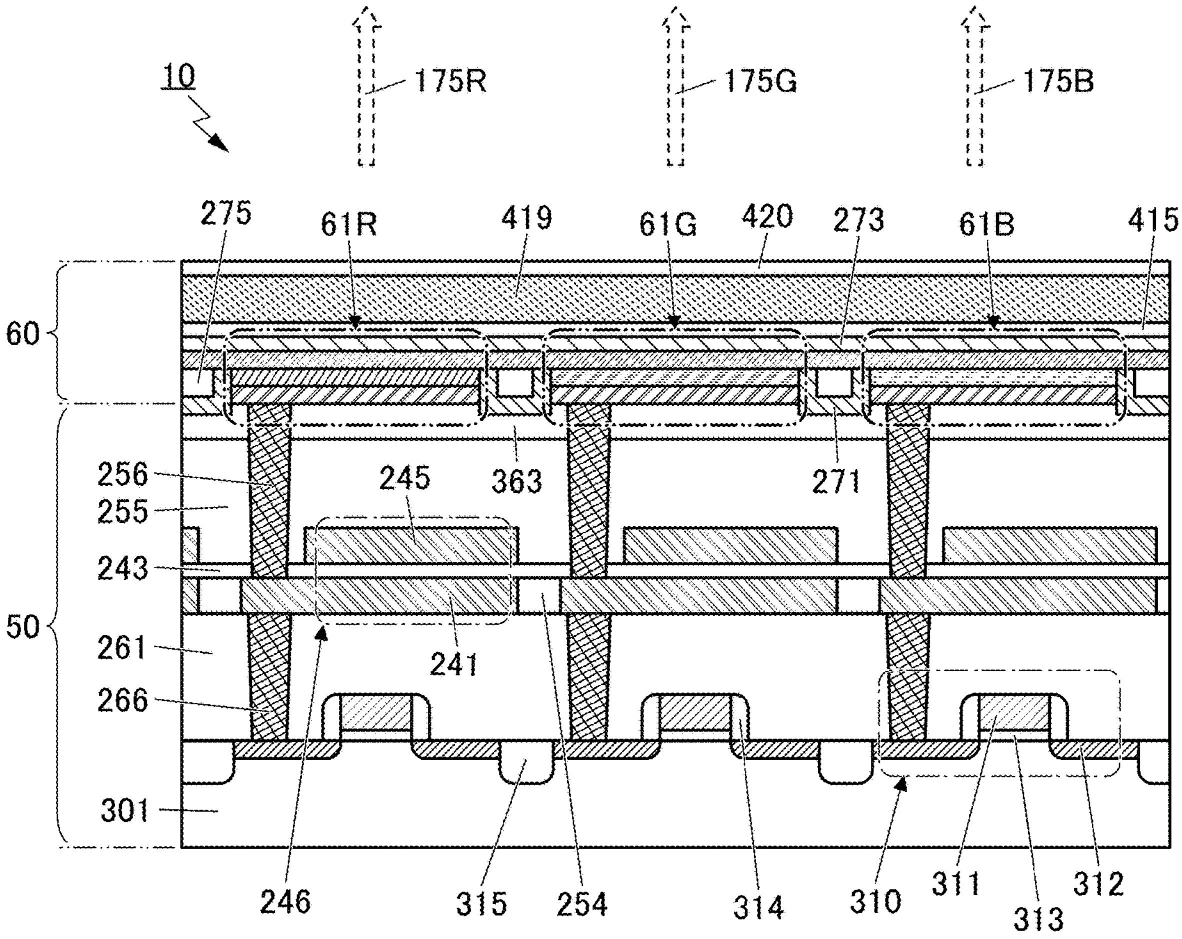
FIG. 30 is a cross-sectional view illustrating a structure example of the display apparatus.

FIG. 30 illustrates a cross-sectional structure example of part of the display apparatus 10 illustrated in FIG. 1A. The display apparatus 10 illustrated in FIG. 30 includes the layer 50 including a substrate 301, a capacitor 246, and a transistor 310 and the layer 60 including the light-emitting device 61R, the light-emitting device 61G, and the light-emitting device 61B. The layer 60 is provided over the insulating layer 363 included in the layer 50.

The transistor 310 includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover a side surface of the conductive layer 311.

An element isolation layer 315 is provided between two adjacent transistors 310 to be embedded in the substrate 301.

An insulating layer 261 is provided to cover the transistor 310, and a capacitor 246 is provided over the insulating layer 261.

The capacitor 246 includes a conductive layer 241, a conductive layer 245, and an insulating layer 243 positioned between these conductive layers. The conductive layer 241 functions as one electrode of the capacitor 246, the conductive layer 245 functions as the other electrode of the capacitor 246, and the insulating layer 243 functions as a dielectric of the capacitor 246.

The conductive layer 241 is provided over the insulating layer 261 and is embedded in an insulating layer 254. The conductive layer 241 is electrically connected to one of the source and the drain of the transistor 310 through a plug 266 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255 is provided to cover the capacitor 246, the insulating layer 363 is provided over the insulating layer 255, and the light-emitting device 61R, the light-emitting device 61G, and the light-emitting device 61B are provided over the insulating layer 363. A protective layer 415 is provided over the light-emitting device 61R, the light-emitting device 61G, and the light-emitting device 61B, and a substrate 420 is provided on the top surface of the protective layer 415 with the resin layer 419 therebetween.

The pixel electrode of the light-emitting device is electrically connected to one of the source and the drain of the transistor 310 through a plug 256 embedded in the insulating layer 255 and the insulating layer 363, the conductive layer 241 embedded in the insulating layer 254, and the plug 266 embedded in the insulating layer 261.

Figure 31:
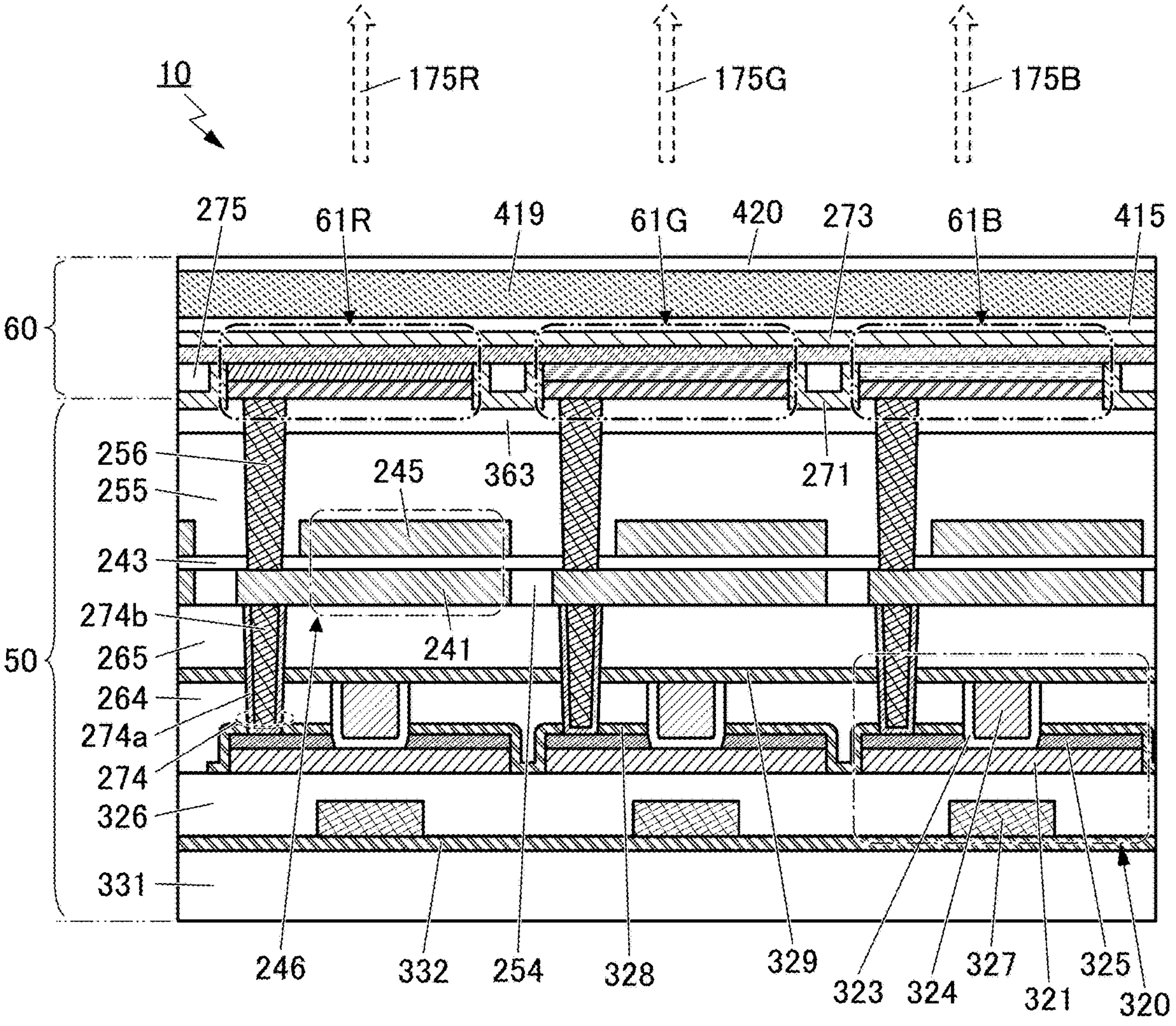
FIG. 31 is a cross-sectional view illustrating a structure example of the display apparatus.

FIG. 31 illustrates a modification example of the cross-sectional structure example illustrated in FIG. 30. A cross-sectional structure example of the display apparatus 10 illustrated in FIG. 31 is different from the cross-sectional structure example illustrated in FIG. 30 mainly in that the transistor 320 is provided instead of the transistor 310. Note that portions similar to those in FIG. 30 are not described in some cases.

The transistor 320 contains a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

As a substrate 331, an insulating substrate or a semiconductor substrate can be used.

An insulating layer 332 is provided over the substrate 331. The insulating layer 332 functions as a barrier layer that prevents diffusion of impurities such as water or hydrogen from the substrate 331 to the transistor 320 and release of oxygen from the semiconductor layer 321 to the insulating layer 332 side. As the insulating layer 332, for example, a film in which hydrogen or oxygen is unlikely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 which is in contact with the semiconductor layer 321. The top surface of the insulating layer 326 is preferably planarized.

The semiconductor layer 321 is provided over the insulating layer 326. A metal oxide film having semiconductor characteristics (also referred to as an oxide semiconductor film) is preferably used as the semiconductor layer 321. A material that can be suitably used for the semiconductor layer 321 will be described in detail later.

The pair of conductive layers 325 are provided over and in contact with the semiconductor layer 321, and function as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 or the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are subjected to planarization treatment so that they are substantially level with each other, and an insulating layer 329 and the insulating layer 265 are provided to cover these layers.

The insulating layer 264 and the insulating layer 265 each function as an interlayer insulating layer. The insulating layer 329 functions as a barrier layer that prevents diffusion of impurities such as water or hydrogen from the insulating layer 265 and the like to the transistor 320. As the insulating layer 329, an insulating film similar to the insulating layer 328 and the insulating layer 332 can be used.

The plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers the side surface of the opening in the insulating layer 265, the insulating layer 329, the insulating layer 264, and the insulating layer 328 and part of the top surface of the conductive layer 325, and a conductive layer 274*b* in contact with the top surface of the conductive layer 274*a*. In that case, a conductive material through which hydrogen and oxygen are unlikely to be diffused is preferably used for the conductive layer 274*a*.

Figure 32:
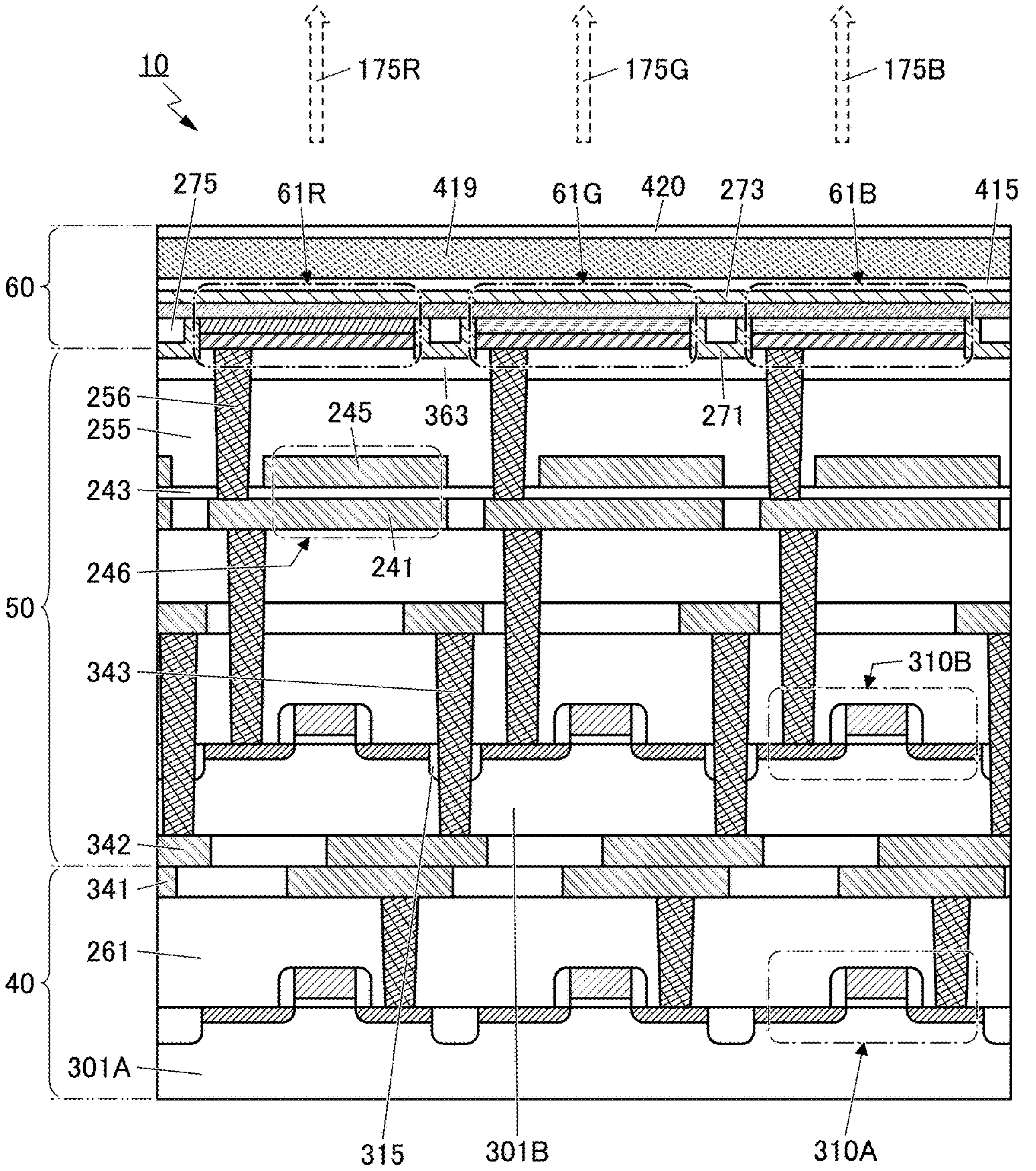
FIG. 32 is a cross-sectional view illustrating a structure example of the display apparatus.

FIG. 32 illustrates a cross-sectional structure example of part of the display apparatus 10 illustrated in FIG. 1B. The display apparatus 10 illustrated in FIG. 32 has a structure in which a transistor 310A in which a channel is formed in a substrate 301A included in the layer 40 and a transistor 310B in which a channel is formed in the substrate 301A included in the layer 40 are stacked. For the substrate 301A, a material similar to that of the substrate 301 can be used.

The display apparatus 10 illustrated in FIG. 32 has a structure in which the layer 60 provided with the light-emitting device 61, the layer 50 provided with a substrate 301B, the transistor 310B, and the capacitor 246, and the layer 40 provided with the substrate 301A and the transistor 310A are bonded to each other.

The substrate 301B is provided with a plug 343 that penetrates the substrate 301B. The plug 343 functions as a Si through electrode (TSV: Through Silicon Via). The plug 343 is electrically connected to a conductive layer 342 provided on a rear surface (a surface opposite to the substrate 420 side) of the substrate 301. Meanwhile, a conductive layer 341 is provided over the insulating layer 261 over the substrate 301A.

The conductive layer 341 and the conductive layer 342 are bonded to each other, whereby the layer 40 is electrically connected to the layer 50.

The conductive layer 341 and the conductive layer 342 are preferably formed using the same conductive material. For example, a metal film containing an element selected from Al, Cr, Cu, Ta, Sn, Zn, Au, Ag, Pt, Ti, Mo, and W, a metal nitride film containing any of the above elements as its component (a titanium nitride film, a molybdenum nitride film, or a tungsten nitride film), or the like can be used. Copper is particularly preferably used for the conductive layer 341 and the conductive layer 342. Thus, it is possible to employ a Cu—Cu (copper-to-copper) direct bonding technique (a technique for achieving electrical continuity by connecting Cu (copper) pads). Note that the conductive layer 341 and the conductive layer 342 may be bonded to each other with a bump therebetween.

Figure 33:
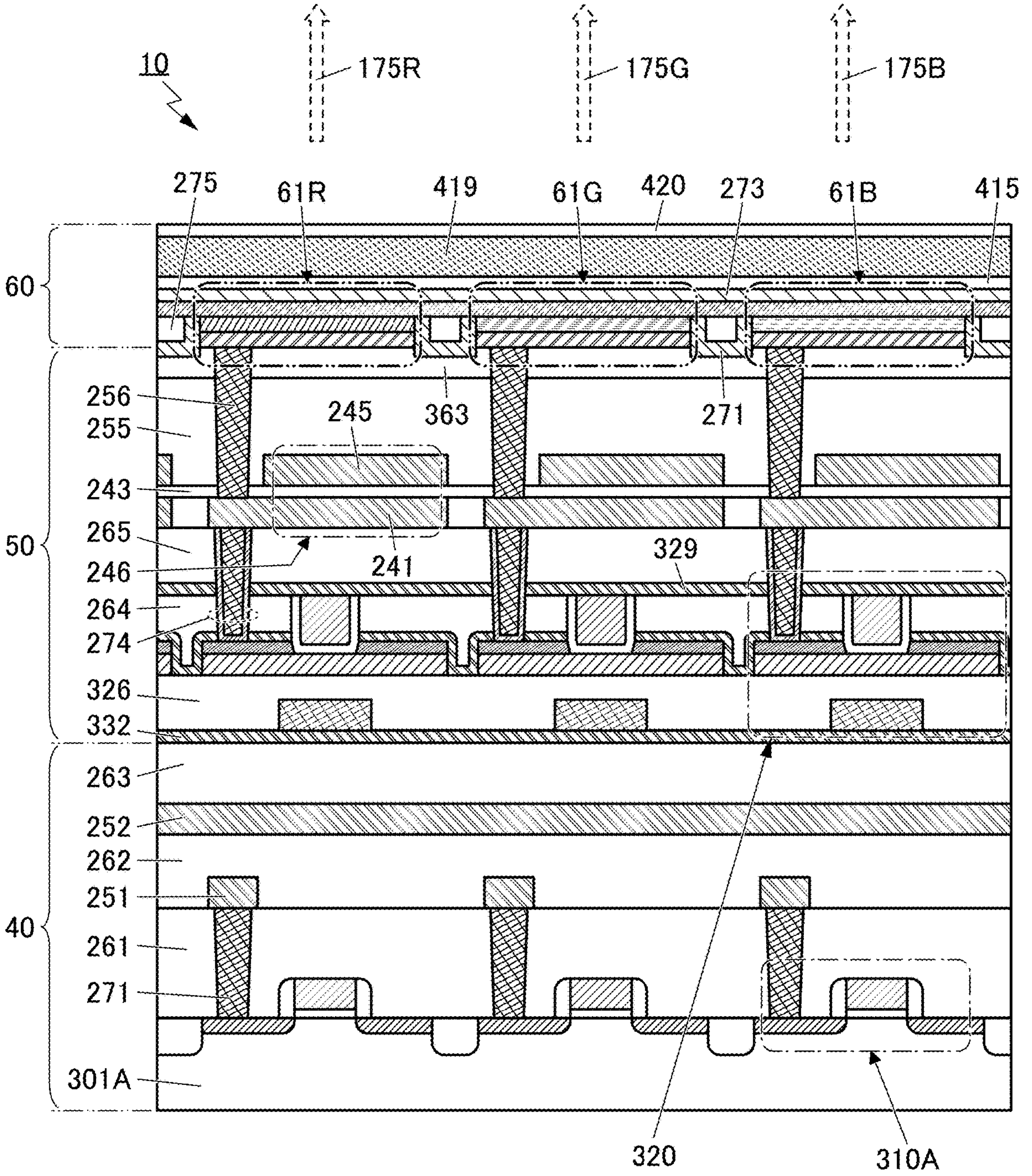
FIG. 33 is a cross-sectional view illustrating a structure example of the display apparatus.

FIG. 33 illustrates a modification example of the cross-sectional structure example illustrated in FIG. 32. In a cross-sectional structure example of the display apparatus 10 illustrated in FIG. 33, the transistor 310A whose channel is formed in the substrate 301A and the transistor 320 including a metal oxide in a semiconductor layer where a channel is formed are stacked. Note that portions similar to those in FIG. 30 to FIG. 32 are not described in some cases.

The layer 50 illustrated in FIG. 33 has a structure in which the substrate 331 is removed from the layer 50 illustrated in FIG. 31. In the layer 40 illustrated in FIG. 33, the insulating layer 261 is provided to cover the transistor 310A, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 246 is provided over the insulating layer 265. The capacitor 246 and the transistor 320 are electrically connected to each other through the plug 274. The layer 50 is provided to overlap with the insulating layer 263 included in the layer 40.

The transistor 320 can be used as a transistor included in the pixel circuit 51. The transistor 310 can be used as a transistor included in the pixel circuit 51 or a transistor included in a peripheral driver circuit. The transistor 310 and the transistor 320 can also be used as transistors included in a functional circuit such as an arithmetic circuit or a memory circuit.

With such a structure, not only the pixel circuit 51 but also the peripheral driver circuit or the like can be formed directly under the layer 60 including the light-emitting device 61. Thus, the size of the display apparatus can be reduced as compared with the case where a driver circuit is provided around the display region.

Note that dummy transistors and dummy layers are omitted in FIG. 30 to FIG. 33. In the top view, the proportion of the total area of layers provided on the same plane is preferably within the above-described range. When the proportion of the total area of layers provided on the same plane is increased, generation of foreign matter due to the resist mask can be inhibited in the manufacturing process, leading to an increase in manufacturing yield.

The structure described in this embodiment can be used in combination as appropriate with any of the structures described in the other embodiments and Examples.

Embodiment 3

In this embodiment, transistors that can be used in the semiconductor device of one embodiment of the present invention will be described.

Structure Example of Transistor

Figure 34A:
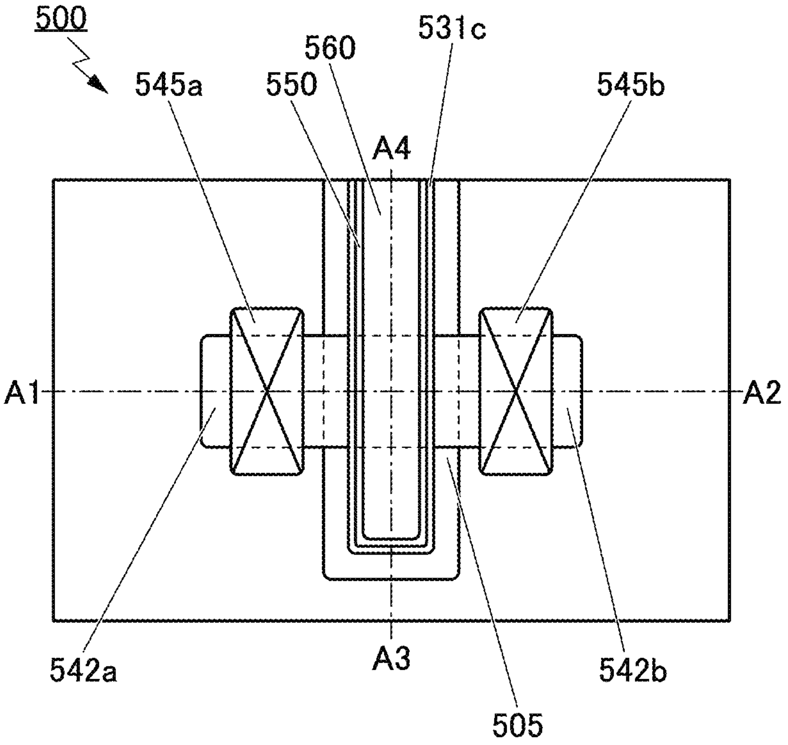
FIG. 34A is a top view illustrating a structure example of a transistor.
Figure 34C:
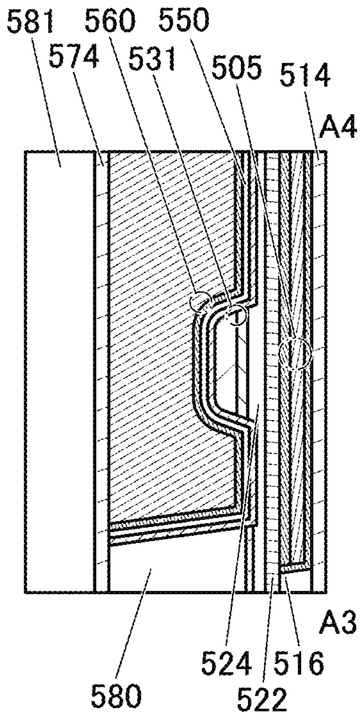
FIG. 34B and FIG. 34C are cross-sectional views illustrating the structure example of the transistor.
Figure 34B:
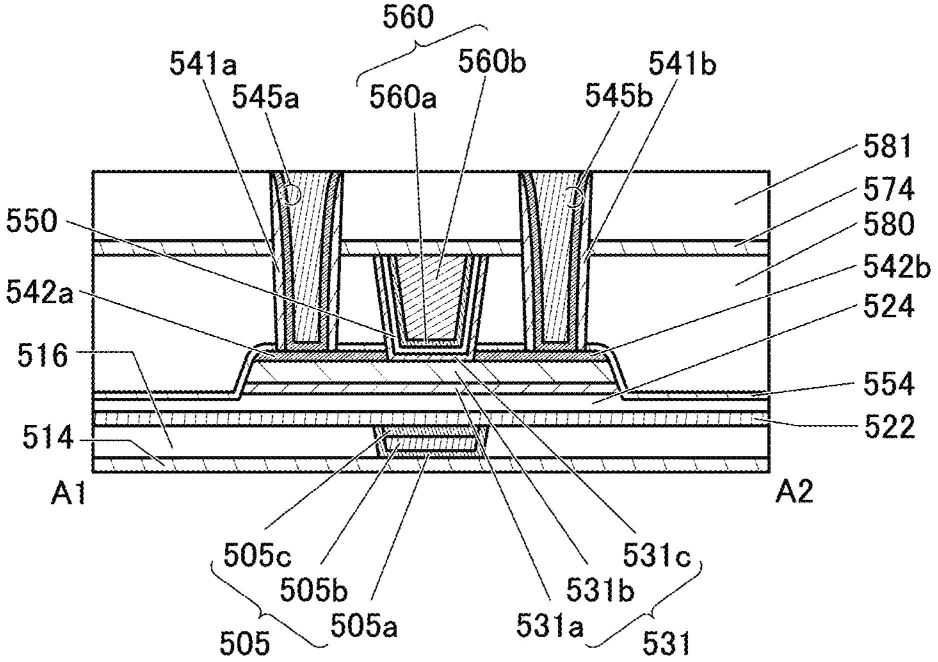

FIG. 34A, FIG. 34B, and FIG. 34C are a top view and cross-sectional views of a transistor 500 that can be used in the semiconductor device of one embodiment of the present invention. The transistor 500 can be used in the semiconductor device of one embodiment of the present invention.

FIG. 34A is the top view of the transistor 500. FIG. 34B and FIG. 34C are the cross-sectional views of the transistor 500. FIG. 34B is a cross-sectional view of a portion indicated by the dashed-dotted line A1-A2 in FIG. 34A and is a cross-sectional view of the transistor 500 in the channel length direction. FIG. 34C is a cross-sectional view of a portion indicated by the dashed-dotted line A3-A4 in FIG. 34A and is a cross-sectional view of the transistor 500 in the channel width direction. Note that some components are omitted in the top view of FIG. 34A for clarity of the drawing.

As illustrated in FIG. 34, the transistor 500 includes a metal oxide 531*a* placed over a substrate (not illustrated); a metal oxide 531*b* placed over the metal oxide 531*a*; a conductor 542*a* and a conductor 542*b* that are placed apart from each other over the metal oxide 531*b*; an insulator 580 that is placed over the conductor 542*a* and the conductor 542*b* and has an opening between the conductor 542*a* and the conductor 542*b*; a conductor 560 placed in the opening; an insulator 550 placed between the conductor 560 and the metal oxide 531*b*, the conductor 542*a*, the conductor 542*b*, and the insulator 580; and a metal oxide 531*c* placed between the insulator 550 and the metal oxide 531*b*, the conductor 542*a*, the conductor 542*b*, and the insulator 580. Here, as illustrated in FIG. 34B and FIG. 34C, preferably, the top surface of the conductor 560 is substantially level with the top surfaces of the insulator 550, an insulator 554, the metal oxide 531*c*, and the insulator 580. Hereinafter, the metal oxide 531*a*, the metal oxide 531*b*, and the metal oxide 531*c* may be collectively referred to as a metal oxide 531. The conductor 542*a* and the conductor 542*b* may be collectively referred to as a conductor 542.

In the transistor 500 illustrated in FIG. 34, the side surfaces of the conductor 542*a* and the conductor 542*b* on the conductor 560 side are substantially perpendicular. Note that the transistor 500 illustrated in FIG. 34 is not limited thereto, and the angle formed between the side surfaces and bottom surfaces of the conductor 542*a* and the conductor 542*b* may be greater than or equal to 10° and less than or equal to 80°, preferably greater than or equal to 30° and less than or equal to 60°. The side surfaces of the conductor 542*a* and the conductor 542*b* that face each other may have a plurality of surfaces.

As illustrated in FIG. 34, the insulator 554 is preferably placed between the insulator 580 and the insulator 524, the metal oxide 531*a*, the metal oxide 531*b*, the conductor 542*a*, the conductor 542*b*, and the metal oxide 531*c*. Here, as illustrated in FIG. 34B and FIG. 34C, the insulator 554 is preferably in contact with the side surface of the metal oxide 531*c*, the top surface and side surface of the conductor 542*a*, the top surface and side surface of the conductor 542*b*, the side surfaces of the metal oxide 531*a* and the metal oxide 531*b*, and the top surface of the insulator 524.

In the transistor 500, three layers of the metal oxide 531*a*, the metal oxide 531*b*, and the metal oxide 531*c* are stacked in and around a channel formation region; however, the present invention is not limited thereto. For example, a two-layer structure of the metal oxide 531*b* and the metal oxide 531*c* or a stacked-layer structure of four or more layers may be employed. Although the conductor 560 is illustrated to have a stacked-layer structure of two layers in the transistor 500, the present invention is not limited thereto. For example, the conductor 560 may have a single-layer structure or a stacked-layer structure of three or more layers. Furthermore, each of the metal oxide 531*a*, the metal oxide 531*b*, and the metal oxide 531*c* may have a stacked-layer structure of two or more layers.

For example, in the case where the metal oxide 531*c* has a stacked-layer structure including a first metal oxide and a second metal oxide over the first metal oxide, the first metal oxide preferably has a composition similar to that of the metal oxide 531*b* and the second metal oxide preferably has a composition similar to that of the metal oxide 531*a*.

Here, the conductor 560 functions as a gate electrode of the transistor, and the conductor 542*a* and the conductor 542*b* function as a source electrode and a drain electrode. As described above, the conductor 560 is formed to be embedded in the opening of the insulator 580 and the region between the conductor 542*a* and the conductor 542*b*. Here, the positions of the conductor 560, the conductor 542*a*, and the conductor 542*b* are selected in a self-aligned manner with respect to the opening of the insulator 580. In other words, in the transistor 500, the gate electrode can be placed between the source electrode and the drain electrode in a self-aligned manner. Therefore, the conductor 560 can be formed without an alignment margin, resulting in a reduction in the area of the transistor 500. Accordingly, the display apparatus can have high resolution. In addition, the display apparatus can have a narrow bezel.

As illustrated in FIG. 34, the conductor 560 preferably includes a conductor 560*a* provided inside the insulator 550 and a conductor 560*b* provided to be embedded inside the conductor 560*b*.

The transistor 500 preferably includes an insulator 514 placed over the substrate (not illustrated); an insulator 516 placed over the insulator 514; a conductor 505 placed to be embedded in the insulator 516; an insulator 522 placed over the insulator 516 and the conductor 505; and the insulator 524 placed over the insulator 522. The metal oxide 531*a* is preferably placed over the insulator 524.

An insulator 574 and an insulator 581 functioning as interlayer films are preferably placed over the transistor 500. Here, the insulator 574 is preferably placed in contact with the top surfaces of the conductor 560, the insulator 550, the insulator 554, the metal oxide 531*c*, and the insulator 580.

The insulator 522, the insulator 554, and the insulator 574 preferably have a function of inhibiting diffusion of hydrogen (e.g., at least one of a hydrogen atom, a hydrogen molecule, and the like). For example, the insulator 522, the insulator 554, and the insulator 574 preferably have a lower hydrogen permeability than the insulator 524, the insulator 550, and the insulator 580. Moreover, the insulator 522 and the insulator 554 preferably have a function of inhibiting diffusion of oxygen (e.g., at least one of an oxygen atom, an oxygen molecule, and the like). For example, the insulator 522 and the insulator 554 preferably have a lower oxygen permeability than the insulator 524, the insulator 550, and the insulator 580.

Here, the insulator 524, the metal oxide 531, and the insulator 550 are separated from the insulator 580 and the insulator 581 by the insulator 554 and the insulator 574. This can inhibit the entry of impurities such as hydrogen contained in the insulator 580 and the insulator 581 into the insulator 524, the metal oxide 531, and the insulator 550 and excess oxygen into the insulator 524, the metal oxide 531*a*, the metal oxide 531*b*, and the insulator 550.

A conductor 545 (a conductor 545*a* and a conductor 545*b*) that is electrically connected to the transistor 500 and functions as a plug is preferably provided. Note that an insulator 541 (an insulator 541*a* and an insulator 541*b*) is provided in contact with a side surface of the conductor 545 functioning as a plug. In other words, the insulator 541 is provided in contact with the inner wall of an opening in the insulator 554, the insulator 580, the insulator 574, and the insulator 581. In addition, a structure may be employed in which a first conductor of the conductor 545 is provided in contact with the side surface of the insulator 541 and a second conductor of the conductor 545 is provided on the inner side of the first conductor. Here, the top surface of the conductor 545 and the top surface of the insulator 581 can be substantially level with each other. Although the transistor 500 has a structure in which the first conductor of the conductor 545 and the second conductor of the conductor 545 are stacked, the present invention is not limited thereto. For example, the conductor 545 may have a single-layer structure or a stacked-layer structure of three or more layers. In the case where a component has a stacked-layer structure, layers may be distinguished by ordinal numbers given corresponding to the formation order.

In the transistor 500, a metal oxide functioning as an oxide semiconductor (hereinafter, also referred to as an oxide semiconductor) is preferably used as the metal oxide 531 including the channel formation region (the metal oxide 531*a*, the metal oxide 531*b*, and the metal oxide 531*c*). For example, it is preferable to use a metal oxide having a band gap of 2 eV or more, preferably 2.5 eV or more as the metal oxide to be the channel formation region of the metal oxide 531.

The metal oxide preferably contains at least indium (In) or zinc (Zn). In particular, indium (In) and zinc (Zn) are preferably contained. In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). The element M further preferably contains one or both of Ga and Sn.

As illustrated in FIG. 34B, the metal oxide 531*b* in a region that does not overlap with the conductor 542 sometimes has a smaller thickness than the metal oxide 531*b* in a region that overlaps with the conductor 542. The thin region is formed when part of the top surface of the metal oxide 531*b* is removed at the time of forming the conductor 542*a* and the conductor 542*b*. When a conductive film to be the conductor 542 is formed, a low-resistance region is sometimes formed on the top surface of the metal oxide 531*b* in the vicinity of the interface with the conductive film. Removing the low-resistance region positioned between the conductor 542*a* and the conductor 542*b* on the top surface of the metal oxide 531*b* in the above manner can prevent formation of the channel in the region.

According to one embodiment of the present invention, a display apparatus that includes small-size transistors and has high resolution can be provided. A display apparatus that includes a transistor with a high on-state current and has high luminance can be provided. A display apparatus that includes a transistor operating at high speed and thus operates at high speed can be provided. A display apparatus that includes a transistor having stable electrical characteristics and is highly reliable can be provided. A display apparatus that includes a transistor with a low off-state current and has low power consumption can be provided.

The structure of the transistor 500 that can be used in the display apparatus of one embodiment of the present invention is described in detail.

The conductor 505 is placed to include a region overlapping with the metal oxide 531 and the conductor 560. Furthermore, the conductor 505 is preferably provided to be embedded in the insulator 516.

The conductor 505 includes a conductor 505*a*, a conductor 505*b*, and a conductor 505*c*. The conductor 505*a* is provided in contact with the bottom surface and the sidewall of the opening provided in the insulator 516. The conductor 505*b* is provided to be embedded in a recessed portion formed by the conductor 505*a*. Here, the top surface of the conductor 505*b* is lower in level than the top surface of the conductor 505*a* and the top surface of the insulator 516. The conductor 505*c* is provided in contact with the top surface of the conductor 505*b* and the side surface of the conductor 505*a*. Here, the top surface of the conductor 505*c* is substantially level with the top surface of the conductor 505*a* and the top surface of the insulator 516. That is, the conductor 505*b* is surrounded by the conductor 505*a* and the conductor 505*c*.

Here, for the conductor 505*a* and the conductor 505*c*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 505*a* and the conductor 505*c* are formed using a conductive material having a function of inhibiting diffusion of hydrogen, impurities such as hydrogen contained in the conductor 505*b* can be inhibited from diffusing into the metal oxide 531 through the insulator 524 and the like. When the conductor 505*a* and the conductor 505*c* are formed using a conductive material having a function of inhibiting diffusion of oxygen, the conductivity of the conductor 505*b* can be inhibited from being lowered because of oxidation. As the conductive material having a function of inhibiting diffusion of oxygen, for example, titanium, titanium nitride, tantalum, tantalum nitride, ruthenium, ruthenium oxide, or the like is preferably used. Thus, the conductor 505*a* is a single layer or stacked layers of the above conductive materials. For example, titanium nitride is used for the conductor 505*a*.

The conductor 505*b* is preferably formed using a conductive material containing tungsten, copper, or aluminum as its main component. For example, tungsten is used for the conductor 505*b*.

The conductor 560 sometimes functions as a first gate (also referred to as top gate) electrode. The conductor 505 sometimes functions as a second gate (also referred to as bottom gate) electrode. In that case, Vth of the transistor 500 can be controlled by changing a potential applied to the conductor 505 independently of a potential applied to the conductor 560. In particular, by applying a negative potential to the conductor 505, Vth of the transistor 500 can be higher than 0 V and the off-state current can be made low. Thus, a drain current at the time when a potential applied to the conductor 560 is 0 V can be lower in the case where a negative potential is applied to the conductor 505 than in the case where a negative potential is not applied to the conductor 505.

The conductor 505 is preferably provided to be larger than the channel formation region in the metal oxide 531. In particular, it is preferable that the conductor 505 extend beyond an end portion of the metal oxide 531 that intersects with the channel width direction, as illustrated in FIG. 34C. In other words, the conductor 505 and the conductor 560 preferably overlap with each other with the insulator positioned therebetween, in a region outside the side surface of the metal oxide 531 in the channel width direction.

With the above structure, the channel formation region of the metal oxide 531 can be electrically surrounded by electric fields of the conductor 560 having a function of the first gate electrode and electric fields of the conductor 505 having a function of the second gate electrode.

As illustrated in FIG. 34C, the conductor 505 extends to function as a wiring as well. However, without limitation to this structure, a structure in which a conductor functioning as a wiring is provided below the conductor 505 may be employed.

The insulator 514 preferably functions as a barrier insulating film that inhibits the entry of impurities such as water or hydrogen to the transistor 500 from the substrate side. Accordingly, it is preferable to use, for the insulator 514, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the impurities are unlikely to pass). Alternatively, it is preferable to use an insulating material having a function of inhibiting diffusion of oxygen (e.g., at least one of an oxygen atom, an oxygen molecule, and the like) (an insulating material through which the oxygen is unlikely to pass).

For example, aluminum oxide, silicon nitride, or the like is preferably used for the insulator 514. Accordingly, it is possible to inhibit diffusion of impurities such as water or hydrogen to the transistor 500 side from the substrate side through the insulator 514. Alternatively, it is possible to inhibit diffusion of oxygen contained in the insulator 524 and the like to the substrate side through the insulator 514.

The permittivity of each of the insulator 516, the insulator 580, and the insulator 581 functioning as an interlayer film is preferably lower than that of the insulator 514. When a material with a low permittivity is used for an interlayer film, the parasitic capacitance generated between wirings can be reduced. For the insulator 516, the insulator 580, and the insulator 581, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 522 and the insulator 524 each function as a gate insulator.

Here, the insulator 524 in contact with the metal oxide 531 preferably releases oxygen by heating. In this specification, oxygen that is released by heating is referred to as excess oxygen in some cases. For example, silicon oxide, silicon oxynitride, or the like can be used as appropriate for the insulator 524. When an insulator containing oxygen is provided in contact with the metal oxide 531, oxygen vacancies in the metal oxide 531 can be reduced, leading to improved reliability of the transistor 500.

Specifically, an oxide material that releases part of oxygen by heating is preferably used for the insulator 524. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably within the range of 100° C. to 700° C. or 100° C. to 400° C.

As illustrated in FIG. 34C, the insulator 524 is sometimes thinner in a region that overlaps with neither the insulator 554 nor the metal oxide 531*b* than in the other regions. In the insulator 524, the region that overlaps with neither the insulator 554 nor the metal oxide 531*b* preferably has a thickness with which the above oxygen can be adequately diffused.

Like the insulator 514 and the like, the insulator 522 preferably functions as a barrier insulating film that inhibits the entry of impurities such as water or hydrogen into the transistor 500 from the substrate side. For example, the insulator 522 preferably has a lower hydrogen permeability than the insulator 524. When the insulator 524, the metal oxide 531, the insulator 550, and the like are surrounded by the insulator 522, the insulator 554, and the insulator 574, the entry of impurities such as water or hydrogen into the transistor 500 from outside can be inhibited.

Furthermore, it is preferable that the insulator 522 have a function of inhibiting diffusion of oxygen (e.g., at least one of an oxygen atom, an oxygen molecule, and the like) (it is preferable that the oxygen be less likely to pass through the insulator 522). For example, the insulator 522 preferably has a lower oxygen permeability than the insulator 524. The insulator 522 preferably has a function of inhibiting diffusion of oxygen and impurities, in which case oxygen contained in the metal oxide 531 is less likely to diffuse to the substrate side. Moreover, the conductor 505 can be inhibited from reacting with oxygen contained in the insulator 524 and the metal oxide 531.

As the insulator 522, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer inhibiting release of oxygen from the metal oxide 531 and entry of impurities such as hydrogen into the metal oxide 531 from the periphery of the transistor 500.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over any of the above insulators.

The insulator 522 may be a single layer or a stacked layer using an insulator containing what is called a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST). With further miniaturization and higher integration of a transistor, a problem such as generation of leakage current may arise because of a thinned gate insulator. When a high-k material is used for the insulator functioning as a gate insulator, a gate potential at the time of the operation of the transistor can be reduced while the physical thickness is maintained.

Note that the insulator 522 and the insulator 524 may each have a stacked-layer structure of two or more layers. In that case, without limitation to a stacked-layer structure formed of the same material, a stacked-layer structure formed of different materials may be employed. For example, an insulator similar to the insulator 524 may be provided below the insulator 522.

The metal oxide 531 includes the metal oxide 531*a*, the metal oxide 531*b* over the metal oxide 531*a*, and the metal oxide 531*c* over the metal oxide 531*b*. When the metal oxide 531 includes the metal oxide 531*a* under the metal oxide 531*b*, it is possible to inhibit diffusion of impurities into the metal oxide 531*b* from the components formed below the metal oxide 531*a*. Moreover, when the metal oxide 531 includes the metal oxide 531*c* over the metal oxide 531*b*, it is possible to inhibit diffusion of impurities into the metal oxide 531*b* from the components formed above the metal oxide 531*c*.

Note that the metal oxide 531 preferably has a stacked-layer structure of a plurality of oxide layers that differ in the atomic ratio of metal atoms. For example, in the case where the metal oxide 531 contains at least indium (In) and the element M, the proportion of the number of atoms of the element M contained in the metal oxide 531*a* to the number of atoms of all elements that constitute the metal oxide 531*a* is preferably higher than the proportion of the number of atoms of the element M contained in the metal oxide 531*b* to the number of atoms of all elements that constitute the metal oxide 531*b*. In addition, the atomic ratio of the element M to In in the metal oxide 531*a* is preferably greater than the atomic ratio of the element M to In in the metal oxide 531*b*. Here, a metal oxide that can be used as the metal oxide 531*a* or the metal oxide 531*b* can be used as the metal oxide 531*c*.

The energy of the conduction band minimum of each of the metal oxide 531*a* and the metal oxide 531*c* is preferably higher than the energy of the conduction band minimum of the metal oxide 531*b*. In other words, the electron affinity of each of the metal oxide 531*a* and the metal oxide 531*c* is preferably smaller than the electron affinity of the metal oxide 531*b*. In this case, a metal oxide that can be used as the metal oxide 531*a* is preferably used as the metal oxide 531*c*. Specifically, the proportion of the number of atoms of the element M contained in the metal oxide 531*c* to the number of atoms of all elements that constitute the metal oxide 531*c* is preferably higher than the proportion of the number of atoms of the element M contained in the metal oxide 531*b* to the number of atoms of all elements that constitute the metal oxide 531*b*. In addition, the atomic ratio of the element M to In in the metal oxide 531*c* is preferably greater than the atomic ratio of the element M to In in the metal oxide 531*b*.

Here, the energy level of the conduction band minimum gently changes at junction portions between the metal oxide 531*a*, the metal oxide 531*b*, and the metal oxide 531*c*. In other words, at junction portions between the metal oxide 531*a*, the metal oxide 531*b*, and the metal oxide 531*c*, the energy level of the conduction band minimum continuously changes or the energy levels are continuously connected. This can be achieved by decreasing the density of defect states in a mixed layer formed at the interface between the metal oxide 531*a* and the metal oxide 531*b* and the interface between the metal oxide 531*b* and the metal oxide 531*c*.

Specifically, when the metal oxide 531*a* and the metal oxide 531*b* or the metal oxide 531*b* and the metal oxide 531*c* contain the same element (as a main component) in addition to oxygen, a mixed layer with a low density of defect states can be formed. For example, an In—Ga—Zn oxide, a Ga—Zn oxide, gallium oxide, or the like may be used as the metal oxide 531*a* and the metal oxide 531*c*, in the case where the metal oxide 531*b* is an In—Ga—Zn oxide. The metal oxide 531*c* may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 531*c* may have a stacked-layer structure of an In—Ga—Zn oxide and an oxide that does not contain In.

Specifically, as the metal oxide 531*a*, a metal oxide with In:Ga:Zn=1:3:4 [atomic ratio] or 1:1:0.5 [atomic ratio] can be used. As the metal oxide 531*b*, a metal oxide with In:Ga:Zn=4:2:3 [atomic ratio] or 3:1:2 [atomic ratio] can be used. As the metal oxide 531*c*, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 531*c* include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and a layer of gallium oxide.

In this case, the metal oxide 531*b* serves as a main carrier path. When the metal oxide 531*a* and the metal oxide 531*c* have the above structure, the density of defect states at the interface between the metal oxide 531*a* and the metal oxide 531*b* and the interface between the metal oxide 531*b* and the metal oxide 531*c* can be made low. Thus, the influence of interface scattering on carrier conduction is small, and the transistor 500 can have a high on-state current and high frequency characteristics. Note that in the case where the metal oxide 531*c* has a stacked-layer structure, not only the effect of reducing the density of defect states at the interface between the metal oxide 531*b* and the metal oxide 531*c*, but also the effect of inhibiting diffusion of the constituent element contained in the metal oxide 531*c* to the insulator 550 side can be expected. Specifically, the metal oxide 531*c* has a stacked-layer structure in which an oxide not containing In is positioned in the upper layer of the stacked-layer structure, whereby the diffusion of In to the insulator 550 side can be inhibited. Since the insulator 550 functions as a gate insulator, the transistor has defects in characteristics when In diffuses. Thus, the metal oxide 531*c* having a stacked-layer structure allows a highly reliable display apparatus to be provided.

The conductor 542 (the conductor 542*a* and the conductor 542*b*) functioning as the source electrode and the drain electrode is provided over the metal oxide 531*b*. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen.

When the conductor 542 is provided in contact with the metal oxide 531, the oxygen concentration of the metal oxide 531 in the vicinity of the conductor 542 sometimes decreases. In addition, a metal compound layer that contains the metal contained in the conductor 542 and the component of the metal oxide 531 is sometimes formed in the metal oxide 531 in the vicinity of the conductor 542. In such cases, the carrier density of the region in the metal oxide 531 in the vicinity of the conductor 542 increases, and the region becomes a low-resistance region.

Here, the region between the conductor 542*a* and the conductor 542*b* is formed to overlap with the opening of the insulator 580. Accordingly, the conductor 560 can be placed in a self-aligned manner between the conductor 542*a* and the conductor 542*b*.

The insulator 550 functions as a gate insulator. The insulator 550 is preferably positioned in contact with the top surface of the metal oxide 531*c*. For the insulator 550, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 524, the concentration of impurities such as water or hydrogen in the insulator 550 is preferably reduced. The thickness of the insulator 550 is preferably greater than or equal to 1 nm and less than or equal to 20 nm.

A metal oxide may be provided between the insulator 550 and the conductor 560. The metal oxide preferably inhibits diffusion of oxygen from the insulator 550 to the conductor 560. Accordingly, oxidation of the conductor 560 due to oxygen in the insulator 550 can be inhibited.

The metal oxide functions as part of the gate insulator in some cases. Therefore, when silicon oxide, silicon oxynitride, or the like is used for the insulator 550, a metal oxide that is a high-k material with a high relative permittivity is preferably used as the metal oxide. When the gate insulator has a stacked-layer structure of the insulator 550 and the metal oxide, the stacked-layer structure can be thermally stable and have a high relative permittivity. Accordingly, a gate potential applied during the operation of the transistor can be reduced while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although the conductor 560 has a two-layer structure in FIG. 34, the conductor 560 may have a single-layer structure or a stacked-layer structure of three or more layers.

The conductor 560*a* is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom, an oxygen molecule, and the like).

When the conductor 560*a* has a function of inhibiting diffusion of oxygen, it is possible to inhibit a reduction in conductivity of the conductor 560*b* due to oxidation caused by oxygen contained in the insulator 550. As a conductive material having a function of inhibiting oxygen diffusion, for example, tantalum, tantalum nitride, ruthenium, ruthenium oxide, or the like is preferably used.

The conductor 560*b* is preferably formed using a conductive material containing tungsten, copper, or aluminum as its main component. Furthermore, the conductor 560 also functions as a wiring and thus is preferably a conductor having high conductivity. For example, a conductive material containing tungsten, copper, or aluminum as its main component can be used. Moreover, the conductor 560*b* may have a stacked-layer structure, for example, a stacked-layer structure of the above conductive material and titanium or titanium nitride.

As illustrated in FIG. 34A and FIG. 34C, the side surface of the metal oxide 531 is covered with the conductor 560 in a region where the metal oxide 531*b* does not overlap with the conductor 542, that is, the channel formation region of the metal oxide 531. Accordingly, the electric field of the conductor 560 functioning as the first gate electrode is likely to act on the side surface of the metal oxide 531. Thus, the on-state current of the transistor 500 can be increased and the frequency characteristics can be improved.

The insulator 554, like the insulator 514 and the like, preferably functions as a barrier insulating film that inhibits the entry of impurities such as water or hydrogen into the transistor 500 from the insulator 580 side. The insulator 554 preferably has a lower hydrogen permeability than the insulator 524, for example. Furthermore, as illustrated in FIG. 34B and FIG. 34C, the insulator 554 is preferably in contact with the side surface of the metal oxide 531*c*, the top and side surfaces of the conductor 542*a*, the top and side surfaces of the conductor 542*b*, the side surfaces of the metal oxide 531*a* and the metal oxide 531*b*, and the top surface of the insulator 524. Such a structure can inhibit the entry of hydrogen contained in the insulator 580 into the metal oxide 531 through the top surfaces or side surfaces of the conductor 542*a*, the conductor 542*b*, the metal oxide 531*a*, the metal oxide 531*b*, and the insulator 524.

Furthermore, it is preferable that the insulator 554 have a function of inhibiting diffusion of oxygen (e.g., at least one of an oxygen atom, an oxygen molecule, and the like) (it is preferable that the oxygen be unlikely to pass through the insulator 554). For example, the insulator 554 preferably has a lower oxygen permeability than the insulator 580 or the insulator 524.

The insulator 554 is preferably formed by a sputtering method. When the insulator 554 is formed by a sputtering method in an oxygen-containing atmosphere, oxygen can be added to the vicinity of a region of the insulator 524 that is in contact with the insulator 554. Thus, oxygen can be supplied from the region to the metal oxide 531 through the insulator 524. Here, with the insulator 554 having a function of inhibiting upward diffusion of oxygen, oxygen can be prevented from diffusing from the metal oxide 531 into the insulator 580. Moreover, with the insulator 522 having a function of inhibiting downward diffusion of oxygen, oxygen can be prevented from diffusing from the metal oxide 531 to the substrate side. In the above manner, oxygen is supplied to the channel formation region of the metal oxide 531. Accordingly, oxygen vacancies in the metal oxide 531 can be reduced, so that the transistor can be prevented from having normally-on characteristics.

As the insulator 554, an insulator containing an oxide of one or both of aluminum and hafnium is preferably formed, for example. Note that as the insulator containing an oxide of one or both of aluminum and hafnium, aluminum oxide, hafnium oxide, an oxide containing aluminum and hafnium (hafnium aluminate), or the like is preferably used.

The insulator 524, the insulator 550, and the metal oxide 531 are covered with the insulator 554 having a barrier property against hydrogen, whereby the insulator 580 is isolated from the insulator 524, the metal oxide 531, and the insulator 550 by the insulator 554. This can inhibit the entry of impurities such as hydrogen from outside of the transistor 500, resulting in favorable electrical characteristics and high reliability of the transistor 500.

The insulator 580 is provided over the insulator 524, the metal oxide 531, and the conductor 542 with the insulator 554 therebetween. The insulator 580 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride, which are thermally stable, are preferable. In particular, materials such as silicon oxide, silicon oxynitride, and porous silicon oxide are preferably used, in which case a region containing oxygen to be released by heating can be easily formed.

The concentration of impurities such as water or hydrogen in the insulator 580 is preferably reduced. In addition, the top surface of the insulator 580 may be planarized.

Like the insulator 514 and the like, the insulator 574 preferably functions as a barrier insulating film that inhibits the entry of impurities such as water or hydrogen into the insulator 580 from above. As the insulator 574, for example, the insulator that can be used as the insulator 514, the insulator 554, and the like can be used.

The insulator 581 functioning as an interlayer film is preferably provided over the insulator 574. As in the insulator 524 or the like, the concentration of impurities such as water or hydrogen in the insulator 581 is preferably reduced.

The conductor 545*a* and the conductor 545*b* are placed in openings formed in the insulator 581, the insulator 574, the insulator 580, and the insulator 554. The conductor 545*a* and the conductor 545*b* are provided to face each other with the conductor 560 therebetween. Note that the top surfaces of the conductor 545*a* and the conductor 545*b* may be on the same plane as the top surface of the insulator 581.

The insulator 541*a* is provided in contact with the inner wall of the opening in the insulator 581, the insulator 574, the insulator 580, and the insulator 554, and the first conductor of the conductor 545*a* is formed in contact with the side surface of the insulator 541*a*. The conductor 542*a* is positioned on at least part of the bottom portion of the opening, and the conductor 545*a* is in contact with the conductor 542*a*. Similarly, the insulator 541*b* is provided in contact with the inner wall of the opening in the insulator 581, the insulator 574, the insulator 580, and the insulator 554, and the first conductor of the conductor 545*b* is formed in contact with the side surface of the insulator 541*b*. The conductor 542*b* is positioned on at least part of the bottom portion of the opening, and the conductor 545*b* is in contact with the conductor 542*b*.

The conductor 545*a* and the conductor 545*b* are preferably formed using a conductive material containing tungsten, copper, or aluminum as its main component. The conductor 545*a* and the conductor 545*b* may have a stacked-layer structure.

In the case where the conductor 545 has a stacked-layer structure, the aforementioned conductor having a function of inhibiting diffusion of impurities such as water or hydrogen is preferably used as the conductor in contact with the metal oxide 531*a*, the metal oxide 531*b*, the conductor 542, the insulator 554, the insulator 580, the insulator 574, and the insulator 581. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can inhibit oxygen added to the insulator 580 from being absorbed by the conductor 545*a* and the conductor 545*b*. Moreover, impurities such as water or hydrogen can be inhibited from entering the metal oxide 531 through the conductor 545*a* and the conductor 545*b* from a layer above the insulator 581.

As the insulator 541*a* and the insulator 541*b*, for example, the insulator that can be used as the insulator 554 or the like can be used. Since the insulator 541*a* and the insulator 541*b* are provided in contact with the insulator 554, impurities such as water or hydrogen in the insulator 580 or the like can be inhibited from entering the metal oxide 531 through the conductor 545*a* and the conductor 545*b*. Furthermore, oxygen contained in the insulator 580 can be inhibited from being absorbed by the conductor 545*a* and the conductor 545*b*.

Although not illustrated, a conductor functioning as a wiring may be placed in contact with the top surface of the conductor 545*a* and the top surface of the conductor 545*b*.

For the conductor functioning as a wiring, a conductive material containing tungsten, copper, or aluminum as its main component is preferably used. Furthermore, the conductor may have a stacked-layer structure and may be a stack of titanium or titanium nitride and the above conductive material, for example. Note that the conductor may be formed to be embedded in an opening provided in an insulator.

<Materials for Transistor>

Materials that can be used for the transistor will be described.

[Substrate]

As a substrate where the transistor 500 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided for the substrates include a capacitor, a resistor, a switching element, a light-emitting device, and a memory element.

[Insulator]

Examples of an insulator include an oxide, a nitride, an oxynitride, a nitride oxide, a metal oxide, a metal oxynitride, and a metal nitride oxide, each of which has an insulating property.

With further miniaturization and higher integration of a transistor, for example, a problem such as generation of a leakage current may arise because of a thinned gate insulator. When a high-k material is used for the insulator functioning as a gate insulator, the voltage at the time of the operation of the transistor can be reduced while the physical thickness is maintained. By contrast, when a material with a low relative permittivity is used for the insulator functioning as an interlayer film, the parasitic capacitance generated between wirings can be reduced. Thus, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including an oxide semiconductor is surrounded by insulators having a function of inhibiting the passage of oxygen and impurities such as hydrogen (e.g., the insulator 514, the insulator 522, the insulator 554, and the insulator 574), the electrical characteristics of the transistor can be stable. An insulator having a function of inhibiting the passage of oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator is preferably an insulator including a region containing oxygen to be released by heating. For example, when a structure is employed in which silicon oxide or silicon oxynitride that includes a region containing oxygen to be released by heating is provided in contact with the metal oxide 531, oxygen vacancies included in the metal oxide 531 can be compensated for.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A plurality of conductors formed using any of the above materials may be stacked. For example, a stacked-layer structure combining a material containing the above metal element and a conductive material containing oxygen may be employed. In addition, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably has a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. A conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

At least part of this embodiment can be implemented in combination with the other embodiments described in this specification as appropriate.

The structure described above in this embodiment can be used in combination as appropriate with any of the structures described in the other embodiments and Examples.

Embodiment 4

Described in this embodiment is a metal oxide (hereinafter, also referred to as an oxide semiconductor) that can be used in the OS transistor described in the above embodiment.

<Classification of Crystal Structure>

First, the classification of the crystal structures of an oxide semiconductor will be described with reference to FIG. 35A. FIG. 35A is a diagram showing the classification of crystal structures of an oxide semiconductor, typically IGZO (a metal oxide containing In, Ga, and Zn).

As shown in FIG. 35A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and polycrystal). Note that in the classification of "Crystalline," single crystal, poly crystal, and completely amorphous are excluded. The term "Crystal" includes single crystal and poly crystal.

Note that the structures in the thick frame shown in FIG. 35A are in an intermediate state between "Amorphous" and "Crystal", and belong to a new crystalline phase. That is, these structures are completely different from "Crystal" and "Amorphous", which is energetically unstable.

Note that a crystal structure of a film or a substrate can be evaluated with an X-ray diffraction (XRD) spectrum. FIG. 35B shows an XRD spectrum, which is obtained by GIXD (Grazing-Incidence XRD) measurement, of a CAAC-IGZO film classified into "Crystalline" (the horizontal axis represents 20 [deg.], and the vertical axis represents intensity in arbitrary unit (a.u.)). Note that a GIXD method is also referred to as a thin film method or a Seemann-Bohlin method. The XRD spectrum that is shown in FIG. 35B and obtained by GIXD measurement is hereinafter simply referred to as an XRD spectrum. The CAAC-IGZO film in FIG. 35B has a composition of In:Ga:Zn=4:2:3 [atomic ratio] or the neighborhood thereof. The CAAC-IGZO film in FIG. 35B has a thickness of 500 nm.

As shown in FIG. 35B, a clear peak indicating crystallinity is observed in the XRD spectrum of the CAAC-IGZO film. Specifically, a peak indicating c-axis alignment is detected at 2θ of around 31° in the XRD spectrum of the CAAC-IGZO film. As shown in FIG. 35B, the peak at 2° of around 310 is asymmetric with the angle at which the peak intensity is detected as the axis.

A crystal structure of a film or a substrate can also be evaluated with a diffraction pattern obtained by a nanobeam electron diffraction method (NBED) (such a pattern is also referred to as a nanobeam electron diffraction pattern). FIG. 35C shows a diffraction pattern of the CAAC-IGZO film. FIG. 35C shows a diffraction pattern obtained by the NBED method in which an electron beam is incident in the direction parallel to the substrate. The CAAC-IGZO film in FIG. 35C has a composition of In:Ga:Zn=4:2:3 [atomic ratio] or the neighborhood thereof. In the nanobeam electron diffraction method, electron diffraction is performed with a probe diameter of 1 nm.

As shown in FIG. 35C, a plurality of spots indicating c-axis alignment are observed in the diffraction pattern of the CAAC-IGZO film.

[Structure of Oxide Semiconductor]

Oxide semiconductors might be classified in a manner different from that in FIG. 35A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. In addition, the crystal region refers to a region having a periodic atomic arrangement. Note that when an atomic arrangement is regarded as a lattice arrangement, the crystal region also refers to a region with a uniform lattice arrangement. Furthermore, the CAAC-OS has a region where a plurality of crystal regions are connected in an a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Note that indium and the element M can be replaced with each other. Therefore, indium is sometimes contained in the (M,Zn) layer. Furthermore, the element M is sometimes contained in the In layer. Note that Zn is sometimes contained in the In layer. Such a layered structure is observed as a lattice image in a high-resolution TEM image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal elements contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, or the like is included in the distortion in some cases. Note that a clear crystal grain boundary (also referred to as grain boundary) cannot be observed even in the vicinity of the distortion in the CAAC-OS. That is, it is found that formation of a crystal grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear crystal grain boundary is observed. Thus, in the CAAC-OS, it can be said that a reduction in electron mobility due to the crystal grain boundary is unlikely to occur. Moreover, since the crystallinity of an oxide semiconductor might be decreased by entry of impurities, formation of defects, and/or the like, the CAAC-OS can be regarded as an oxide semiconductor that has small amounts of impurities and defects (e.g., oxygen vacancies). Thus, an oxide semiconductor including the CAAC-OS is physically stable. Accordingly, the oxide semiconductor including the CAAC-OS is resistant to heat and has high reliability. In addition, the CAAC-OS is also stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, specifically, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

[Structure of Oxide Semiconductor]

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. Furthermore, the second region can be rephrased as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide can be found to have a structure in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), a high field-effect mobility (μ), and an excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a highly reliable transistor can be achieved.

An oxide semiconductor having a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. Note that in the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. Thus, a transistor whose channel formation region is formed in an oxide semiconductor having a high density of trap states has unstable electrical characteristics in some cases.

Accordingly, in order to obtain stable electrical characteristics of a transistor, reducing the impurity concentration in an oxide semiconductor is effective. In addition, in order to reduce the impurity concentration in the oxide semiconductor, the impurity concentration in a film that is adjacent to the oxide semiconductor is also preferably reduced. Examples of impurities include hydrogen, nitrogen, alkali metal, alkaline earth metal, iron, nickel, and silicon.

<Impurity>

Here, the influence of each impurity in the oxide semiconductor will be described.

When silicon and/or carbon, which are each one of Group 14 elements, is contained in the oxide semiconductor, defect states are formed in the oxide semiconductor. Thus, the concentration of silicon and carbon in the oxide semiconductor and the concentration of silicon and carbon in the vicinity of an interface with the oxide semiconductor (the concentrations obtained by SIMS) are each set lower than or equal to $2\times10^{18}$ atoms/$cm^3$, preferably lower than or equal to $2\times10^{17}$ atoms/$cm^3$.

When the oxide semiconductor contains alkali metal or alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/$cm^3$, preferably lower than or equal to $2\times10^{16}$ atoms/$cm^3$.

An oxide semiconductor containing nitrogen easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, and still further preferably lower than or equal to $5\times10^{17}$ atoms/$cm^3$.

Hydrogen contained in an oxide semiconductor reacts with oxygen bonded to a metal atom to be water, and thus forms an oxygen vacancy in some cases. The entry of hydrogen into the oxygen vacancy generates an electron serving as a carrier in some cases. Furthermore, in some cases, some hydrogen is bonded to oxygen bonded to a metal atom and generates an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

The structure described in this embodiment can be used in combination as appropriate with any of the structures described in the other embodiments and Examples.

Embodiment 5

In this embodiment, electronic devices in which the semiconductor device of one embodiment of the present invention can be used will be described.

The semiconductor device of one embodiment of the present invention can be used in a display portion of an electronic device. Thus, an electronic device with high display quality can be obtained. An electronic device with an extremely high resolution can be obtained. A highly reliable electronic device can be obtained.

Examples of electronic devices including the semiconductor device or the like of one embodiment of the present invention include display apparatuses of televisions, monitors, and the like, lighting devices, desktop or laptop personal computers, word processors, image reproduction devices which reproduce still images or moving images stored in recording media such as DVDs (Digital Versatile Discs), portable CD players, radios, tape recorders, headphone stereos, stereos, table clocks, wall clocks, cordless phone handsets, transceivers, car phones, cellular phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as chain saws, smoke detectors, and medical equipment such as dialyzers. Other examples include industrial equipment such as guide lights, traffic lights, conveyor belts, elevators, escalators, industrial robots, power storage systems, and power storage devices for leveling the amount of power supply and smart grid. In addition, moving objects and the like driven by fuel engines or electric motors using power from power storage units may also be included in the category of electronic devices. Examples of the moving objects include electric vehicles (EVs), hybrid electric vehicles (HVs) that include both an internal-combustion engine and a motor, plug-in hybrid electric vehicles (PHVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The electronic device of one embodiment of the present invention may include a secondary battery (battery), and it is preferable that the secondary battery be capable of being charged by contactless power transmission.

Examples of the secondary battery include a lithium ion secondary battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display an image, information, and the like on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, electric power, radioactive rays, flow rate, humidity, a gradient, oscillation, odor, or infrared rays).

The electronic device of one embodiment of the present invention can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Furthermore, an electronic device including a plurality of display portions can have a function of displaying image information mainly on one display portion while displaying text information mainly on another display portion, a function of displaying a three-dimensional image by displaying images on a plurality of display portions with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display portion, or the like. Note that functions of the electronic device of one embodiment of the present invention are not limited thereto, and the electronic devices can have a variety of functions.

The semiconductor device of one embodiment of the present invention can display high-resolution images. Thus, the light-emitting apparatus of one embodiment of the present invention can be suitably used especially for a portable electronic device, a wearable electronic device (wearable device), an e-book reader, and the like. In addition, the semiconductor device can be suitably used for xR devices such as a VR device and an AR device.

Figure 36A:
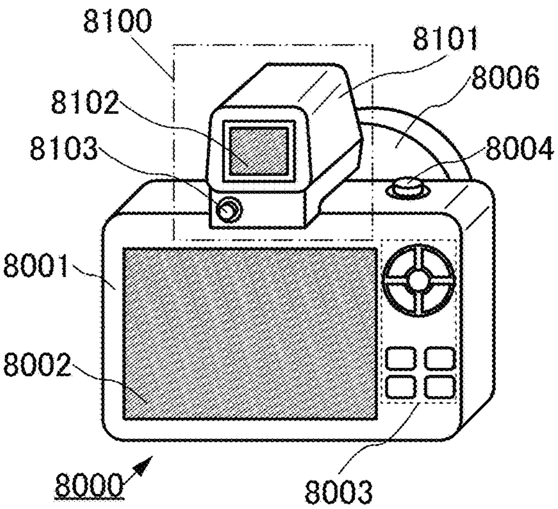
FIG. 36A to FIG. 36F are diagrams illustrating examples of electronic devices.

FIG. 36A is a diagram illustrating the appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. The finder 8100 can display a video received from the camera 8000 and the like on the display portion 8102.

The button 8103 functions as a power supply button or the like.

For example, the semiconductor device of one embodiment of the present invention can be used in the display portion 8002 of the camera 8000 and the display portion 8102 of the finder 8100. Note that the finder 8100 may be incorporated in the camera 8000.

Figure 36B:
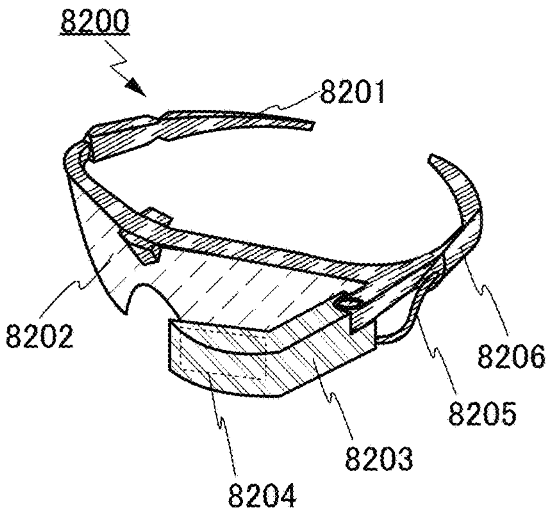

FIG. 36B is a diagram illustrating the appearance of a head-mounted display 8200.

The head-mounted display 8200 includes a wearing portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may be provided with a plurality of electrodes capable of sensing a current flowing in response to the movement of the user's eyeball in a position in contact with the user to have a function of recognizing the user's sight line. Furthermore, the mounting portion 8201 may have a function of monitoring the user's pulse with use of the current flowing through the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

The semiconductor device of one embodiment of the present invention can be used in the display portion 8204.

Figure 36C:
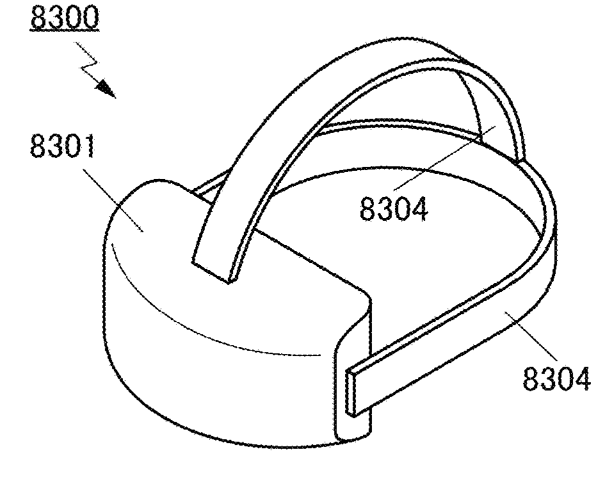
Figure 36D:
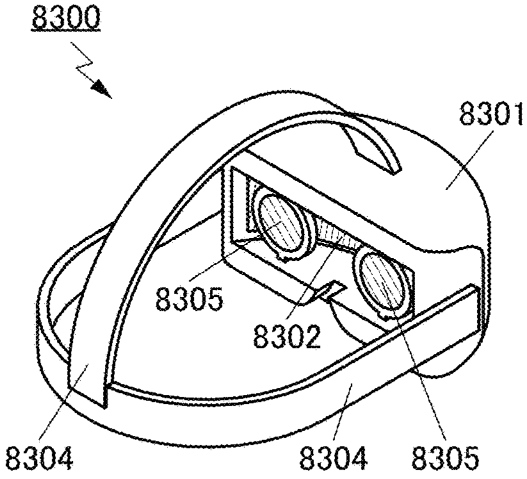
Figure 36E:
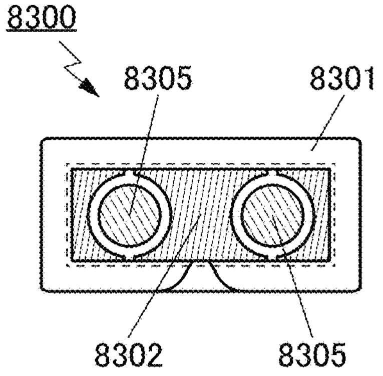

FIG. 36C to FIG. 36E are diagrams illustrating the appearance of a head-mounted display 8300. The head-mounted display 8300 includes a housing 8301, a display portion 8302, a band-like fixing member 8304, and a pair of lenses 8305.

A user can perceive display on the display portion 8302 through the lenses 8305. Note that the display portion 8302 is preferably curved and placed because the user can feel a high realistic sensation. Another image displayed in another region of the display portion 8302 is viewed through the lenses 8305, so that three-dimensional display using parallax or the like can be performed. Note that the structure is not limited to the structure in which one display portion 8302 is provided; two display portions 8302 may be provided and one display portion may be provided per eye of the user.

The semiconductor device of one embodiment of the present invention can be used for the display portion 8302. The semiconductor device of one embodiment of the present invention can achieve extremely high resolution. For example, a pixel is not easily seen by the user even when the user sees display that is magnified by the use of the lenses 8305 as illustrated in FIG. 36E. In other words, a video with a strong sense of reality can be seen by the user with use of the display portion 8302.

Figure 36F:
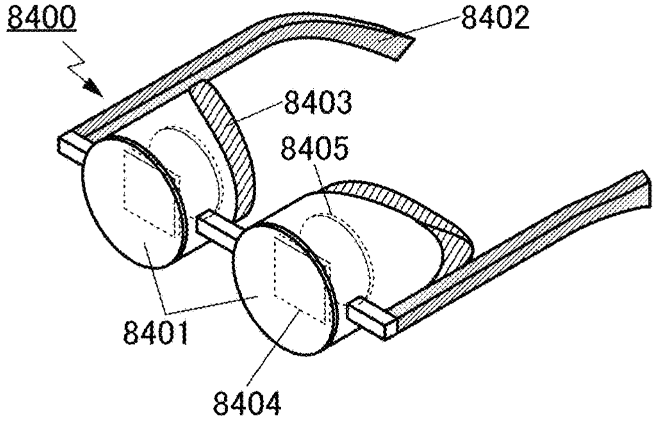

FIG. 36F is a diagram illustrating the appearance of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. The pair of display portions 8404 may display different images, whereby three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has plasticity and elasticity so as to be adjusted to fit the size of the user's face and not to slide down. In addition, part of the mounting portion 8402 preferably has a vibration mechanism functioning as a bone conduction earphone. Thus, without additionally requiring an audio device such as earphones or a speaker, the user can enjoy video and sound only by wearing. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered by cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member to be in contact with the user's skin, such as the cushion 8403 or the wearing portion 8402, is preferably detachable, in which case cleaning or replacement can be easily performed.

Figure 37A:
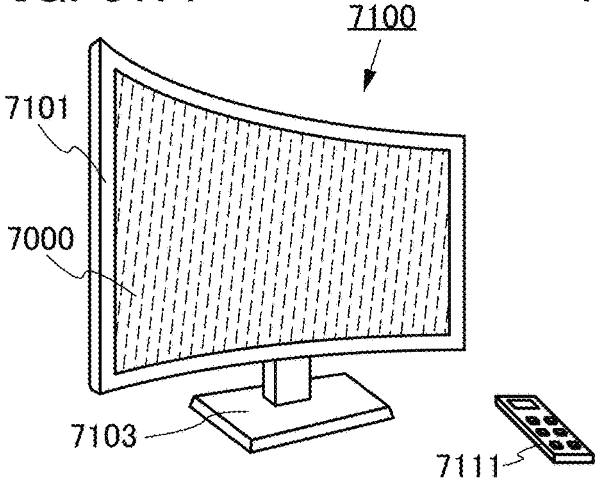
FIG. 37A to FIG. 37F are diagrams illustrating examples of electronic devices.

FIG. 37A illustrates an example of a television device. In a television device 7100, a display portion 7000 is incorporated in a housing 7101. Here, a structure in which the housing 7101 is supported by a stand 7103 is illustrated.

The semiconductor device of one embodiment of the present invention can be used for the display portion 7000.

Operation of the television device 7100 illustrated in FIG. 37A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 37B:
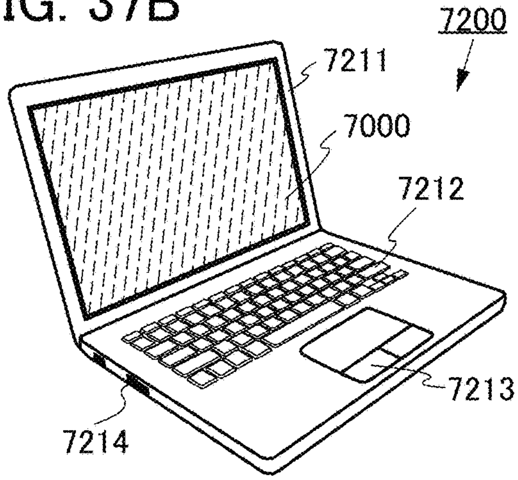

FIG. 37B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The semiconductor device of one embodiment of the present invention can be used for the display portion 7000.

Figure 37C:
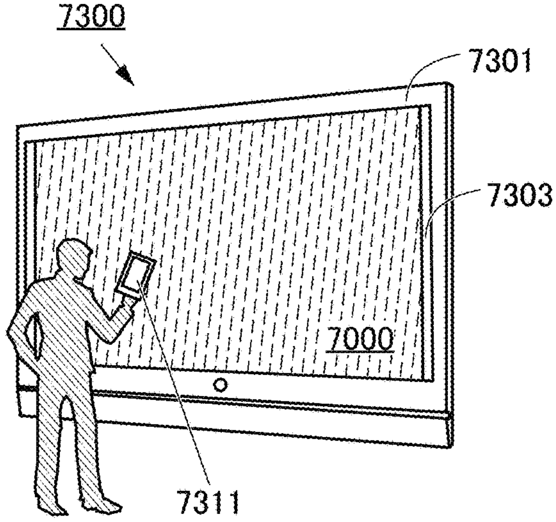
Figure 37D:
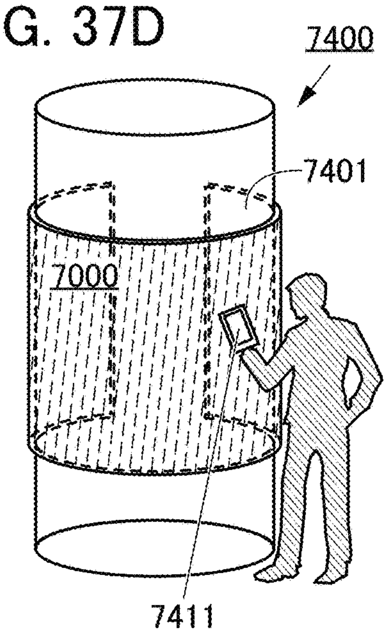

FIG. 37C and FIG. 37D illustrate examples of digital signage.

Digital signage 7300 illustrated in FIG. 37C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 37D is digital signage 7400 attached to a cylindrical pillar 7401. The digital signage 7400 includes the display portion 7000 provided along a curved surface of the pillar 7401.

In FIG. 37C and FIG. 37D, the semiconductor device of one embodiment of the present invention can be used for the display portion 7000.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 37C and FIG. 37D, it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Figure 37E:
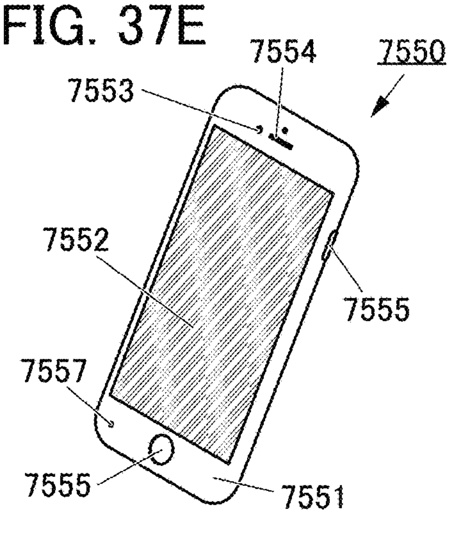

An information terminal 7550 illustrated in FIG. 37E includes a housing 7551, a display portion 7552, a microphone 7557, a speaker portion 7554, a camera 7553, operation switches 7555, and the like. For example, the semiconductor device of one embodiment of the present invention can be used for the display portion 7552. The display portion 7552 functions as a touch panel. The information terminal 7550 also includes an antenna, a battery, and the like inside the housing 7551. The information terminal 7550 can be used as, for example, a smartphone, a mobile phone, a tablet information terminal, a tablet personal computer, an e-book reader, or the like.

Figure 37F:
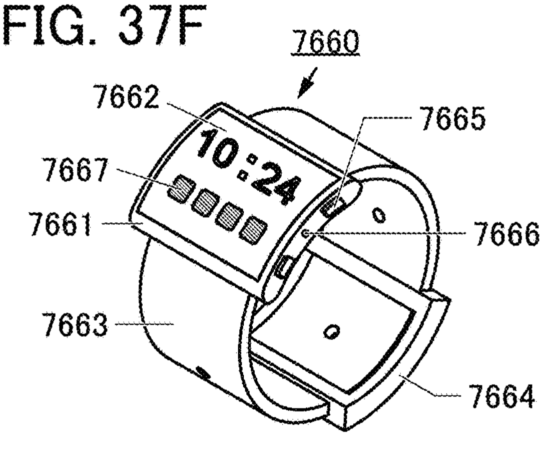

FIG. 37F illustrates an example of a watch-type information terminal. An information terminal 7660 includes a housing 7661, a display portion 7662, a band 7663, a buckle 7664, an operation switch 7665, an input/output terminal 7666, and the like. In addition, the information terminal 7660 includes an antenna, a battery, and the like inside the housing 7661. The information terminal 7660 is capable of executing a variety of applications such as mobile phone calls, e-mailing, viewing and editing texts, music reproduction, Internet communication, and a computer game.

The display portion 7662 includes a touch sensor, and operation can be performed by touching the screen with a finger, a stylus, or the like. For example, with a touch on an icon 7667 displayed on the display portion 7662, an application can be started. The operation switches 7665 can have a variety of functions such as time setting, power on/off operation, on/off operation of wireless communication, setting and cancellation of a silent mode, and setting and cancellation of a power saving mode. For example, the functions of the operation switches 7665 can be set by the operation system incorporated in the information terminal 7660.

The information terminal 7660 can execute near field communication conformable to a communication standard. For example, mutual communication between the information terminal 7660 and a headset capable of wireless communication enables hands-free calling. The information terminal 7660 includes an input/output terminal 7666, and can perform data transmission and reception with another information terminal through the input/output terminal 7666. In addition, charging can be performed via the input/output terminal 7666. Note that the charging operation may be performed by wireless power feeding without using the input/output terminal 7666.

Figure 38A:
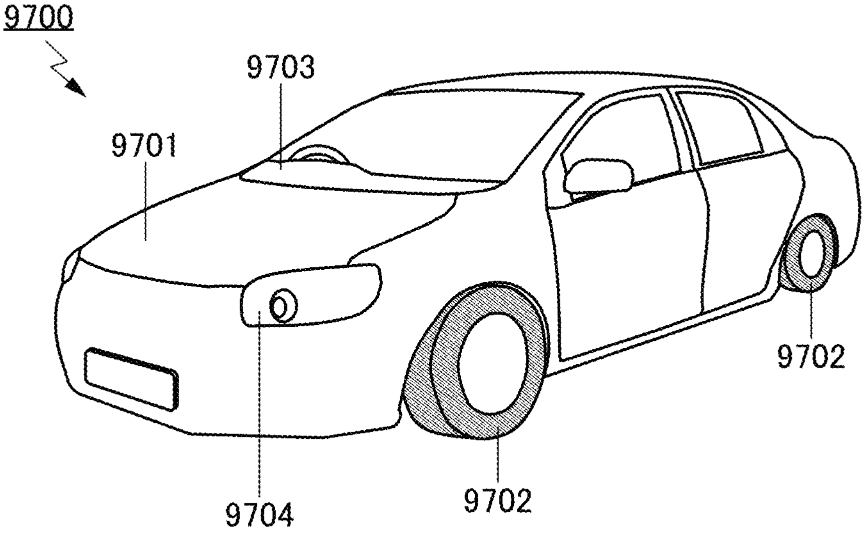
FIG. 38A and FIG. 38B are diagrams illustrating an example of an electronic device.
Figure 38B:
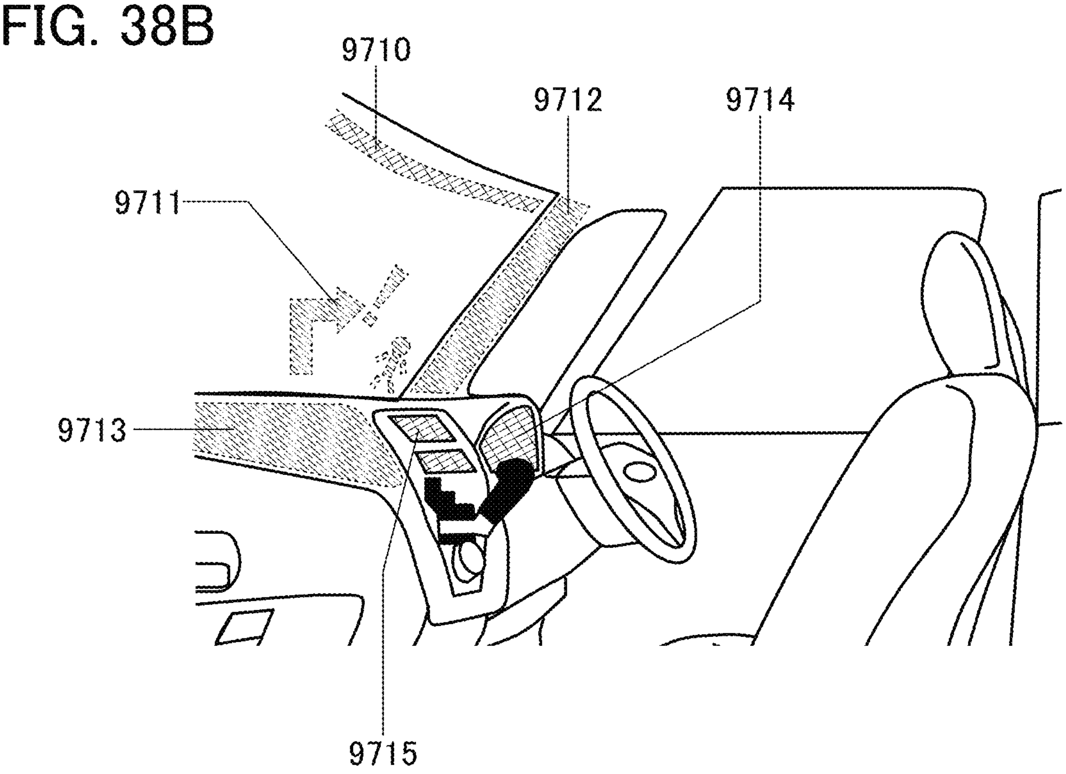

FIG. 38A illustrates the appearance of an automobile 9700. FIG. 38B illustrates a driver's seat of the automobile 9700. The automobile 9700 includes an automobile body 9701, wheels 9702, a dashboard 9703, lights 9704, and the like. The display apparatus of one embodiment of the present invention can be used in, for example, a display portion of the automobile 9700. For example, the display apparatus of one embodiment of the present invention can be provided for a display portion 9710 to a display portion 9715 illustrated in FIG. 38B.

The display portion 9710 and the display portion 9711 are display apparatuses provided in an automobile windshield. The display apparatus of one embodiment of the present invention can be what is called a see-through display apparatus, through which the opposite side can be seen, by using a light-transmitting conductive material for electrodes of the display apparatus. Such a see-through display apparatus does not hinder driver's vision during the driving of the automobile 9700. Therefore, the display apparatus of one embodiment of the present invention can be provided in the windshield of the automobile 9700. Note that in the case where a transistor or the like for driving the display apparatus is provided in the display apparatus, a transistor having a light-transmitting property, such as an organic transistor using an organic semiconductor material or a transistor using an oxide semiconductor, is preferably used.

The display portion 9712 is a display apparatus provided on a pillar portion. For example, the display portion 9712 can compensate for the view hindered by the pillar by displaying an image taken by an imaging means provided on the automobile body. The display portion 9713 is a display apparatus provided on a dashboard. For example, the display portion 9713 can compensate for the view hindered by the dashboard by displaying an image taken by an imaging means provided on the automobile body. That is, display of an image taken by an imaging means provided on the exterior of the automobile can compensate for blind areas and enhance safety. Display of an image that complements for the area that cannot be seen makes it possible to confirm safety more naturally and comfortably.

Figure 39:
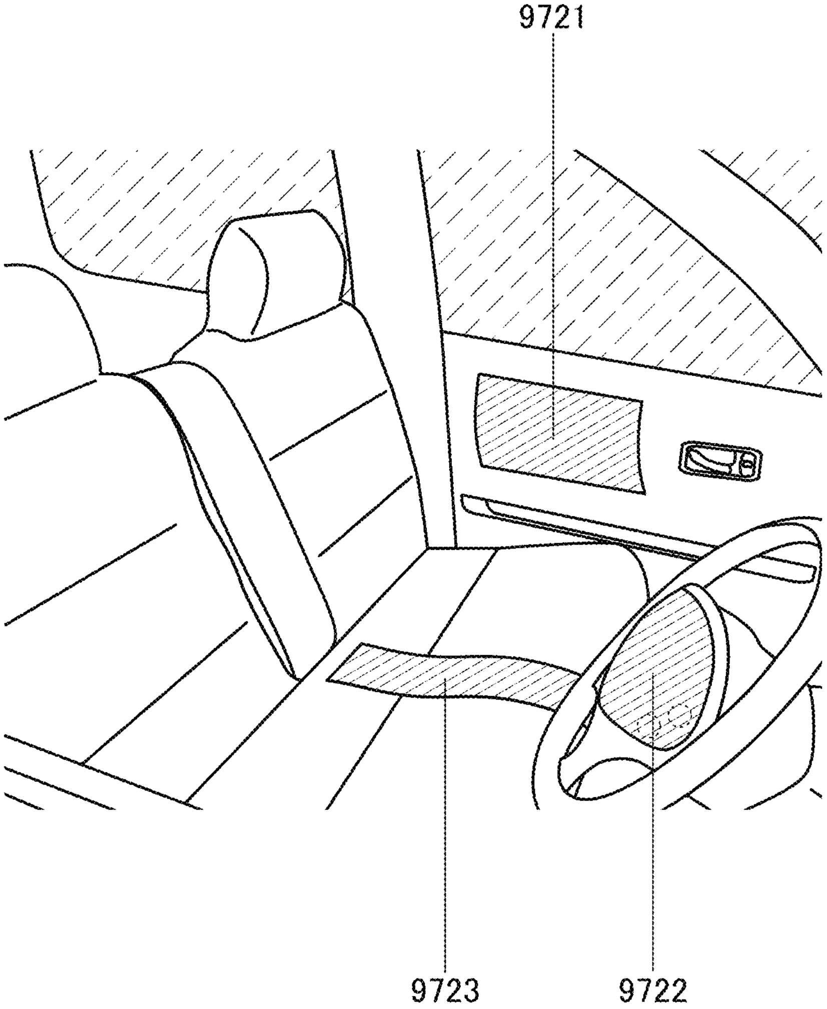
FIG. 39 is a diagram illustrating an example of an electronic device.

FIG. 39 illustrates the inside of an automobile in which a bench seat is used as a driver's seat and a front passenger's seat. A display portion 9721 is a display apparatus provided in a door portion. For example, the display portion 9721 can compensate for the view hindered by the door by displaying an image taken by an imaging means provided on the automobile body. A display portion 9722 is a display apparatus provided in a steering wheel. A display portion 9723 is a display apparatus provided in the middle of a seating face of the bench seat.

The display portion 9714, the display portion 9715, and the display portion 9722 can provide a variety of kinds of information by displaying navigation information, speed, the number of engine revolutions, a mileage, the remaining amount of fuel, a gearshift state, air-condition setting, and the like. The content and layout of the display on the display portions can be changed as appropriate in accordance with the preferences of the user. The above information can also be displayed on the display portion 9710 to the display portion 9713, the display portion 9721, and the display portion 9723. The display portion 9710 to the display portion 9715 and the display portion 9721 to the display portion 9723 can also be used as lighting devices.

The structure described in this embodiment can be used in combination as appropriate with any of the structures described in the other embodiments and Examples.

Example 1

In this example, a sample including a plurality of transistors described in the above embodiment was fabricated, and electrical characteristics of the transistors, variations in electrical characteristics of the transistors, and reliability of the transistors were evaluated.

The sample used in this example includes transistors similar to the transistor 500 illustrated in FIG. 34A to FIG. 34C. The designed channel length and channel width values of the transistor 500 in the sample were 200 nm and 130 nm, respectively. In the sample, three transistors 500 are connected in series, and a triple-gate structure (see the transistor 180B in FIG. 5B) is formed. In the sample of this example, a plurality of triple-gate structures each consisting of three transistors 500 is provided.

[Structure of Transistor 500]

The structure of the transistor 500 included in the sample will be described below with reference to FIG. 34B.

As illustrated in FIG. 34B, the transistor 500 includes the insulator 514; the insulator 516 placed over the insulator 514; the conductor 505 placed so as to be embedded in the insulator 516; the insulator 522 placed over the insulator 516 and the conductor 505; the insulator 524 placed over the insulator 522; the metal oxide 531 placed over the insulator 524; the conductor 542*a* and the conductor 542*b* placed over the metal oxide 531 and separated from each other; the insulator 554 and the insulator 580 placed over the conductor 542*a* and the conductor 542*b* and having an opening formed between the conductor 542*a* and the conductor 542*b*; the conductor 560 placed in the opening; the insulator 550 placed between the conductor 560 and the metal oxide 531, the conductor 542*a*, the conductor 542*b*, and the insulator 580; and the insulator 574 placed over the insulator 580, the insulator 550, and the conductor 560.

The insulator 514 is a stacked-layer film of a 60-nm-thick silicon nitride film and a 40-nm-thick aluminum oxide film over the silicon nitride film. The silicon nitride film and the aluminum oxide film were deposited by a sputtering method.

The insulator 516 is a silicon oxide film deposited by a sputtering method.

The conductor 505 in this example includes the conductor 505*a* and the conductor 505*b*, but does not include the conductor 505*c*. The conductor 505*a* is a stacked-layer film of a 40-nm-thick tantalum nitride film and a 20-nm-thick titanium nitride film over the tantalum nitride film. The tantalum nitride film was deposited by a sputtering method, and the titanium nitride film was deposited by a CVD method. The conductor 505*b* is a tungsten film deposited by a CVD method.

The insulator 522 is a 20-nm-thick hafnium oxide film deposited by an ALD method.

The insulator 524 is a 20-nm-thick silicon oxide film deposited by a sputtering method.

The metal oxide 531 of this example has a single-layer structure like the semiconductor layer 321 or the like illustrated in FIG. 31. That is, the metal oxide 531 has a single-layer structure of only the metal oxide 531*a*. The metal oxide 531*a* is a 20-nm-thick In—Ga—Zn oxide film. The metal oxide 531*a* was deposited by a sputtering method using a target having a composition in the vicinity of In:Ga:Zn=1:3:4 [atomic ratio].

Each of the conductor 542*a* and the conductor 542*b* is a 20-nm-thick tantalum nitride film deposited by a sputtering method. A 5-nm-thick aluminum oxide film was deposited by a sputtering method so as to be positioned over and overlap with the conductor 542*a* and the conductor 542*b*.

The insulator 554 is a stacked-layer film of a 5-nm-thick aluminum oxide film and a 5-nm-thick silicon nitride film over the aluminum oxide film. An ALD method was used for the deposition of the silicon nitride film, and a sputtering method was used for the deposition of the aluminum oxide film.

The insulator 580 is a silicon oxide film deposited by a sputtering method.

The insulator 550 is a stacked-layer film of a 1-nm-thick aluminum oxide film, a 10-nm-thick silicon oxide film over the aluminum oxide film, a 1.5-nm-thick hafnium oxide film over the silicon oxide film, and a 1-nm-thick silicon nitride film over the hafnium oxide film. The aluminum oxide film, the silicon oxide film, the hafnium oxide film, and the silicon nitride film were deposited by an ALD method.

The conductor 560 of this example includes the conductor 560*a* and the conductor 560*b*. The conductor 560*a* is a 5-nm-thick titanium nitride film. The titanium nitride film was deposited by a CVD method. The conductor 560*b* is a tungsten film deposited by a CVD method.

The insulator 574 is a 40-nm-thick aluminum oxide film deposited by a sputtering method.

The electrical characteristics and reliability of the sample including the plurality of transistors 500 with the above-described structure were evaluated.

[Electrical Characteristics Evaluation]

The electrical characteristics of the transistor having a triple-gate structure (the transistor 180B) included in the sample were evaluated. Here, the Id-Vg characteristics were measured as the electrical characteristics. The Id-Vg characteristics were measured under the conditions where the drain voltage Vd was 0.1 V or 1.2 V; the source voltage Vs and the back gate voltage Vbg were 0 V; and the top gate voltage Vg was swept from −4.0 V to +4.0 V in increments of 0.1 V. The measurement was performed in an environment at room temperature.

Figure 40A:
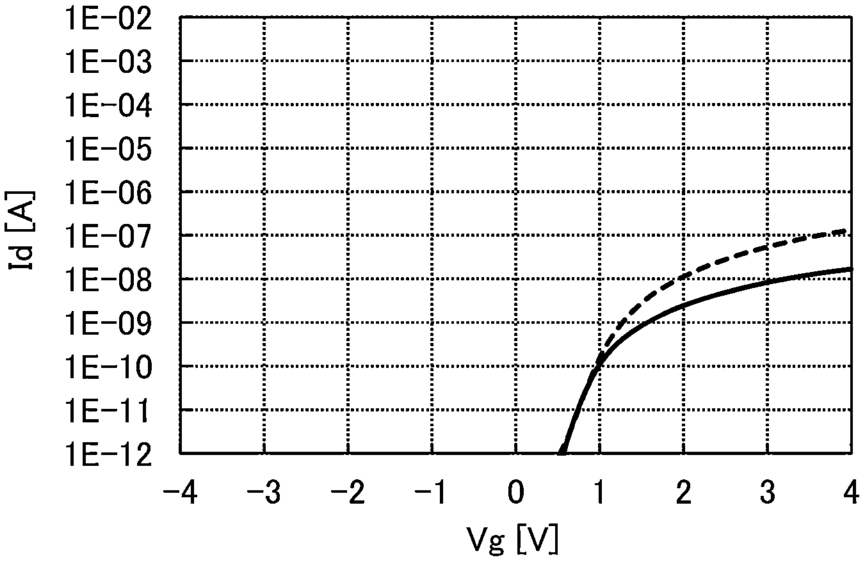
FIG. 40A is a graph showing electrical characteristics according to this example.

FIG. 40A shows the Id-Vg characteristics of the transistor included in the sample. In FIG. 40A, the horizontal axis represents gate voltage (Vg [V]) and the vertical axis represents drain current (Id [A]). In FIG. 40A, Id of the time when the drain voltage Vd is 0.1 V is shown by a solid line, and Id of the time when the drain voltage Vd is 1.2 V is shown by a dashed line.

FIG. 40A shows that the transistor included in the sample has normally-off characteristics and switching characteristics. Moreover, as shown in FIG. 40A, the off-state current of the transistor is lower than or equal to the lower measurement limit and is significantly low.

Next, Id-Vg characteristics of the transistors having a triple-gate structure (the transistor 180B) were measured, and variations in threshold voltage (Vth [V]), Ion [A], and S value (SS [V/dec]) were evaluated. Note that Id-Vg characteristics of 1060 transistors having a triple-gate structure (1060 transistors 180B) were measured. The threshold voltage Vth is the value of the top gate voltage Vg at Id=1 pA. In addition, Ion is the value of the drain current Id at Vg=Vth+2.5 V. The S value is the value of Vg that is necessary to change Id by an order of magnitude in the subthreshold region when Vd is set to 1.2 V.

Figure 40B:
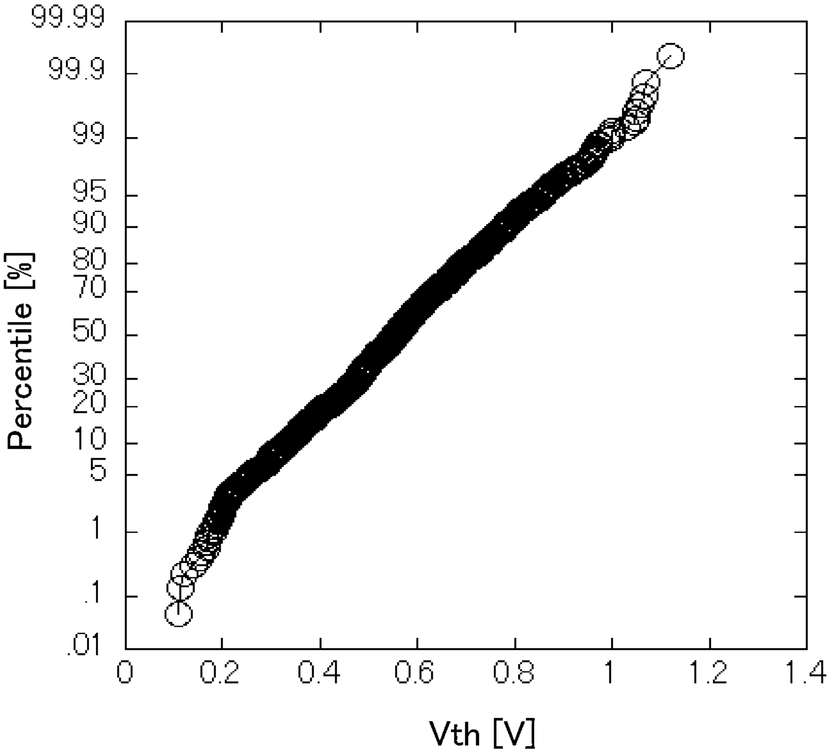
FIG. 40B is a graph showing a variation in electrical characteristics according to this example.

FIG. 40B shows the cumulative probability of the threshold voltages of the transistors included in the sample. In FIG. 40B, the horizontal axis represents the threshold voltage (Vth [V]) and the vertical axis represents the cumulative probability (Percentile [%]).

FIG. 40B has revealed that the Vth standard deviation a of the transistors is 161 mV.

Figure 41A:
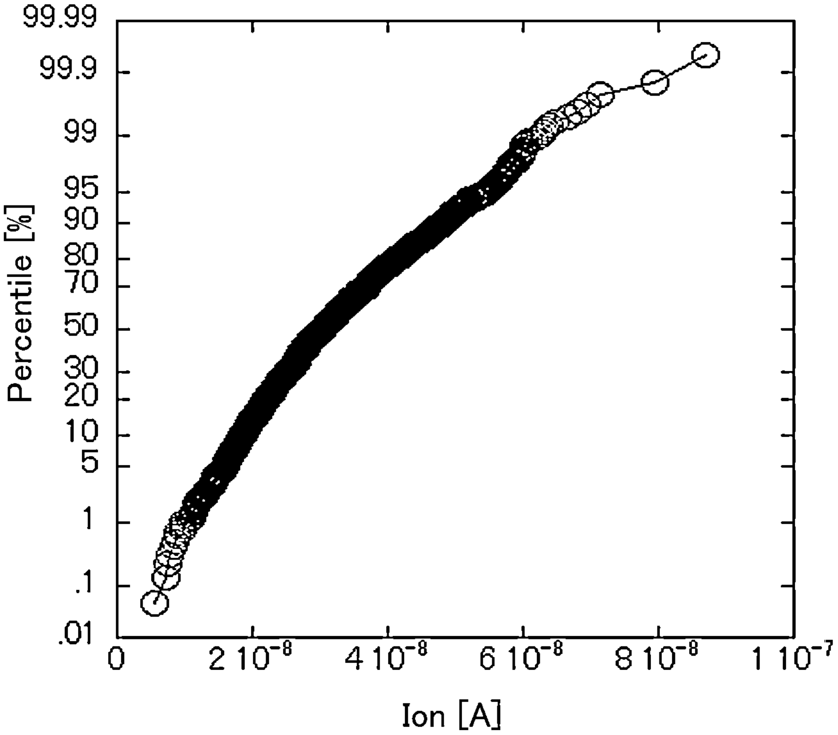
FIG. 41A and FIG. 41B are graphs showing variations in electrical characteristics according to this example.

FIG. 41A shows the cumulative probability of Ion of transistors included in the sample. In FIG. 41A, the horizontal axis represents Ion [A], and the vertical axis represents the cumulative probability (Percentile [%]).

FIG. 41A has revealed that the Ion standard deviation a of the transistors is $1.16\times10^{-8}$ A and the average Ion (average) of the 1060 transistors is $3.19\times10^{-8}$ A. Thus, σ/average is 36%.

Figure 41B:
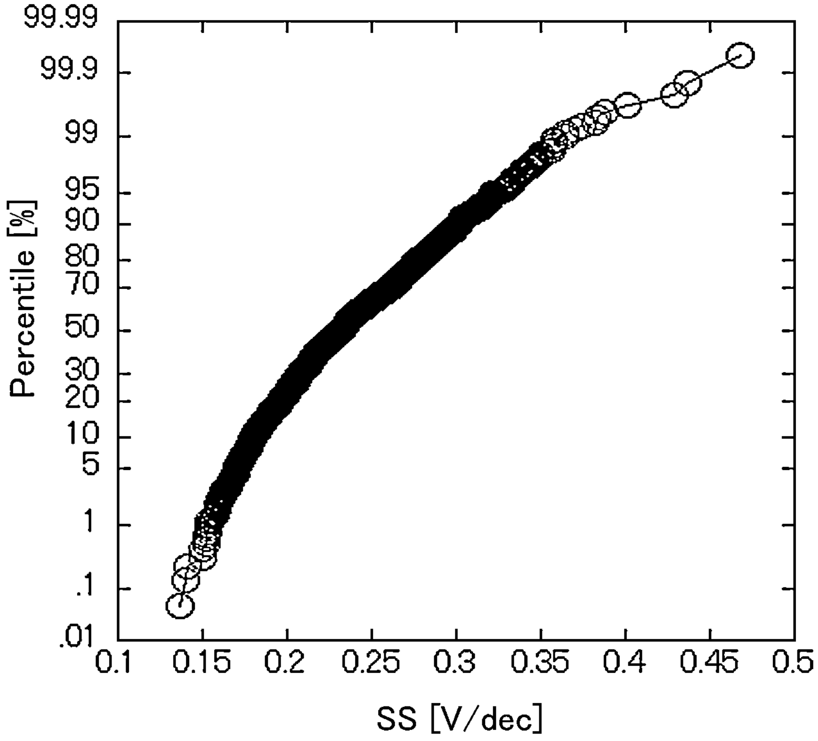

FIG. 41B shows the cumulative probability of the S value of the transistors included in the sample. In FIG. 41B, the horizontal axis represents the S value (SS [V/dec]) and the vertical axis represents the cumulative probability (Percentile [%]).

FIG. 41B has revealed that the S-value standard deviation 6 of the transistors is 48 mV/dec.

As described above, it was found that the variations in the electrical characteristics of the transistors in the sample of this example are small. When the transistors are used as the driving transistors of a display apparatus, the display apparatus can have favorable display quality.

[Reliability Evaluation]

Next, the reliability of the transistors having a triple-gate structure was evaluated by application of stress corresponding to white display or stress corresponding to black display. As the stress corresponding to white display, Vd=+3.80 V was applied at Vg=+1.90 V at a substrate temperature of 125° C. As the stress corresponding to black display, Vd=+9.00 V was applied at Vg=0 V at a substrate temperature of 125° C. In both of the stress tests, the maximum stress time was set at 90 hours. In both of the stress tests, Vs=0 V and Vbg=0 V were satisfied. A test in which stress corresponding to white display is applied and a test in which stress corresponding to black display is applied are referred to as a stress test in some cases below.

The reliability was evaluated by measuring the threshold voltage Vth, the S value (SS), the field-effect mobility μFE, and Ion and obtaining the differences therein between before and after the stress test. The differences are referred to as ΔVth, ΔSS, ΔμFE, and ΔIon. As the field-effect mobility μFE, a maximum value at Vd=0.1 V was used. The field-effect mobility μFE was obtained by solving a gradual channel approximation formula for the field-effect mobility μFE.

Figure 42A:
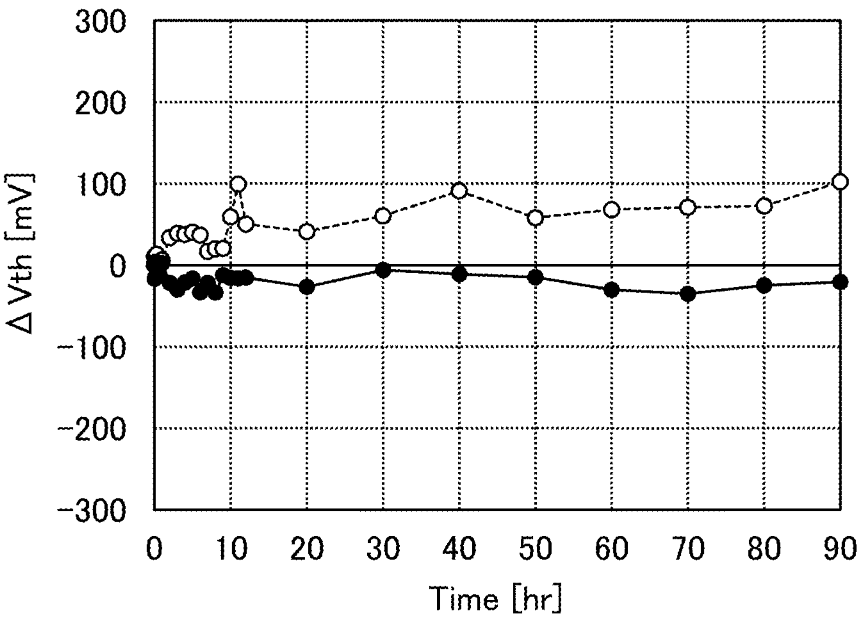
FIG. 42A and FIG. 42B are graphs showing reliability according to this example.

FIG. 42A shows time dependence of the difference in threshold voltage. In FIG. 42A, the horizontal axis represents stress time (Time [hr]), and the vertical axis represents the difference in threshold voltage (ΔVth [mV]). In addition, the white circle in FIG. 42A is a graph of a stress test of white display, and the black circle is a graph of a stress test of black display.

From FIG. 42A, ΔVth was found to be almost less than or equal to +100 mV under stress of white display. Although the ΔVth change in the negative direction was observed under the stress of black display, the absolute value of ΔVth was smaller than that under the stress of white display. Thus, even when the transistor in this example is used as the driving transistor through which a current keeps flowing for a long time, deterioration of the threshold voltage is presumably small.

Figure 42B:
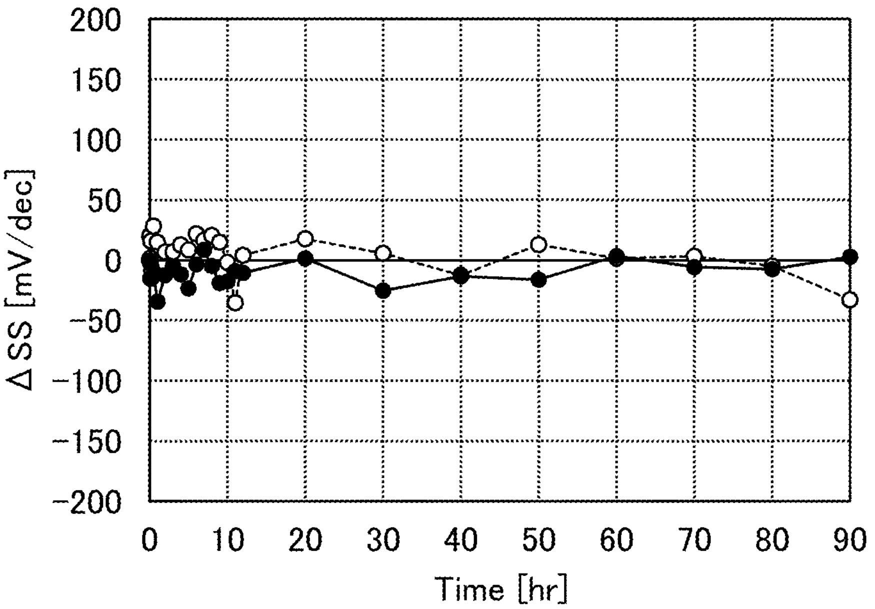

FIG. 42B shows time dependence of the difference in S value. In FIG. 42B, the horizontal axis represents stress time (Time [hr]), and the vertical axis represents the difference in S values (ΔSS [V/dec]). In addition, in FIG. 42B, the white circle is a graph of a stress test of white display, and the black circle is a graph of a stress test of black display.

In FIG. 42B, a deterioration in S value was hardly observed under the stress of white display and the stress of black display.

Figure 43A:
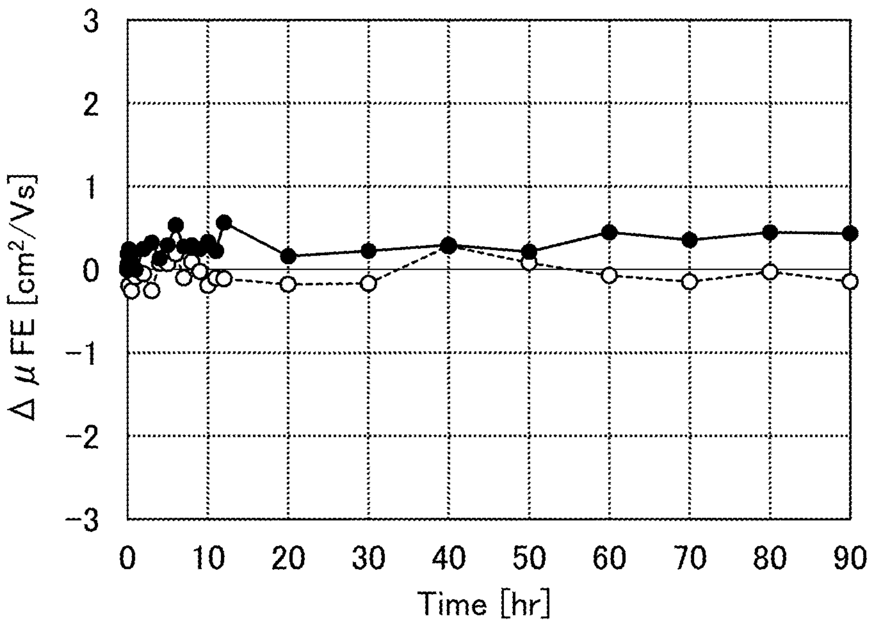
FIG. 43A and FIG. 43B are graphs showing reliability according to this example.

FIG. 43A shows time dependence of the difference in field-effect mobility. In FIG. 43A, the horizontal axis represents stress time (Time [hr]), and the vertical axis represents the difference in field-effect mobility (ΔμFE [$cm^2$/Vs]). In addition, in FIG. 43A, the white circle is a graph of a stress test of white display, and the black circle is a graph of a stress test of black display.

In FIG. 43A, a deterioration in field-effect mobility was hardly observed under the stress of white display and the stress of black display.

Figure 43B:
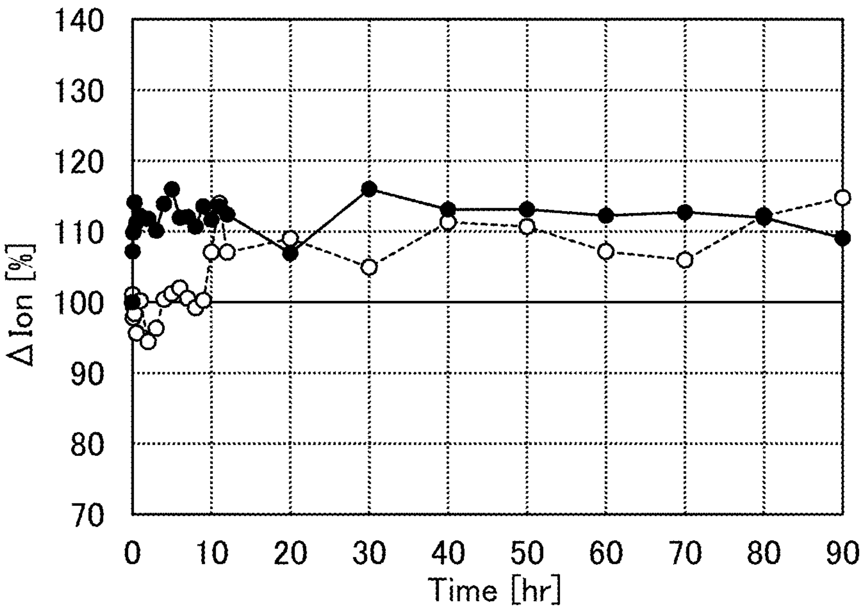

FIG. 43B shows time dependence of the Ion difference. In FIG. 43B, the horizontal axis represents stress time (Time [hr]), and the vertical axis represents Ion difference (ΔIon [%]). The difference in Ion is represented by the proportion, which is 100% in the initial state. In addition, in FIG. 43B, the white circle is a graph of a stress test of white display, and the black circle is a graph of a stress test of black display.

As shown in FIG. 43B, the stress of white display and the stress of black display caused an increase in Ion. Here, Ion is a value at Vg=Vth+2.5 V, which is presumably reflects a change in Vth in the stress test.

As described above, in the stress test, the field-effect mobility and the S value hardly deteriorate; thus, with the use of a pixel circuit having a circuit structure of correcting at least a change in the threshold voltage, a display apparatus according to the present invention can perform uniform display for a long time.

Next, Id-Vd characteristics were measured before and after 60-hour stress tests. In the measurement of the Id-Vg characteristics, the top gate voltage Vg was 1.9 V, the source voltage Vs and the back gate voltage Vbg were 0 V, and the drain voltage Vd was swept from 0 V to +5.0 V in increments of 0.1 V. The measurement was performed at a substrate temperature of 125° C.

Figure 44A:
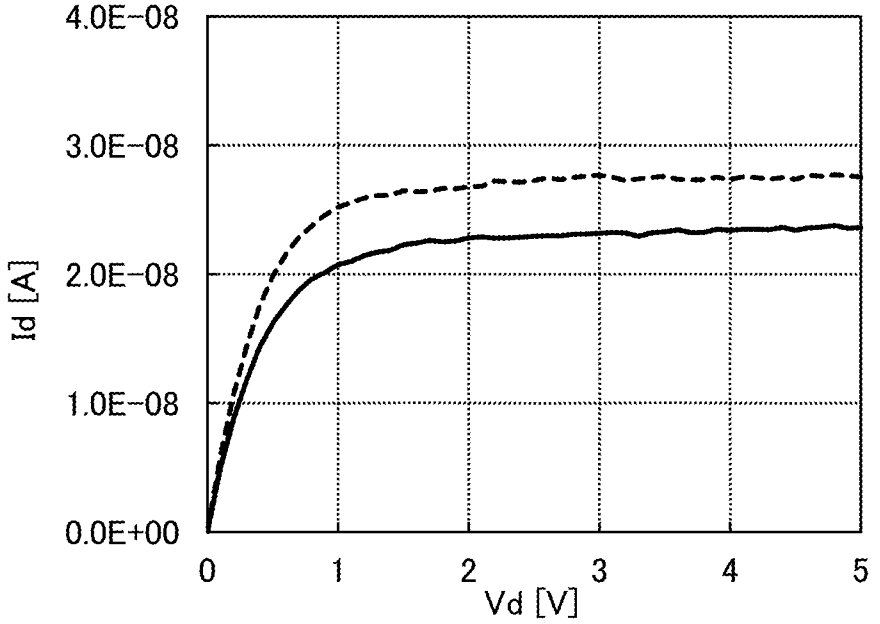
FIG. 44A and FIG. 44B are graphs showing reliability according to this example.
Figure 44B:
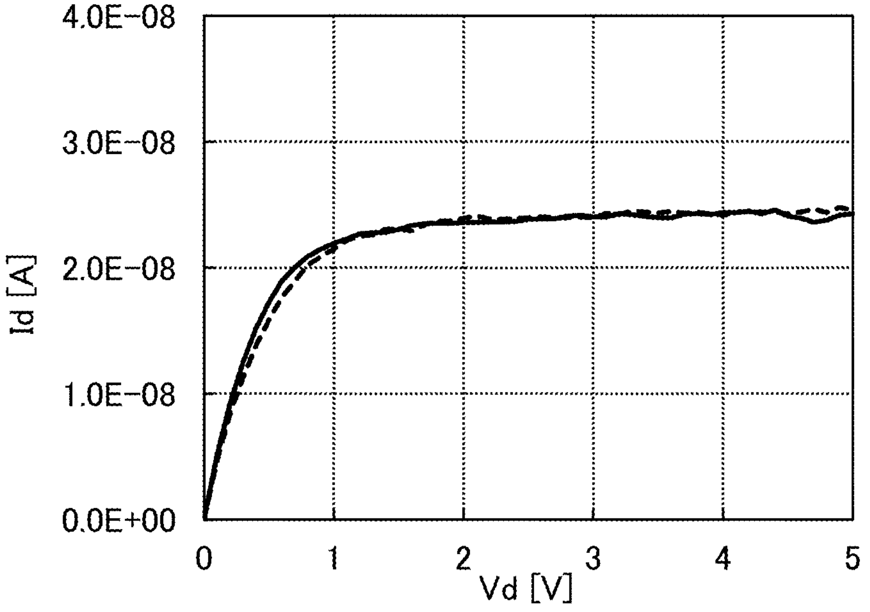

FIG. 44A shows the results of the Id-Vd measurement before and after the white-display stress test, and FIG. 44B shows the results of the Id-Vd measurement before and after the black-display stress test. In FIG. 44A and FIG. 44B, the horizontal axis represents drain voltage (Vd [V]) and the vertical axis represents drain current (Id [A]). In FIG. 44A and FIG. 44B), Id before the stress test is shown by a solid line, and Id after the stress test is shown by a dashed line.

As shown in FIG. 44A, Id at Vd=3.8 V increased by approximately 17.7% by the white-display stress. As shown in FIG. 44B, Id at Vd=3.8 V increased by approximately 0.4% by the black-display stress.

As shown in FIG. 44A and FIG. 44B, Id is almost constant in a saturation region, which is an operating region with high Vd. Thus, the transistor of this example can suitably drive the light-emitting device as a transistor of a constant current source circuit.

Example 2

In this example, samples each corresponding to the capacitor 73 described in the above embodiment were formed, and defective patterns of resist masks were evaluated.

<Sample Formation>

First, a substrate was prepared. As the substrate, a silicon substrate on which transistors and insulating layers were provided was used. The substrate corresponds to the components between the substrate 69 and the insulating layer 288 illustrated in FIG. 2.

Next, a 50-nm-thick first tungsten film was formed over the substrate by a sputtering method.

Next, the first tungsten film was processed to form a plurality of island-shaped tungsten layers. The tungsten layer corresponds to the conductive layer 87 described in the above embodiment.

Next, an insulating layer was formed over the tungsten layers. As the insulating layer, a 14-nm-thick aluminum oxide film and a 7-nm-thick silicon oxynitride film were formed in this order. The aluminum oxide film was formed by an ALD method, and the silicon oxynitride film was formed by a CVD method. The insulating layer corresponds to the insulating layer 91 described in the above embodiment.

Next, a 30-nm-thick second tungsten film was formed over the insulating layer by a sputtering method. The second tungsten film corresponds to a film to be the conductive layer 89 described in the above embodiment.

Next, a 150-nm-thick first organic film was formed over the second tungsten film by a spin coating method. As the first organic film, an SOC (Spin On Carbon) film was used.

Next, a 40-nm-thick second organic film was formed over the first organic film by a spin coating method. As the second organic film, an SOG (Spin On Glass) film was used.

Next, a resist material was applied onto the second organic film, and a plurality of resist masks were formed by a photolithography method using an electron beam. A negative-type resist material was used, and the thickness of the resist masks was 100 nm. The resist masks correspond to the resist masks for forming the conductive layer 89 described in the above embodiment. The proportion of the area of the resist masks differed between the samples. The proportion of the area of the resist masks of Sample 1 was set to be 21%, and the proportion of the area of the resist masks of Sample 2 was set to be 49%.

<Optical Microscopic Observation>

Figure 45A:
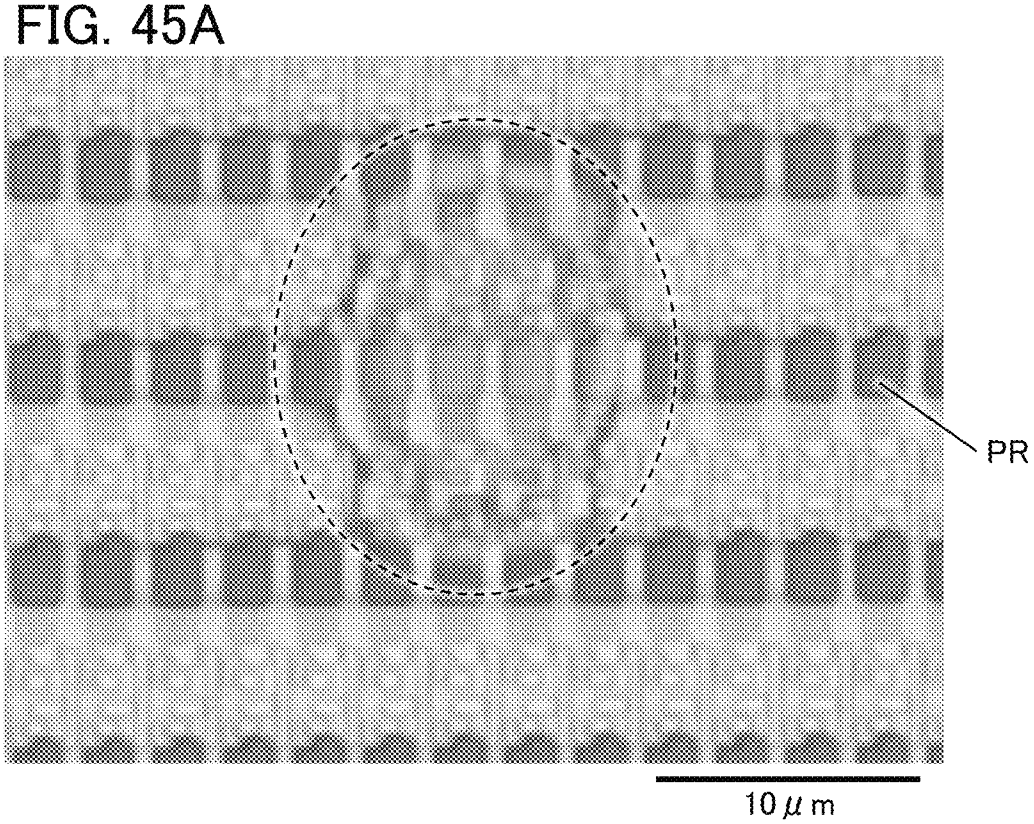
FIG. 45A and FIG. 45B are optical micrographs according to this example.
Figure 45B:
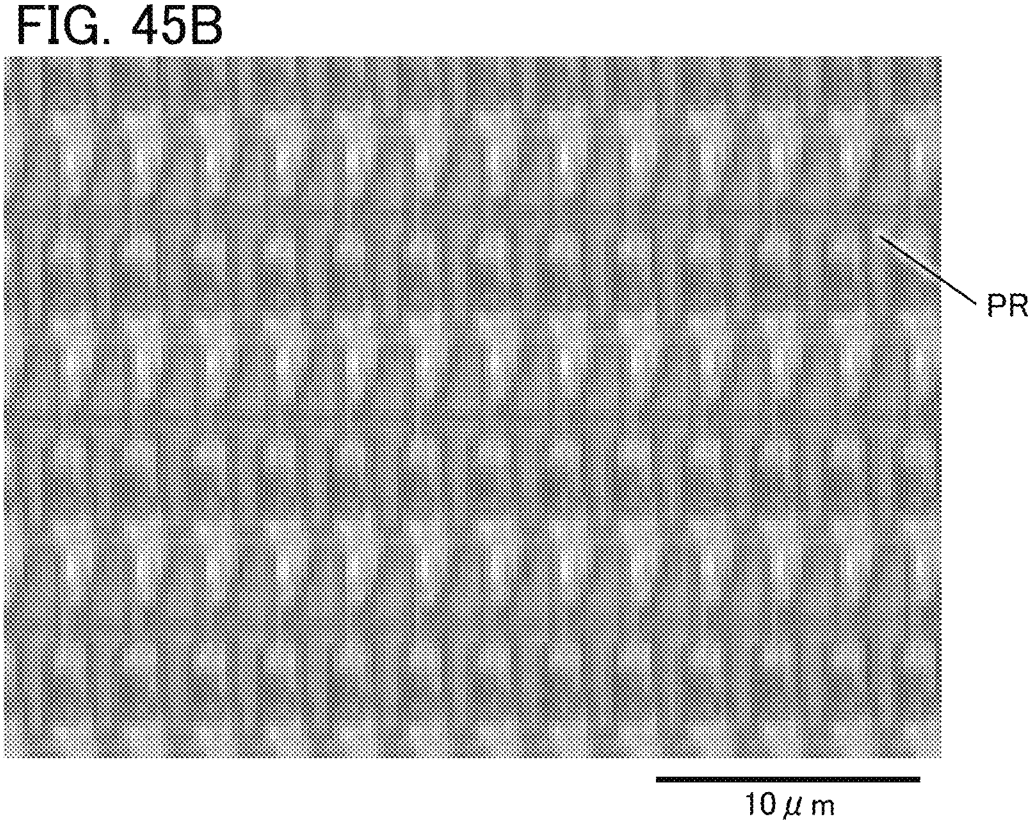

Next, each sample was observed with an optical microscope. FIG. 45A shows an optical micrograph of Sample 1. FIG. 45B shows an optical micrograph of Sample 2. FIG. 45A and FIG. 45B are each a reflected bright-field image. As shown in FIG. 45A, Sample 1 was found to generate a defective pattern of a resist mask (PR) (a region indicated by a dashed line in FIG. 45A). Meanwhile, in Sample 2, a defective pattern of the resist mask (PR) was not observed.

It was confirmed that defective patterns of the resist masks are reduced by increasing the proportion of the area of the resist masks.

REFERENCE NUMERALS

C11: capacitor, C12: capacitor, C13: capacitor, DL: wiring, GLa: wiring, GLb: wiring, GLc: wiring, M11: transistor, M12: transistor, M13: transistor, M14: transistor, M15: transistor, M16: transistor, M17: transistor, ND11: node, ND12: node, ND13: node, ND14: node, 10: display apparatus, 23: CPU, 24: GPU, 25: memory circuit portion, 29: input/output terminal portion, 40: layer, 50: layer, 51A: pixel circuit, 51B: pixel circuit, 51: pixel circuit, 60: layer, 61*a*: light-emitting device, 61B: light-emitting device, 61*b*: light-emitting device, 61*c*: light-emitting device, 61G: light-emitting device, 61R: light-emitting device, 61W: light-emitting device, 61: light-emitting device, 63A: conductive layer, 63B: conductive layer, 63C: conductive layer, 63: conductive layer, 65: EL layer, 67: conductive layer, 69: substrate, 71DM: dummy transistor, 71: transistor, 73: capacitor, 75A: wiring, 75DMa: conductive layer, 75DMb: dummy layer, 75: conductive layer, 77*a*: insulating layer, 77*b*: insulating layer, 79DM: semiconductor layer, 79: semiconductor layer, 81DM: insulating layer, 81: insulating layer, 83DM: conductive layer, 83: conductive layer, 85DM: conductive layer, 85: conductive layer, 87A: conductive layer, 87B: conductive layer, 87DM: dummy layer, 87: conductive layer, 89DM: dummy layer, 89: conductive layer, 91: insulating layer, 97A: resist mask, 97B: resist mask, 97DM: resist mask, 97: resist mask, 100A: semiconductor device, 100B: semiconductor device, 101: wiring, 102: wiring, 103A: conductive layer, 103B: conductive layer, 103C: conductive layer, 103D: conductive layer, 103: wiring, 104: wiring, 105A: conductive layer, 105B: conductive layer, 105C: conductive layer, 105D: conductive layer, 105E: conductive layer, 105F: conductive layer, 105G: conductive layer, 105H: conductive layer, 105I: conductive layer, 105J: conductive layer, 105K: conductive layer, 105L: conductive layer, 106A: conductive layer, 106B: conductive layer, 107A: conductive layer, 107B: conductive layer, 107C: conductive layer, 107D: conductive layer, 107DMa: conductive layer, 107DMb: conductive layer, 109DMa: dummy transistor, 109DMb: dummy transistor, 110A: contact hole, 110B: contact hole, 110C: contact hole, 110D: contact hole, 110E: contact hole, 110F: contact hole, 110G: contact hole, 110H: contact hole, 110I: contact hole, 110J: contact hole, 110K: contact hole, 110L: contact hole, 110M: contact hole, 110N: contact hole, 110P: contact hole, 110Q: contact hole, 110R: contact hole, 110S: contact hole, 110T: contact hole, 110V: contact hole, 110W: contact hole, 110X: contact hole, 111A: semiconductor layer, 1111B: semiconductor layer, 111C: semiconductor layer, 111D: semiconductor layer, 111DMa: semiconductor layer, 111E: semiconductor layer, 111F: semiconductor layer, 113A: conductive layer, 113B: conductive layer, 113C: conductive layer, 113D: conductive layer, 115A: contact hole, 115B: contact hole, 115C: contact hole, 115D: contact hole, 115E: contact hole, 115F: contact hole, 115G: contact hole, 115H: contact hole, 115I: contact hole, 115J: contact hole, 117A: contact hole, 117B: contact hole, 117C: contact hole, 119: wiring, 121A: contact hole, 121B: contact hole, 121C: contact hole, 171: conductive layer, 172*a*: EL layer, 172B: EL layer, 172*b*: EL layer, 172G: EL layer, 172R: EL layer, 172W: EL layer, 172: EL layer, 173: conductive layer, 174: common layer, 175B: light, 175G: light, 175R: light, 180A: transistor, 180B: transistor, 180C: transistor, 230B: subpixel, 230C: subpixel, 230G: subpixel, 230M: subpixel, 230R: subpixel, 230W: subpixel, 230Y: subpixel, 230: pixel, 231: first driver circuit portion, 232: second driver circuit portion, 235: display region, 241: conductive layer, 243: insulating layer, 245: conductive layer, 246: capacitor, 251: conductive layer, 252: conductive layer, 254: insulating layer, 255: insulating layer, 256: plug, 261: insulating layer, 262: insulating layer, 263: insulating layer, 264B: coloring layer, 264G: coloring layer, 264R: coloring layer, 264: insulating layer, 265: insulating layer, 266: plug, 270: insulating layer, 271: protective layer, 272: insulating layer, 273: protective layer, 274A: plug, 274*a*: conductive layer, 274B: plug, 274*b*: conductive layer, 274C: plug, 274D: plug, 274: plug, 275: region, 276: insulating layer, 277: microlens array, 278: insulating layer, 279DM: dummy layer, 279: wiring, 281DM: dummy layer, 281: wiring, 283: insulating layer, 284: insulating layer, 285: insulating layer, 286: insulating layer, 287: insulating layer, 288: insulating layer, 289: insulating layer, 290: insulating layer, 291: insulating layer, 293: insulating layer, 301A: substrate, 301B: substrate, 301: substrate, 310A: transistor, 310B: transistor, 310: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 341: conductive layer, 342: conductive layer, 343: plug, 363: insulating layer, 415: protective layer, 419: resin layer, 420: substrate, 500: transistor, 505*a*: conductor, 505*b*: conductor, 505*c*: conductor, 505: conductor, 514: insulator, 516: insulator, 522: insulator, 524: insulator, 531*a*: metal oxide, 531*b*: metal oxide, 531*c*: metal oxide, 531: metal oxide, 541*a*: insulator, 541*b*: insulator, 541: insulator, 542*a*: conductor, 542*b*: conductor, 542: conductor, 545*a*: conductor, 545*b*: conductor, 545: conductor, 550: insulator, 554: insulator, 560*a*: conductor, 560*b*: conductor, 560: conductor, 574: insulator, 580: insulator, 581: insulator, 4411: light-emitting layer, 4412: light-emitting layer, 4413: light-emitting layer, 4420: layer, 4430: layer, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 7550: information terminal, 7551: housing, 7552: display portion, 7553: camera, 7554: speaker portion, 7555: operation switch, 7557: microphone, 7660: information terminal, 7661: housing, 7662: display portion, 7663: band, 7664: buckle, 7665: operation switch, 7666: input/output terminal, 7667: icon, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing member, 8305: lens, 8400: head-mounted display, 8401: housing, 8402: wearing portion, 8403: cushion, 8404: display portion, 8405: lens, 9700: automobile, 9701: automobile body, 9702: wheel, 9703: dashboard, 9704: light, 9710: display portion, 9711: display portion, 9712: display portion, 9713: display portion, 9714: display portion, 9715: display portion, 9721: display portion, 9722: display portion, 9723: display portion

The invention claimed is:

1. A semiconductor device comprising:

a display portion, wherein the display portion comprises a subpixel, wherein the subpixel comprises a first transistor, a second transistor, a first capacitor, a second capacitor, a third capacitor, a first insulating layer, and wirings, wherein the first transistor is electrically connected to the second transistor, the first capacitor, the second capacitor, and the third capacitor, wherein each of the first capacitor, the second capacitor, and the third capacitor comprises a first conductive layer, a second conductive layer, and a second insulating layer sandwiched between the first conductive layer and the second conductive layer, wherein the first insulating layer is provided over the first transistor and the second transistor, wherein the first conductive layers of the first capacitor, the second capacitor, and the third capacitor and the wirings are each provided over and in contact with the first insulating layer, wherein in a top view, a proportion of a total area of the first conductive layers of the first capacitor, the second capacitor, and the third capacitor and the wirings to an area of the subpixel is greater than or equal to 15%, wherein an area of the first conductive layer of the second capacitor is greater than or equal to twice an area of the first conductive layer of the first capacitor, and wherein an area of the first conductive layer of the third capacitor is greater than or equal to twice the area of the first conductive layer of the first capacitor.

2. A semiconductor device comprising:

a display portion, wherein the display portion comprises a subpixel and a substrate, wherein the subpixel comprises a first transistor, a second transistor, a third transistor, a first capacitor, a second capacitor, a third capacitor, a first insulating layer, and wirings, wherein each of the first transistor, the second transistor, and the third transistor is provided over the substrate, wherein the first transistor is electrically connected to the second transistor, the first capacitor, the second capacitor, and the third capacitor, wherein the third transistor is electrically floating, wherein each of the first capacitor, the second capacitor, and the third capacitor comprises a first conductive layer, a second conductive layer, and a second insulating layer sandwiched between the first conductive layer and the second conductive layer, wherein the first insulating layer is provided over the first transistor and the second transistor, wherein the first conductive layers of the first capacitor, the second capacitor, and the third capacitor and the wirings are each provided over and in contact with the first insulating layer, wherein in a top view, a proportion of a total area of the first conductive layers of the first capacitor, the second capacitor, and the third capacitor and the wirings to an area of the subpixel is greater than or equal to 15%, wherein an area of the first conductive layer of the second capacitor is greater than or equal to twice an area of the first conductive layer of the first capacitor, wherein an area of the first conductive layer of the third capacitor is greater than or equal to twice the area of the first conductive layer of the first capacitor, wherein each of the first transistor, the second transistor, and the third transistor comprises a semiconductor layer, and wherein in the top view, a proportion of a total area of the semiconductor layers of the first transistor, the second transistor, and the third transistor to the area of the subpixel is greater than or equal to 15%.

3. A semiconductor device comprising:

a display portion, wherein the display portion comprises a subpixel and a substrate, wherein the subpixel comprises a first transistor, a second transistor, a third transistor, a first capacitor, a second capacitor, a third capacitor, a first insulating layer, and wirings, wherein each of the first transistor, the second transistor, and the third transistor is provided over the substrate, wherein the first transistor is electrically connected to the second transistor, the first capacitor, the second capacitor, and the third capacitor, wherein the third transistor is electrically floating, wherein each of the first capacitor, the second capacitor, and the third capacitor comprises a first conductive layer, a second conductive layer, and a second insulating layer sandwiched between the first conductive layer and the second conductive layer, wherein the first insulating layer is provided over the first transistor and the second transistor, wherein the first conductive layers of the first capacitor, the second capacitor, and the third capacitor and the wirings are each provided over and in contact with the first insulating layer, wherein in a top view, a proportion of a total area of the first conductive layers of the first capacitor, the second capacitor, and the third capacitor and the wirings to an area of the subpixel is greater than or equal to 15%, wherein an area of the first conductive layer of the second capacitor is greater than or equal to twice an area of the first conductive layer of the first capacitor, wherein an area of the first conductive layer of the third capacitor is greater than or equal to twice the area of the first conductive layer of the first capacitor, wherein each of the first transistor, the second transistor, and the third transistor comprises a semiconductor layer, wherein the semiconductor layer of the third transistor comprises a region shared with the semiconductor layer of the first transistor, and wherein in the top view, a proportion of a total area of the semiconductor layers of the first transistor, the second transistor, and the third transistor to the area of the subpixel is greater than or equal to 15%.

4. The semiconductor device according to claim 3, wherein one of a source and a drain of the first transistor is electrically connected to one terminal of the first capacitor, wherein a gate of the first transistor is electrically connected to the other terminal of the first capacitor, wherein the other of the source and the drain of the first transistor is electrically connected to one of a source and a drain of the second transistor, one terminal of the second capacitor, and one terminal of the third capacitor, wherein a gate of the second transistor is electrically connected to the other terminal of the second capacitor, and wherein a back gate of the second transistor is electrically connected to the other terminal of the third capacitor.

5. The semiconductor device according to claim 3, wherein the second transistor is a multi-channel transistor.

6. The semiconductor device according to claim 3, further comprising a light-emitting device, wherein one terminal of the light-emitting device is electrically connected to one of a source and a drain of the first transistor.

7. The semiconductor device according to claim 3, wherein one or more of the semiconductor layer of the first transistor and the semiconductor layer of the second transistor comprise a metal oxide.

8. The semiconductor device according to claim 3, wherein one or more of the semiconductor layer of the first transistor and the semiconductor layer of the second transistor comprise a metal oxide, and wherein the metal oxide comprises one or more of indium and zinc.

9. The semiconductor device according to claim 3, wherein the second transistor comprises:

- a first conductor and a second conductor placed apart from each other over the semiconductor layer of the second transistor;
- a first insulator placed over the first conductor and the second conductor and having an opening formed between the first conductor and the second conductor;
- a third conductor placed in the opening of the first conductor; and
- a second insulator placed between the third conductor and the semiconductor layer, the first conductor, the second conductor, and the first insulator.

* * * * *